United States Patent
Nishihara

(10) Patent No.: US 6,956,759 B2
(45) Date of Patent: Oct. 18, 2005

(54) FERRODIELECTRIC NON-VOLATILE SEMICONDUCTOR MEMORY

(75) Inventor: Toshiyuki Nishihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 147 days.

(21) Appl. No.: 10/416,662

(22) PCT Filed: Sep. 24, 2002

(86) PCT No.: PCT/JP02/09747

§ 371 (c)(1),
(2), (4) Date: May 14, 2003

(87) PCT Pub. No.: WO03/032323

PCT Pub. Date: Apr. 17, 2003

(65) Prior Publication Data

US 2004/0027873 A1 Feb. 12, 2004

(30) Foreign Application Priority Data

Oct. 1, 2001 (JP) .......................................... 2001-305393
Sep. 13, 2002 (JP) .......................................... 2002-268035

(51) Int. Cl.$^7$ .............................................. G11C 11/22
(52) U.S. Cl. ........................................ 365/145; 365/149
(58) Field of Search ................................. 365/145, 149; 257/295, 296

(56) References Cited

U.S. PATENT DOCUMENTS 5,487,029 A * 1/1996 Kuroda ........................ 365/145
5,550,770 A * 8/1996 Kuroda ........................ 365/145
6,097,624 A * 8/2000 Chung et al. ............... 365/145
6,301,145 B1 * 10/2001 Nishihara .................... 365/145
6,459,110 B1 * 10/2002 Tani ............................. 257/295

FOREIGN PATENT DOCUMENTS

| JP | 03-016097 | 1/1991 |
|---|---|---|
| JP | 04-090189 | 3/1992 |
| JP | 07-235648 | 9/1995 |
| JP | 09-121032 | 5/1997 |
| JP | 11-167795 | 6/1999 |
| JP | 2000-031405 | 1/2000 |
| JP | 2000-215677 | 8/2000 |
| JP | 2000-349248 | 12/2000 |

* cited by examiner

*Primary Examiner*—Gene N. Auduong
(74) *Attorney, Agent, or Firm*—Robert J. Depke; Trexler, Bushnell, Giangiorgi, Blackstone & Marr

(57) ABSTRACT

A ferroelectric-type nonvolatile semiconductor memory comprising a bit line BL, a transistor for selection TR, a memory unit MU composed of memory cells $MC_M$ that are M in number (M≧2), and plate lines $PL_M$ that are M in number, in which each memory cell comprises a first electrode 21, a ferroelectric layer 22 and a second electrode 23; in the memory unit MU, the first electrodes 21 of the memory cells $MC_M$ are in common, and said common first electrode 21 is connected to the bit line BL through the transistor for selection TR; in the memory unit MU, the second electrode 23 of the m-th-place memory cell is connected to the m-th-place plate line $PL_m$; and said ferroelectric-type nonvolatile semiconductor memory further comprises a circuit $TR_S$ for short-circuiting the plate lines $PL_M$ that are M in number and the common first electrode 21.

32 Claims, 63 Drawing Sheets

FERRODIELECTRIC NON-VOLATILE SEMICONDUCTOR MEMORY

This application claims priority to International Application No. PCT/JP02/09747, filed Sep. 24, 2002, Japanese Patent Application Number JP2001-305393, filed Oct. 1, 2001, and Japanese Patent Application Number JP2002-268035, filed Sep. 13, 2002, each of which are incorporated herein by reference.

TECHNICAL FIELD

The present invention relates to a ferroelectric-type nonvolatile semiconductor memory (so-called FERAM).

BACKGROUND ART

In recent years, studies are actively made with regard to a ferroelectric-type nonvolatile semiconductor memory having a large capacity. A ferroelectric-type nonvolatile semiconductor memory (to be sometimes abbreviated as "nonvolatile memory" hereinafter) permits rapid access and is nonvolatile, and it consumes less electric power and has strength against an impact, so that it is expected to be used as a main storage device in various electronic machines and equipment having functions of file storage and resume, such as a portable computer, a cellular phone and a game machine, or as a recording medium for recording voices or images.

The above nonvolatile memory is a fast rewritable nonvolatile memory according to a method in which a change in an accumulated charge amount in a capacitor member having a ferroelectric layer is detected by utilizing fast polarization inversion and residual polarization of the ferroelectric layer, and the nonvolatile memory basically comprises the memory cell (capacitor member) and a transistor for selection. The memory cell (capacitor member) comprises, for example, a lower electrode, an upper electrode and the ferroelectric layer interposed between these electrodes. Data is written into and read out from the above nonvolatile memory by using the P-E (V) hysteresis loop of the ferroelectric layer shown in FIG. 60. That is, when an external electric field is applied to the ferroelectric layer and then removed, the ferroelectric layer exhibits residual polarization. When an external electric field in the plus direction is applied, the residual polarization of the ferroelectric layer comes to be $+P_r$, and when an external electric field in the minus direction is applied, it comes to be $-P_r$. When the residual polarization is in the state of $+P_r$ (see "D" in FIG. 60), such a state represents "0", and when the residual polarization is in the state of $-P_r$ (see "A" in FIG. 60), such a state represents "1".

For discriminating the state of "1" or "0", an external electric field, for example, in the plus direction is applied to the ferroelectric layer, whereby the polarization of the ferroelectric layer comes into the state of "C" in FIG. 60. In this case, when the data is "0", the polarization state of the ferroelectric layer changes from the state of "D" to the state of "C". When the data is "1", the polarization state of the ferroelectric layer changes from the state of "A" to the state of "C" through the state of "B". When the data is "0", the polarization inversion does not take place in the ferroelectric layer. When the date is "1", the polarization inversion takes place in the ferroelectric layer. As a result, there is caused a difference in the accumulated charge amount in the memory cell (capacitor member). The above accumulated charge is detected as a signal current by bringing, into an ON-state, the transistor for selection in a selected nonvolatile memory.

When the external electric field is brought into 0 after data is read out, the polarization state of the ferroelectric layer comes into the state of "D" in FIG. 60 both when the data is "0" and when it is "1". That is, when the data is read out, the data "1" is once destroyed. When the data is "1", therefore, the polarization is brought into the state of "A" through "D" and "E" by applying the external electric field in the minus direction, to re-write data "1".

The structure and the operation of a currently mainstream nonvolatile memory are proposed by S. Sheffiled et al. in U.S. Pat. No. 4,873,664. The above nonvolatile memory comprises two nonvolatile memory cells as shown in a circuit diagram of FIG. 61. In FIG. 61, each nonvolatile memory is surrounded by a dotted line. Each nonvolatile memory comprises, for example, transistors for selection $TR_{11}$ and $TR_{12}$ and memory cells (capacitor members) $FC_{11}$ and $FC_{12}$.

Concerning two-digit or three-digit subscripts, for example, a subscript "11" is a subscript that should be shown as "1,1", and for example, a subscript "111" is a subscript that should be shown as "1,1,1". For simplified showing, the subscripts are shown as two-digit or three-digit subscripts. Further, a subscript "M" is used to show, for example, a plurality of memory cells or plate lines in the block, and a subscript "m" is used to show an individual, for example, of a plurality of the memory cells or the plate lines. A subscript "N" is used to show, for example, transistors for selection or memory units in the block, and a subscript "n" is used to show, for example, an individual of the transistors for selection or the memory units.

Complementary data is written into a pair of the memory cells, and the nonvolatile memory stores 1 bit. In FIG. 61, symbol "WL" stands for a word line, symbol "BL" stands for a bit line, and symbol "PL" stands for a plate line. When one nonvolatile memory is taken, the word line $WL_1$ is connected to a word line decoder/driver WD. The bit lines $BL_1$ and $BL_2$ are connected to a sense amplifier SA. Further, the plate line $PL_1$ is connected to a plate line decoder/driver PD.

When the stored data is read out from the thus-structured nonvolatile memory, the word line $WL_1$ is selected, and further, the plate line $PL_1$ is driven. In this case, the complementary data appears on a pair of the bit lines $BL_1$ and $BL_2$ as voltages (bit line potentials) from a pair of the capacitor members $FC_{11}$ and $FC_{12}$ through the transistors for selection $TR_{11}$ and $TR_{12}$. The voltages (bit line potentials) on the pair of the bit lines $BL_1$ and $BL_2$ are detected with the sense amplifier SA.

One nonvolatile memory occupies a region surrounded by the word line $WL_1$ and a pair of the bit lines $BL_1$ and $BL_2$. If the word lines and the bit lines are arranged at a smallest pitch, therefore, the smallest area of one nonvolatile memory is $8F^2$ when the minimum fabrication dimension is "F". Therefore, the thus-structured nonvolatile memory has a smallest area of $8F^2$.

When it is attempted to increase the capacity of the above-structured nonvolatile memories, its realization can only rely on minuteness of fabrication dimension. Constitution of one nonvolatile memory requires two transistors for selection and two memory cells (capacitor members). Further, it is required to arrange the plate lines at the same pitch as that at which the word lines are arranged. It is therefore almost impossible to arrange the nonvolatile memories at the minimum pitch, and in reality, the area that one nonvolatile memory occupies comes to be much greater than $8F^2$.

Moreover, it is also required to arrange the word line decoders/drivers WD and the plate line decoders/drivers PD at a pitch equal to a pitch at which the nonvolatile memories are arranged. In other words, two decoders/drivers are required for selecting one low-address. It is therefore difficult to layout peripheral circuits, and the area that the peripheral circuits occupy comes to be large.

One means for decreasing an area of a nonvolatile memory is disclosed in JP-A-121032/1997. As FIG. 62 shows a circuit diagram, the nonvolatile memory disclosed in the above Laid-open comprises two nonvolatile memory cells. One nonvolatile memory cell comprises a plurality of memory cells $MC_{1M}$ (for example, M=4) one end of each of which is connected to one end of one transistor for selection $TR_1$ in parallel, and the other nonvolatile memory cell comprises a plurality of memory cells $MC_{2M}$ one end of each of which is connected to one end of one transistor for selection $TR_2$ in parallel. Lower electrodes of a plurality of the memory cells $MC_{1M}$, $MC_{2M}$ are in common. The common lower electrode will be referred to as "common node $CN_1$, $CN_2$". The other ends of the transistors for selection $TR_1$ and $TR_2$ are connected to bit lines $BL_1$ and $BL_2$, respectively. The paired bit lines $BL_1$ and $BL_2$ are connected to a sense amplifier SA. Further, an upper electrode of each of the memory cells $MC_{1m}$, $MC_{2m}$ (m=1, 2 . . . M) is connected to a common plate line $PL_m$, and the plate line $PL_m$ is connected to a plate line decoder/driver PD. Further, the word line WL is connected to a word line decoder/driver WD.

Complementary data is stored in a pair of the memory cells $MC_{1m}$ and $MC_{2m}$ (m=1, 2 . . . M). For reading out the data stored, for example, in the memory cells $MC_{1m}$ and $MC_{2m}$, (wherein m is one of 1, 2, 3 and 4), the word line WL is selected, and the plate line $PL_m$ is driven in a state where a voltage of $(½)V_{cc}$ is applied to the plate lines $PL_j$ (m≠j). The above $V_{cc}$ is, for example, a power source voltage. By the above procedure, the complementary data appears on a pair of the bit lines $BL_1$ and $BL_2$ as voltages (bit line potentials) from a pair of the memory cells $MC_{1m}$ and $MC_{2m}$ through the transistors for selection $TR_1$ and $TR_2$. And, the sense amplifier SA detects the voltages (bit line potentials) on the pair of the bit lines $BL_1$ and $BL_2$.

A pair of the transistors for selection $TR_1$ and $TR_2$ in the paired nonvolatile memory cells occupy a region surrounded by the word lines WL and a pair of the bit lines $BL_1$ and $BL_2$. If the word lines and the bit lines are arranged at a smallest pitch, therefore, a pair of the transistors for selection $TR_1$ and $TR_2$ in the paired nonvolatile memory cells have a minimum area of $8F^2$. Since, however, a pair of the transistors for selection $TR_1$ and $TR_2$ are shared by M sets of pairs of the memory cells $MC_{1m}$ and $MC_{2m}$ (m=1, 2 . . . M), the number of the transistors for selection $TR_1$ and $TR_2$ per bit can be decreased, and the layout of the word lines WL is moderate, so that the nonvolatile memory can be easily decreased in size. Further, with regard to the peripheral circuits, M bits can be selected with one word line decoder/driver WD and the plate line decoders/drivers PD that are M in number. When the above constitution is employed, therefore, the layout in which the cell area is close to $8F^2$ can be attained, and a chip size almost equal to a DRAM can be attained.

Meanwhile, it is known that a polarization attenuation phenomenon called relaxation takes place in a ferroelectric thin film. This phenomenon is a phenomenon in which the ferroelectric thin film is caused to have a constant attenuation in the polarization amount for about 1 second after polarization inversion, and then the polarization is stabilized. It is said that the above polarization attenuation phenomenon is caused because charges trapped inside the ferroelectric thin film are re-distributed depending upon a polarization state. A nonvolatile memory is accessed generally with tens nanoseconds as a unit. After data is written into a memory cell and a transistor for selection is brought into an OFF-state, therefore, the polarization attenuation phenomenon proceeds.

FIGS. 63A and 63B schematically show charge distributions caused by the polarization attenuation phenomenon, in which one memory cell and one transistor for selection are shown for the sake of simplification. FIG. 63A shows a charge distribution when, after a positive-potential pulse is applied to a lower electrode through the transistor for selection in a state where a plate line is grounded, to write data "1", the lower electrode is again grounded. At a time after completion of data writing, both the lower electrode and the upper electrode are grounded, so that they have the same potentials and charges equivalent to a polarization amount are distributed on each electrode surface, so that an electric field caused by the polarization is cancelled out or offset.

In this case, when the transistor for selection TR is brought to an OFF-state, the lower electrode comes into a floating state. At this time, the polarization of the ferroelectric layer is attenuated as shown in FIG. 63B, but the total charge amount of the lower electrode in a floating state is maintained, so that the potential thereof changes.

A potential change $\Delta V$ in the lower electrode after the polarization attenuation phenomenon takes place is as shown by the following expression (1), in which $P_0$ is an initial polarization amount, $P_1$ is a polarization amount after the attenuation, Q is a total charge amount of the lower electrode and $C_S$ is a capacity of the memory cell. When the expression (1) is modified, $\Delta V$ shown by the expression (2) can be obtained.

$$Q=P_0=P_1+\Delta V \cdot C_S \quad (1)$$

$$\Delta V=(P_0-P_1)/C_S \quad (2)$$

When data "1" has been written, $\Delta V$ comes to have a positive value, and the potential of the lower electrode increases during storing of the data. When data "0" has been written, $\Delta V$ comes to have a negative value, and the potential of the lower electrode decreases during storing of the data. FIG. 63C schematically shows a change in the lower electrode when data "1" is written. First, the potential of the lower electrode increases due to the polarization attenuation phenomenon. After the passage of about 1 second, attenuation of the polarization due to relaxation is saturated, and then, the potential of the lower electrode starts to gradually decrease due to a leak of the ferroelectric layer or a junction. Upon reaching the ground level, the potential of the lower electrode is stabilized.

The above change in the potential of the lower electrode does not cause any problem as far as a nonvolatile memory composed of one memory cell (capacitor member) and one transistor for selection is concerned, since the change does not tend to deteriorate the written data. In a nonvolatile memory disclosed in JP-A-121032/1997, however, the above change poses a big problem.

That is, when it is assumed, for example, that one common node is shared by 16 memory cells, that 15 memory cells among them have data "1" written therein and the remaining one memory cell has data "0" written therein, the common node is greatly affected by the 15 memory cells having data "1" written therein, and as a result, the potential of the common node increases. As a result, an electric field is exerted on the memory cell having data "0" written therein so as to deteriorate the data keeping. Further, the above electric field is maintained until it is attenuated by the leak of the ferroelectric layer or the junction. Therefore, the electric field that tends to deteriorate the data keeping is exerted on the memory cell having data "0" written therein over a long period of time, a length of several seconds, and in a worst case, data destruction occurs in the memory cell having data "0" written therein.

It is therefore an object of the present invention to provide a ferroelectric-type nonvolatile semiconductor memory which is free from destruction of data stored in a memory cell even when a polarization attenuation phenomenon called relaxation takes place in a ferroelectric layer.

DISCLOSURE OF THE INVENTION

The ferroelectric-type nonvolatile semiconductor memory according to a first aspect of the present invention for achieving the above object comprises;

(A) a bit line, (B) a transistor for selection, (C) a memory unit composed of memory cells that are M in number ($M \geq 2$), and (D) plate lines that are M in number, in which each memory cell comprises a first electrode, a ferroelectric layer and a second electrode, in the memory unit, the first electrodes of the memory cells are in common, and said common first electrode is connected to the bit line through the transistor for selection, in the memory unit, the second electrode of the m-th-place (m=1, 2 . . ., M) memory cell is connected to the m-th-place plate line, and said ferroelectric-type nonvolatile semiconductor memory further comprises a circuit for grounding the common first electrode or for short-circuiting the plate lines that are M in number and the common first electrode.

The ferroelectric-type nonvolatile semiconductor memory according to a second aspect of the present invention for achieving the above object comprises;

(A) a bit line, (B) a transistor for selection, (C) memory units that are N in number ($N \geq 2$), each memory unit being composed of memory cells that are M in number ($M \geq 2$), and (D) plate lines that are M×N in number, in which the memory units that are N in number are stacked one on other or another through an insulating layer, each memory cell comprises a first electrode, a ferroelectric layer and a second electrode, in each memory unit, the first electrodes of the memory cells are in common, and said common first electrode is connected to the transistor for selection through the bit line, in the memory unit positioned as an n-th (n=1, 2 . . ., N) layer, the second electrode of the m-th-place (m=1, 2 . . ., M) memory cell is connected to the [(n−1)M+m]-th-place plate line, and said ferroelectric-type nonvolatile semiconductor memory further comprises a circuit for grounding the common first electrode or for short-circuiting the plate lines that are M×N in number and the common first electrode.

The ferroelectric-type nonvolatile semiconductor memory according to a third aspect of the present invention for achieving the above object comprises;

(A) a bit line, (B) transistors for selection that are N in number ($N \geq 2$), (C) memory units that are N in number, each memory unit being composed of memory cells that are M in number ($M \geq 2$), and (D) plate lines that are M in number, in which each memory cell comprises a first electrode, a ferroelectric layer and a second electrode, in each memory unit, the first electrodes of the memory cells are in common, in the n-th-place (n=1, 2 . . . , N) memory unit, said common first electrode is connected to the bit line through the n-th-place transistor for selection, in the n-th-place memory unit, the second electrode of the m-th-place (m=1, 2 . . . , M) memory cell is connected to the m-th-place plate line common to the memory units, and said ferroelectric-type nonvolatile semiconductor memory further comprises a circuit for grounding the common first electrode or for short-circuiting the plate lines that are M in number and the common first electrode.

The ferroelectric-type nonvolatile semiconductor memory according to a fourth aspect of the present invention for achieving the above object comprises;

(A) bit lines that are N in number ($N \geq 2$), (B) transistors for selection that are N in number, (C) memory units that are N in number, each memory unit being composed of memory cells that are M in number ($M \geq 2$), and (D) plate lines that are M in number, in which each memory cell comprises a first electrode, a ferroelectric layer and a second electrode, in each memory unit, the first electrodes of the memory cells are in common, said common first electrode in the n-th-place (n=1, 2 . . . , N) memory unit is connected to the n-th-place bit line through the n-th-place transistor for selection, in the n-th-place memory unit, the second electrode of the m-th-place (m=1, 2 . . . , M) memory cell is connected to the m-th-place plate line common to the memory units, and said ferroelectric-type nonvolatile semiconductor memory further comprises a circuit for grounding the common first electrode or for short-circuiting the plate lines that are M in number and the common first electrode.

In the ferroelectric-type nonvolatile semiconductor memories according to the first to fourth aspects of the present invention (to be sometimes generally referred to "ferroelectric-type nonvolatile semiconductor memory of the present invention" hereinafter), the above circuit can be constituted of a transistor for switching. For convenience, the above constitutions will be referred to as "ferroelectric-type nonvolatile semiconductor memory according to the first-A aspect of the present invention", "ferroelectric-type nonvolatile semiconductor memory according to the second-A aspect of the present invention", "ferroelectric-type nonvolatile semiconductor memory according to the third-A aspect of the present invention", and "ferroelectric-type nonvolatile semiconductor memory according to the fourth-A aspect of the present invention". When the above circuit is constituted of a transistor for switching, the common first electrode is grounded, or the plate lines and the common first electrode are short-circuited by the operation of the transistor for switching.

Alternatively, in the ferroelectric-type nonvolatile semiconductor memory of the present invention, the above circuit can be constituted of a high-resistance element. For convenience, the above constitutions will be referred to as "ferroelectric-type nonvolatile semiconductor memory according to the first-B aspect of the present invention", "ferroelectric-type nonvolatile semiconductor memory according to the second-B aspect of the present invention", "ferroelectric-type nonvolatile semiconductor memory according to the third-B aspect of the present invention", and "ferroelectric-type nonvolatile semiconductor memory according to the fourth-B aspect of the present invention". When the above circuit is constituted of a high-resistance element, the common first electrode is grounded, or the plate lines and the common first electrode are short-circuited through the high-resistance element.

Generally, the operation time period of the ferroelectric-type nonvolatile semiconductor memory is of the order of tens nanosecond. In the ferroelectric-type nonvolatile semiconductor memory according to any one of the first-B aspect, second-B aspect, third-B aspect and fourth-B aspect of the present invention, the time constant (to be called "first time constant") for extracting charges through the high-resistance element, in the operation of the ferroelectric-type nonvolatile semiconductor memory, is required to be sufficiently greater than the operation time period of the ferroelectric-type nonvolatile semiconductor memory in order to avoid deterioration of a signal that is transmitted through the common first electrode (to be sometimes called "common node"). On the other hand, the time constant (to be called "second time constant") for extracting charges, in the non-operation (on standby) of the ferroelectric-type nonvolatile semiconductor memory, is required to be small in order to readily stabilize the potential of the common node. When these requirements are taken into account, desirably, the first time constant is at least 100 nanoseconds, and the second time constant is 100 milliseconds or less. The parasitic capacity of the common node is of the order of tens fF to hundreds fF. Preferably, therefore, the high-resistance element has a resistance value of $1 \times 10^6 \Omega$ (1 MΩ) to $1 \times 10^{12} \Omega$ (1 TΩ). The high-resistance element can be constituted, for example, of non-doped polysilicon.

In the ferroelectric-type nonvolatile semiconductor memory according to the first aspect of the present invention, the memory units of a plurality of ferroelectric-type nonvolatile semiconductor memories may be stacked one on the other (another) through an insulating layer. In the ferroelectric-type nonvolatile semiconductor memory according to the third or fourth aspect of the present invention, the memory units that are N in number may be formed on the same insulating layer or may be stacked one on the other (another) through an insulating layer.

In the ferroelectric-type nonvolatile semiconductor memory of the present invention, it is sufficient to satisfy $M \geq 2$, and for example, the practical value of M includes exponents of 2 (2, 4, 8 . . . ). Further, in the ferroelectric-type nonvolatile semiconductor memory according to any one of the second to fourth aspects of the present invention, it is sufficient to satisfy $N \geq 2$, and for example, the practical value of N includes exponents of 2 (2, 4, 8 . . . ).

In the ferroelectric-type nonvolatile semiconductor memory according to the second aspect of the present invention, or in the ferroelectric-type nonvolatile semiconductor memory according to the third or fourth aspect of the present invention having a structure in which the memory units are stacked through an insulating layer, the three-dimensional stack structure of the memory units removes a limitation imposed by the number of transistors occupying the semiconductor substrate surface, the storage capacity can be remarkably enhanced as compared with any conventional ferroelectric-type nonvolatile semiconductor memory, and the effective occupation area of bit storage units can be greatly decreased.

In the ferroelectric-type nonvolatile semiconductor memory according to any one of the second to fourth aspects of the present invention, further, address selection in the row direction is performed by means of a two-dimensional matrix composed of the transistors for selection and the plate lines. For example, when a row address selection unit is composed of 8 transistors for selection and 8 plate lines, 64-bit or 32-bit memory cells can be selected with 16 decoder/driver circuits. Even when the integration degree of a ferroelectric-type nonvolatile semiconductor memory is equal to that of a conventional ferroelectric-type nonvolatile semiconductor memory, the storage capacity can be quadrupled or doubled. Further, the number of peripheral circuits and driving wirings for address selection can be reduced.

In the ferroelectric-type nonvolatile semiconductor memory of the present invention, practically, there can be employed a constitution in which such ferroelectric-type nonvolatile semiconductor memories are combined as a pair (to be called "nonvolatile memory-A" and "nonvolatile memory-B" for the sake of convenience), and the bit lines constituting the pair of the ferroelectric-type nonvolatile semiconductor memories are connected to one sense amplifier. In this case, the transistor for selection constituting the nonvolatile memory-A and the transistor for selection constituting the nonvolatile memory-B may be connected to one word line or different word lines. Depending upon the constitution and operation method of the nonvolatile memory-A and the nonvolatile memory-B, 1 bit can be stored in each of the memory cells constituting the nonvolatile memory-A or the nonvolatile memory-B, or one memory cell constituting the nonvolatile memory-A and one memory cell constituting the nonvolatile memory-B and being connected to the plate line to which the above memory cell constituting the nonvolatile memory-A is connected can be combined as a pair so that complementary data can be stored in the pair of such memory cells.

In the ferroelectric-type nonvolatile semiconductor memory of the present invention, data is written into or data is read out from and re-written into, in the block (or altogether), a plurality of the ferroelectric-type nonvolatile semiconductor memories (memory block) to which the word lines of the transistors for selection and the plate lines are in common. That is, all of the ferroelectric-type nonvolatile semiconductor memories in the memory block are brought into an operating state altogether and consecutively, or brought into a non-operating (standby) state altogether.

In the ferroelectric-type nonvolatile semiconductor memory according to the second aspect of the present invention, or in the ferroelectric-type nonvolatile semiconductor memory according to the third or fourth aspect of the present invention having a structure in which the memory units are stacked through an insulating layer, preferably, the ferroelectric layer constituting the memory cell of the memory unit positioned above has a lower crystallization temperature than the ferroelectric layer constituting the memory cell of the memory unit positioned below. The crystallization temperature of the ferroelectric layer constituting the memory cell can be determined, for example, by means of an X-ray diffraction analyzer or a surface scanning electron microscope. Specifically, for example, a ferroelectric material layer is formed and then heat-treated for crystallization promotion by changing heat-treatment temperatures for crystallization of the ferroelectric material layer, the heat-treated ferroelectric material layer is subjected to X-ray diffraction analysis, and a diffraction pattern intensity characteristic of the ferroelectric material (height of diffraction peak) is evaluated, whereby the crystallization temperature of the ferroelectric layer can be determined.

Meanwhile, for producing a ferroelectric-type nonvolatile semiconductor memory having a constitution in which the memory units are stacked, the heat treatment (that will be referred to as "crystallization heat treatment") is carried out for crystallization of the ferroelectric layer or a ferroelectric thin film constituting the ferroelectric layer, and it is required to carry out the above crystallization heat treatment as many times as the number of stacked stages of the memory units. The memory unit positioned on the lower stage is subjected to the crystallization heat treatment for a longer period of time, and the memory unit positioned on the upper stage is subjected to the crystallization heat treatment for a shorter period of time. When optimum crystallization heat treatment is carried out on the memory unit positioned on the upper stage, the memory unit positioned on the lower stage may suffer a heat load to excess, and the memory unit positioned on the lower stage may be deteriorated in properties. It is thinkable to employ a method in which the memory units are formed in a multi-stage and subjected to the crystallization heat treatment once. However, the above method is liable to involve problems that the ferroelectric layers cause a great change in volume during the crystallization and that each ferroelectric layer highly possibly causes degassing so that the ferroelectric layers undergo cracking or peeling. When the ferroelectric layer constituting the memory unit positioned above has a lower crystallization temperature than the ferroelectric layer constituting the memory unit positioned below, there is caused no problem that the memory cells for constituting the memory unit positioned below are deteriorated in properties, even if the above crystallization heat treatment is carried out as many times as the number of stacked stages of the memory units. Further, the memory cells for constituting the memory unit positioned in each stage can be heat-treated for crystallization under optimum conditions, so that a ferroelectric-type nonvolatile semiconductor memory excellent in properties can be obtained. The following Table 1 shows crystallization temperatures of typical materials for constituting the ferroelectric layers, while the materials for constituting the ferroelectric layers shall not be limited thereto.

TABLE 1

| Material | Crystallization temperature |
| --- | --- |
| $Bi_2SrTa_2O_9$ | 700–800° C. |
| $Bi_2Sr(Ta_{1.5}, Nb_{0.5})O_9$ | 650–750° C. |
| $Bi_4Ti_3O_{12}$ | 600–700° C. |
| $Pb(Zr_{0.48}, Ti_{0.52})O_3$ | 550–650° C. |
| $PbTiO_3$ | 500–600° C. |

The material for constituting the ferroelectric layer in the ferroelectric-type nonvolatile semiconductor memory of the present invention includes bismuth layer compounds, more specifically, a Bi-containing layer perovskite-type ferroelectric material. The Bi-containing layer perovskite-type ferroelectric material comes under so-called non-stoichiometric compounds, and shows tolerance of compositional deviations in both sites of a metal element and anions (O, etc.). Further, it is not a rare case that the above material having a composition deviated from its stoichiometric composition to some extent exhibits optimum electric characteristics. The Bi-containing layer perovskite-type ferroelectric material can be expressed, for example, by the general formula, $$(Bi_2O_2)^{2+}(A_{m-1}B_mO_{3m+1})^{2-}$$

wherein "A" is one metal selected from the group consisting of metals such as Bi, Pb, Ba, Sr, Ca, Na, K, Cd, etc., and "B" is one metal selected from the group consisting of Ti, Nb, Ta, W, Mo, Fe, Co and Cr or a combination of a plurality of these metals combined in any amount ratio, and "m" is an integer of 1 or more.

Alternatively, the material for constituting the ferroelectric layer preferably contains, as a main crystal phase, a crystal phase represented by the formula (1), $$(Bi_X, Sr_{1-X})_2(Sr_Y, Bi_{1-Y})(Ta_Z, Nb_{1-Z})_2O_d \quad (1)$$

wherein $0.9 \leq X \leq 1.0$, $0.7 \leq Y \leq 1.0$, $0 \leq Z \leq 1.0$, and $8.7 \leq d \leq 9.3$. Otherwise, the material for constituting the ferroelectric layer preferably contains, as a main crystal phase, a crystal phase represented by the formula (2), $$Bi_X Sr_Y Ta_2 O_d \quad (2)$$

wherein $X+Y=3$, $0.7 \leq Y \leq 1.3$ and $8.7 \leq d \leq 9.3$. In the above cases, more preferably, the material for constituting the ferroelectric layer preferably contains, as a main crystal phase, at least 85% of a crystal phase represented by the formula (1) or (2). In the above formula (1), $(Bi_X, Sr_{1-X})$ means that Sr occupies the site that Bi should have occupied in a crystal structure and that the Bi:Sr amount ratio is X:(1−X). Further, $(Sr_Y, Bi_{1-Y})$ means that Bi occupies the site that Sr should have occupied in a crystal structure and that the Sr:Bi amount ratio is Y:(1−Y). The material for constituting the ferroelectric layer and containing, as a main crystal phase, the crystal phase of the above formula (1) or (2), may contain an oxide of Bi, oxides of Ta and Nb and composite oxides of Bi, Ta and Nb to some extent.

Alternatively, the material for constituting the ferroelectric layer may contain a crystal phase represented by the formula (3), $$Bi_X(Sr, Ca, Ba)_Y(Ta_Z, Nb_{1-Z})_2O_d \quad (3)$$

wherein $1.7 \leq X \leq 2.5$, $0.6 \leq Y \leq 1.2$, $0 \leq Z \leq 1.0$ and $8.0 \leq d \leq 10.0$. (Sr, Ca, Ba) stands for one element selected from the group consisting of Sr, Ca and Ba. When the above material for the ferroelectric layer, having the above formulae, is expressed by a stoichiometric composition, the composition includes $Bi_2SrTa_2O_9$, $Bi_2SrNb_2O_9$, $Bi_2BaTa_2O_9$ and $Bi_2Sr(Ta, Nb)_2O_9$. Otherwise, the material for constituting the ferroelectric layer also includes $Bi_4SrTi_4O_{15}$, $Bi_3TiNbO_9$, $Bi_3TiTaO_9$, $Bi_4Ti_3O_{12}$ and $Bi_2PbTa_2O_9$. In these cases, the amount ratio of the metal elements may be varied to such an extent that the crystal structure does not change. That is, the above material may have a composition deviated from its stoichiometric composition in both sites of metal elements and oxygen element.

Further, the material for constituting the ferroelectric layer includes $PbTiO_3$, lead titanate zirconate [PZT, $Pb(Zr_{1-y}, Ti_y)O_3$ wherein $0<y<1$] which is a solid solution of $PbZrO_3$ and $PbTiO_3$ having a perovskite structure, and PZT-containing compounds such as PLZT which is a metal oxide prepared by adding La to PZT and PNZT which is a metal oxide prepared by adding Nb to PZT.

In the above materials for constituting the ferroelectric layer, the crystallization temperature can be changed by deviating their compositions from their stoichiometric compositions.

The ferroelectric layer can be obtained by patterning the ferroelectric thin film in a step following the formation of the ferroelectric thin film. In some cases, the patterning of the ferroelectric thin film is not required. The ferroelectric thin film can be formed by a method suitable for the material used for constituting the ferroelectric thin film, such as an MOCVD method, an MOD (Metal Organic Decomposition) method using, as a raw material, a bismuth-oxygen-bond-containing bismuth organometal compound (bismuth alkoxide compound), an LSMCD (Liquid Source Mist Chemical Deposition) method, a pulse laser abrasion method, a sputtering method or a sol-gel method. Further, the ferroelectric thin film can be patterned, for example, by an anisotropic ion etching (RIE) method.

In the ferroelectric-type nonvolatile semiconductor memory of the present invention, there may be employed a constitution in which the first electrode is formed below the ferroelectric layer and the second electrode is formed on the ferroelectric layer (that is, the first electrode corresponds to the lower electrode and the second electrode corresponds to the upper electrode), or there may be employed a constitution in which the first electrode is formed on the ferroelectric layer and the second electrode is formed below the ferroelectric layer (that is, the first electrode corresponds to the upper electrode and the second electrode corresponds to the lower electrode). There may be employed a constitution in which the plate line extends from the second electrode from the viewpoint of simplifying the wiring structure. The structure in which the first electrodes are in common specifically includes a structure in which the first electrode in the form of a stripe is formed and the ferroelectric layer is formed on the entire surface of the first electrode in the form of a stripe. In the above structure, an overlapping region of the first electrode, the ferroelectric layer and the second electrode corresponds to the memory cell. Alternatively, the structure in which the first electrodes are in common includes a structure in which ferroelectric layers are formed on predetermined regions of the first electrode and the second electrodes are formed on the ferroelectric layers, and a structure in which the first electrodes are formed in predetermined surface regions of a wiring layer, the ferroelectric layers are formed on the first electrodes and the second electrodes are formed on the ferroelectric layers, although the above structure shall not be limited thereto.

In the ferroelectric-type nonvolatile semiconductor memory of the present invention, further, when the first electrode is formed below the ferroelectric layer and when the second electrode is formed on the ferroelectric layer, the first electrode constituting the memory cell preferably has a so-called damascene structure. When the first electrode is formed on the ferroelectric layer and when the second electrode is formed below the ferroelectric layer, the second electrode constituting the memory cell preferably has a so-called damascene structure. That is because the ferroelectric layer can be formed on a flat substratum.

In the present invention, the material for constituting the first electrode and second electrode includes, for example, Ir, $IrO_{2-X}$, $Ir/IrO_{2-X}$, $SrIrO_3$, Ru, $RuO_{2-X}$, $SrRuO_3$, Pt, $Pt/IrO_{2-X}$, $Pt/RuO_{2-X}$, Pd, a Pt/Ti stacked structure, a Pt/Ta stacked structure, a Pt/Ti/Ta stacked structure, $La_{0.5}Sr_{0.5}CoO_3$(LSCO), a Pt/LSCO stacked structure and $YBa_2Cu_3O_7$. The value of the above X is in the range of $0 \leq X < 2$. In the above stacked structures, a material described after "/" contacts the ferroelectric layer. The first electrode and the second electrode may be constituted of one material, materials of the same kind or materials of different kinds. For forming the first electrode or the second electrode, an electrically conductive material layer constituting the first electrode or the second electrode is formed, and in a step to come thereafter, the electrically conductive material layer is patterned. The electrically conductive material layer can be formed by a method properly suitable for the materials for constituting the electrically conductive material layer, such as a sputtering method, a reactive sputtering method, an electron beam deposition method, an MOCVD method or a pulse laser abrasion method. The electrically conductive material layer can be patterned, for example, by an ion milling method or an RIE method.

The transistor for selection, the transistor for switching and various transistors can be constituted, for example, of known MIS type FETs or MOS type FETs. The material for constituting the bit line includes an impurity-doped polysilicon and a refractory metal material. The common first electrode and the transistor for selection can be electrically connected through a contact hole, and the bit line and the transistor for selection can be electrically connected through a contact hole. Such a contact hole can be formed by plugging a hole with a tungsten plug or impurity-doped polysilicon.

In the present invention, the material for constituting the insulating layer includes silicon oxide ($SiO_2$), silicon nitride (SiN), SiON, SOG, NSG, BPSG, PSG, BSG and LTO.

The present invention employs the circuit for grounding the common first electrode or short-circuiting the plate lines and the common first electrode, so that the common first electrode does not come into any floating state when the ferroelectric-type nonvolatile semiconductor memory is in non-operation (standby). As a result, the change in potential of the common first electrode can be prevented.

BEST MODE FOR CARRYING OUT THE INVENTION

The present invention will be explained on the basis of Examples with reference to drawings hereinafter.

EXAMPLE 1

Figure 1:
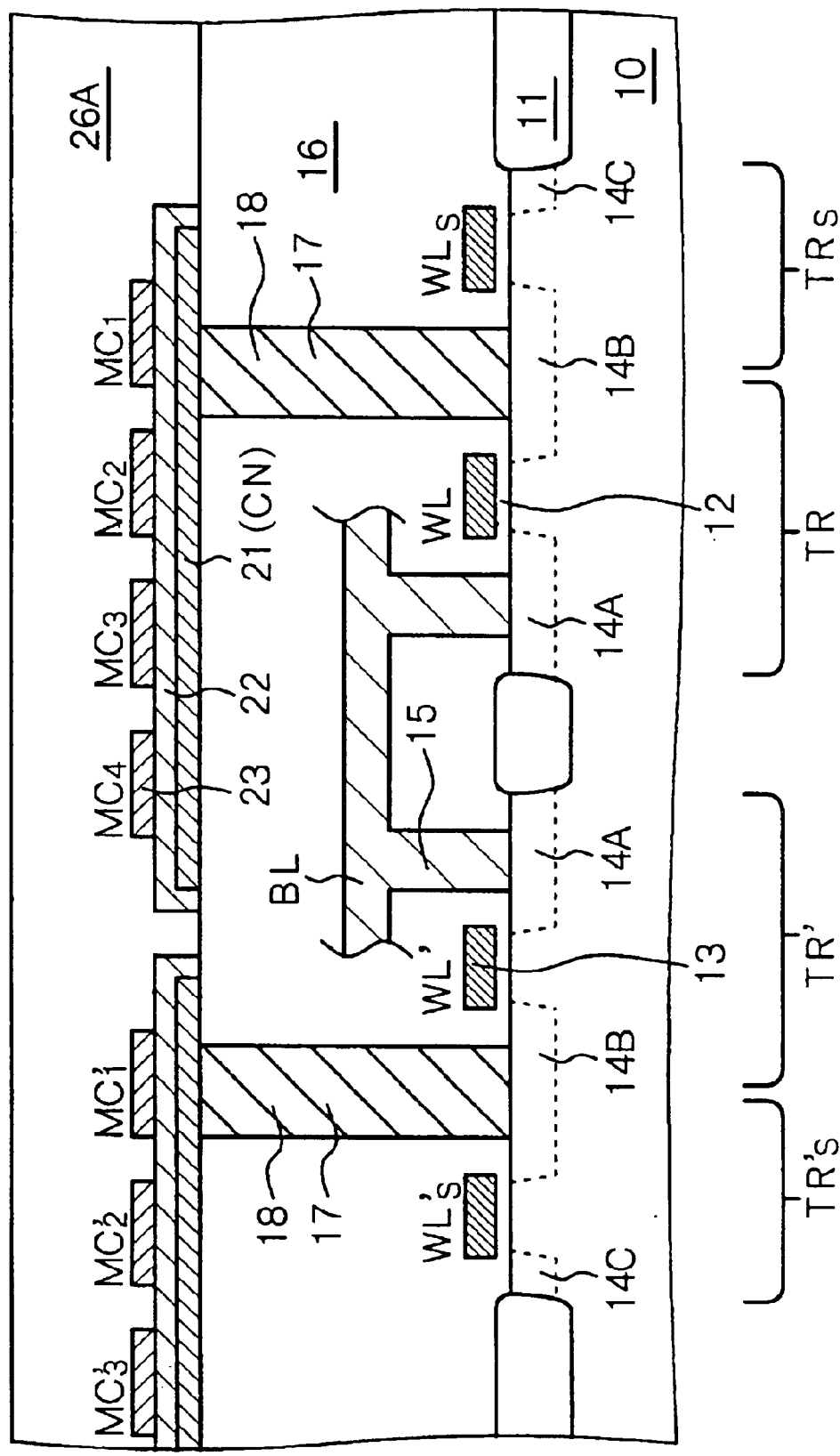
FIG. 1 is a schematic partial cross-sectional view of a ferroelectric-type nonvolatile semiconductor memory of Example 1, taken by cutting the ferroelectric-type nonvolatile semiconductor memory with an imaginary perpendicular plane in parallel with the extending direction of a bit line.
Figure 2:
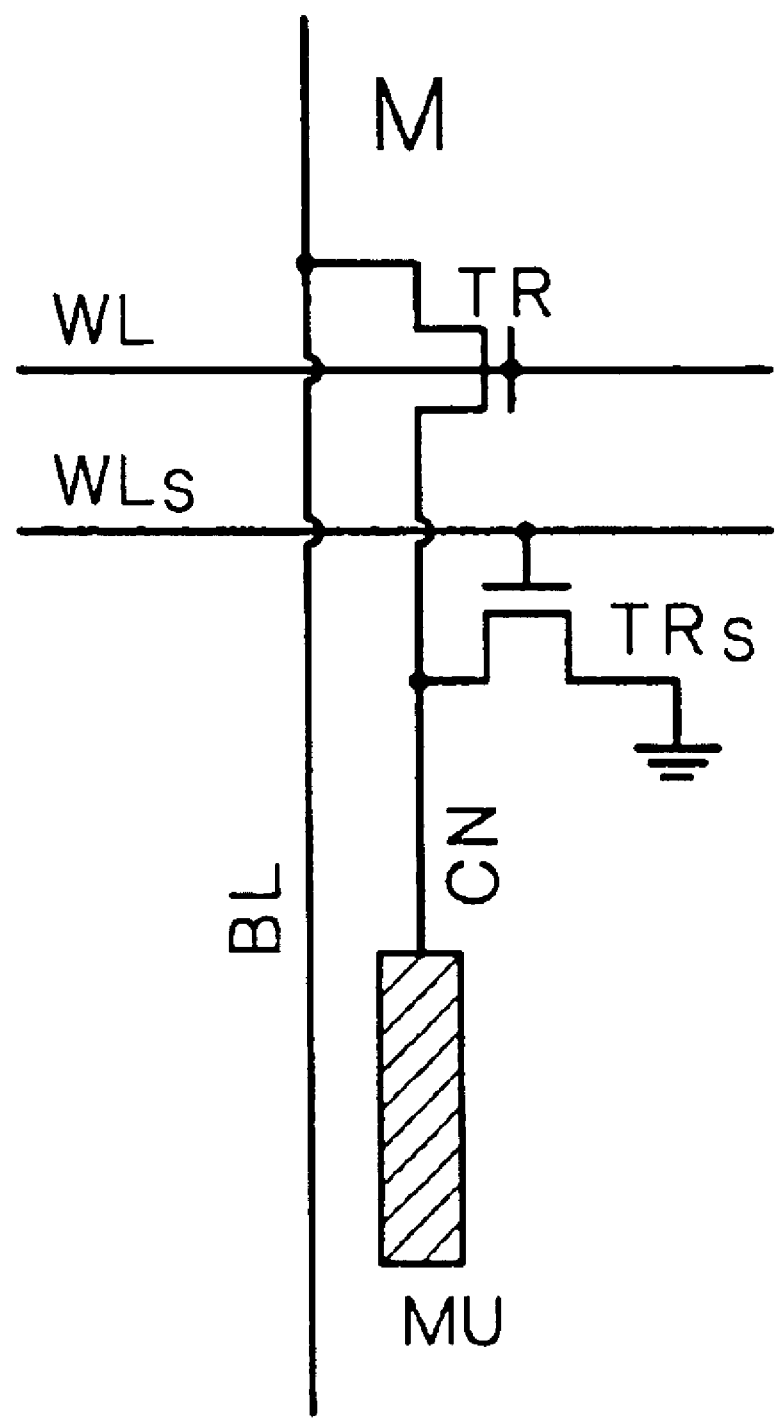
FIG. 2 is a conceptual circuit diagram of the ferroelectric-type nonvolatile semiconductor memory of Example 1.
Figure 3:
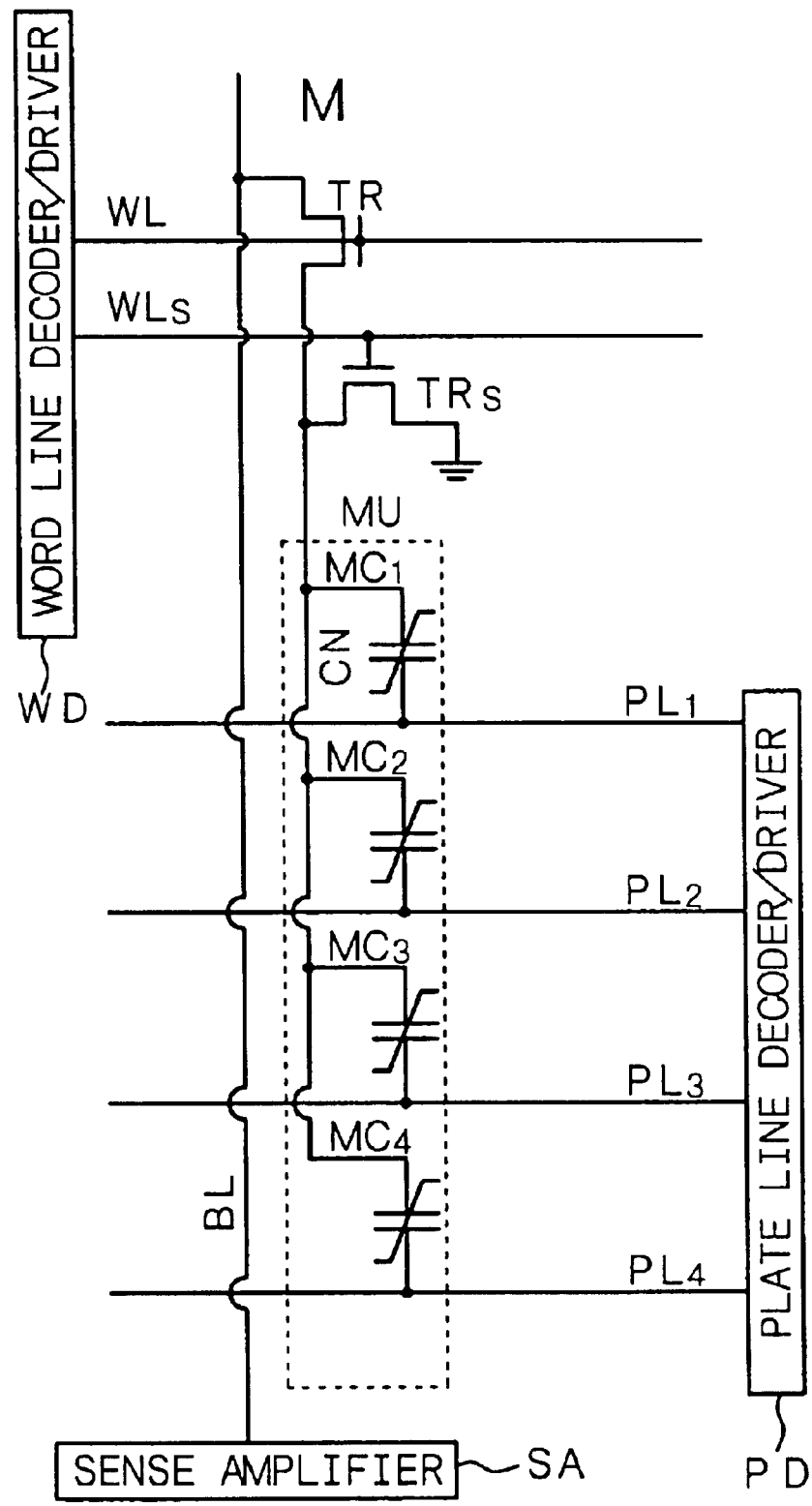
FIG. 3 is a more specific circuit diagram of the conceptual circuit diagram shown in FIG. 2.

Example 1 is concerned with the ferroelectric-type nonvolatile semiconductor memory (to be abbreviated as "nonvolatile memory" hereinafter) according to the first aspect (more specifically, the first-A aspect) of the present invention. FIG. 1 show a schematic partial cross-sectional view of the nonvolatile memory of Example 1, taken by cutting the nonvolatile memory with an imaginary line in parallel with the extending direction of a bit line. Further, FIG. 2 shows a conceptual circuit diagram of the nonvolatile memory of Example 1, and FIG. 3 shows a more specific circuit diagram of the conceptual circuit diagram shown in FIG. 2. In FIG. 1, two nonvolatile memories adjacent to each other in the bit line direction are shown. Reference numerals indicating elements of one of the adjacent nonvolatile memories are marked by "'".

The nonvolatile memory M of Example 1 comprises;

(A) a bit line BL, (B) a transistor for selection TR, (C) a memory unit MU composed of memory cells $MC_M$ that are M in number (M≧2, and M=4 in Example 1), and (D) plate lines $PL_M$ that are M in number.

Each memory cell $MC_m$ comprises a first electrode 21, a ferroelectric layer 22 and a second electrode 23. In the memory unit MU, the first electrodes 21 of the memory cells $MC_m$ are in common, and the common first electrode 21 (to be sometimes referred to as "common node CN" hereinafter) is connected to the bit line BL through the transistor for selection TR. In the memory unit MU, the second electrode 23 of the m-th-place (m=1, 2 . . . , M) memory cell $MC_m$ is connected to the m-th-place plate line $PL_m$.

One source/drain region 14A of the transistor for selection TR is connected to the bit line BL through a contact hole 15, and the other source/drain region 14B of the transistor for selection TR is connected to the common first electrode 21 (first common node CN) in the memory unit MU through a contact hole 18 formed in an opening portion 17 made through an insulating layer 16. Further, the bit line BL is connected to a sense amplifier SA. The plate line $PL_M$ is connected to a plate line decoder/driver PD. Further, a word line WL for controlling the operation of the transistor for selection TR is connected to a word line decoder/driver WD. The word line WL is extending in the direction perpendicular to the paper surface of FIG. 1. The word line WL is common to the transistor for selection TR constituting the nonvolatile memory M and a transistor for selection constituting a nonvolatile memory that is adjacent to the nonvolatile memory M in the direction perpendicular to the paper surface of FIG. 1. The second electrode 23 of the memory cell $MC_m$ constituting the nonvolatile memory M is common to the second electrode of the memory cell constituting the nonvolatile memory that is adjacent to the nonvolatile memory M in the direction perpendicular to the paper surface of FIG. 1. The second electrode 23 also works as the plate line $PL_m$.

The nonvolatile memory has a circuit for short-circuiting the plate lines $PL_M$ that are M in number and the common first electrode (common node CN). The circuit will be sometimes referred to as "short-circuiting circuit" hereinafter. In other words, the nonvolatile memory has a transistor for switching $TR_S$ for grounding the common first electrode (common node CN). Specifically, the short-circuiting circuit comprises the transistor for switching $TR_S$ and transistors (not shown) that are provided in the plate line decoders/drivers PD and work to ground the plate lines $PL_m$. The word line $WL_S$ for controlling the operation of the transistor for switching $TR_S$, is connected to the word line decoder/driver WD. One source/drain region of the transistor for switching $TR_S$ is common to the other source/drain region 14B of the transistor for selection TR, and the other source/drain region 14C of the transistor for switching $TR_S$ is connected to a grounding line (not shown). That "the source/drain region of one transistor is common to the source/drain region of the other transistor" means that the two transistors occupies one source/drain region or connected to each other with a wiring. The description will be used in the same sense hereinafter.

When the memory cell $MC_M$ is operated, that is, when data is written into the memory cell $MC_M$ or when data is read out from and re-written into the memory cell $MC_M$, the transistor for switching $TR_s$ is brought into an OFF-state, and the transistors (not shown) that are provided in the plate line decoders/drivers PD and are provided for grounding the plate lines $PL_m$ are brought into an OFF-state. And, for example, when data stored in the memory cell $MC_m$ (m=any one of 1, 2, 3 and 4) is read out, the word line WL is selected, and a voltage, for example, of (½) $V_{cc}$ is applied to the plate lines $PL_j$ (m≠j), and in this state, the plate line $PL_m$ is driven. The above $V_{cc}$ is, for example, a power source voltage. In this manner, a voltage (bit line potential) appears on the bit line BL through the transistor for selection TR depending upon data stored in the memory cell $MC_m$. And, the above voltage (bit line potential) on the bit line BL is detected with the sense amplifier SA. The value of M is not limited to 4. The value of M may be any value so long as it satisfies $M \geq 2$, and for example, it can be an exponent number of 2 (2, 4, 8, 16 . . . ).

Figure 63A:
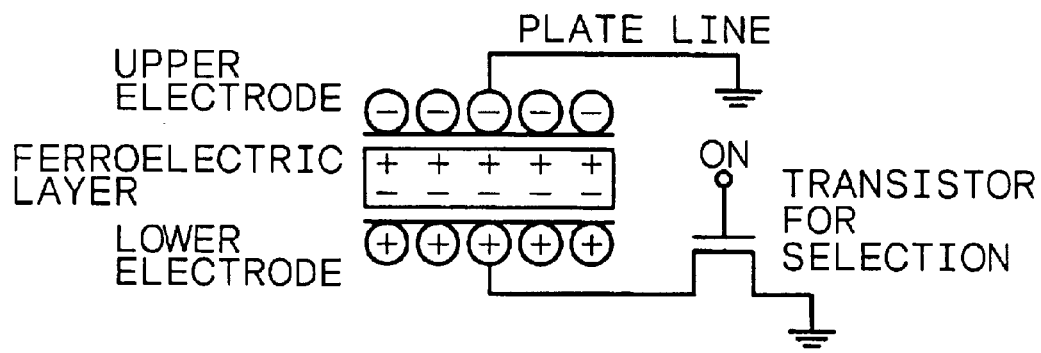
FIGS. 63A and 63B are schematic drawings of charge distributions caused by a polarization attenuation phenomenon.
Figure 63B:
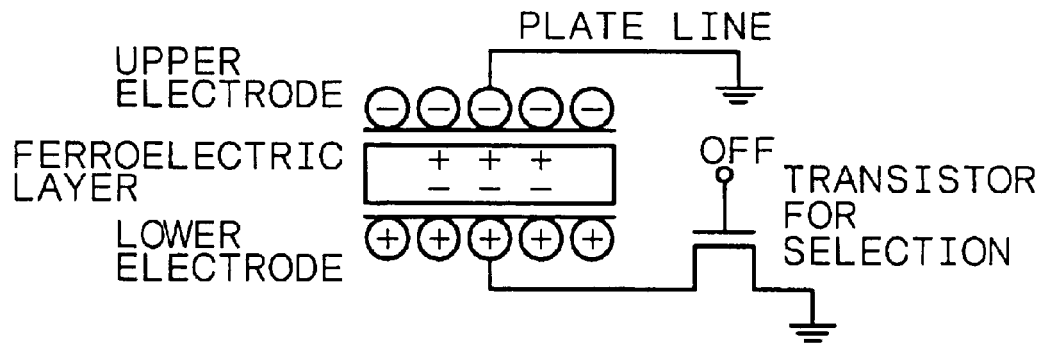
Figure 63C:
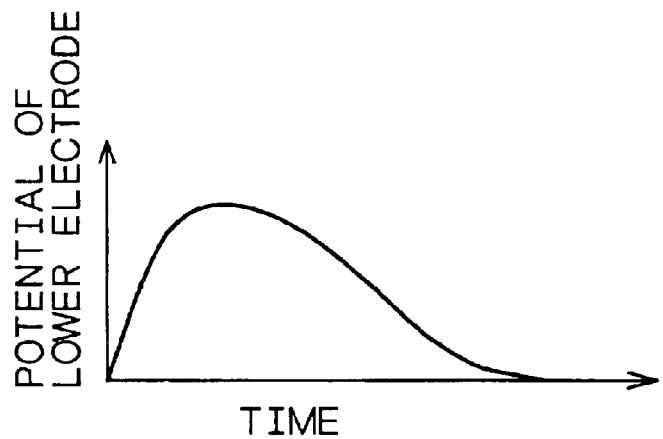
FIG. 63C is a schematic drawing of a change in the potential of a lower electrode.

When the memory cell $MC_M$ is in non-operation (standby), the transistor for switching $TR_S$ is brought into an ON-state, to ground the common node CN, and the transistors (not shown) that are provided in the plate line decoders/drivers PD and are provided for grounding the plate lines $PL_m$ are brought into an ON-state. In this manner, the common first electrode (common node CN) is no longer in a floating state, and a state shown in FIG. 63A can be obtained. As a result, a change in the potential of the common first electrode (common node CN) can be suppressed. In the memory cell $MC_M$, the destruction of data caused by the polarization attenuation phenomenon can be reliably prevented.

In principle, the operation and non-operation states of nonvolatile memories having a transistor for switching in Examples to be described later are basically the same as the operation and non-operation states of the nonvolatile memory in Example 1.

The process for the production of the above-constituted nonvolatile memory will be explained below. Nonvolatile memories in other Examples and variants thereof can be also produced by substantially the same process.

[Step-100]

First, MOS transistors that work as the transistor for selection TR and the transistor for switching $TR_S$ in the nonvolatile memory are formed in the semiconductor substrate 10. For this purpose, a device-isolation region 11 having, for example, a LOCOS structure is formed by a known method. The device-isolation region may have a trench structure or may be formed of a combination of a LOCOS structure and a trench structure. Then, the surface of the semiconductor substrate 10 is oxidized, for example, by a pyrogenic oxidation method to form the gate insulating film 12. Then, an impurity-doped polysilicon layer is formed on the entire surface by a CVD method, and then the polysilicon layer is patterned to form the gate electrode 13. The gate electrode 13 also works as a word line. The gate electrode 13 may be constituted of a polycide or a metal silicide in place of the polysilicon layer. Then, the semiconductor substrate 10 is implanted with an ion to form an LDD structure. Then, an $SiO_2$ layer is formed on the entire surface by a CVD method and then etched back to form a gate sidewall (not shown) on sides of the gate electrode 13. Then, the semiconductor substrate 10 is implanted with an ion, and an impurity implanted is activated by annealing, to form the source/drain regions 14A, 14B and 14C.

[Step-110]

Then, a lower insulating layer made of $SiO_2$ is formed by a CVD method, and then, an opening portion is formed in the lower insulating layer above one source/drain region 14A by an RIE method. Then, a polysilicon layer doped with an impurity is formed on the lower insulating layer and the inside of the opening portion by a CVD method, whereby the contact hole 15 is formed. Then, the polysilicon layer on the lower insulating layer is patterned to form the bit lines BL. Then, an upper insulating layer made of BPSG is formed on the entire surface by a CVD method. After the formation of the upper insulating layer made of BPSG, preferably, the upper insulating layer is re-flowed in a nitrogen atmosphere, for example, at 900° C. for 20 minutes. Further, desirably, the top surface of the upper insulating layer is chemically and mechanically polished by a chemical/mechanical polishing method (CMP method) to flatten the upper insulating layer as required. The lower insulating layer and the upper insulating layer will be together referred to as insulating layer 16.

[Step-120]

Then, an opening portion 17 is made in the insulating layer 16 above the other source/drain region 14B by an RIE method, and then the opening portion 17 is filled with polysilicon doped with an impurity, to complete the contact hole (contact plug) 18. The bit line BL is extending on the lower insulating layer leftward and rightward in the drawing without being in contact with the contact hole 18.

The contact hole 18 may be also formed by filling the opening portion 17 made in the insulating layer 16 with a metal wiring material of a refractory metal or a metal silicide such as tungsten, Ti, Pt, Pd, Cu, TiW, TiNW, $WSi_2$ or $MoSi_2$. The top surface of the contact hole 18 may be present nearly at the level of the surface of the insulating layer 16, or a top portion of the contact hole 18 may be extending on the surface of the insulating layer 16. The following Table 2 shows conditions of filling the opening portion 17 with tungsten to form the contact hole 18. Before filling the opening portion 17 with tungsten, preferably, a Ti layer and a TiN layer are consecutively formed on the insulating layer 16 and the inside of the opening portion 17, for example, by a magnetron sputtering method. The Ti layer and the TiN layer are formed for attaining an ohmic low contact resistance, preventing damage of the semiconductor substrate 10 in the blanket tungsten CVD method and improving the adhesion of tungsten.

TABLE 2

| Sputtering conditions of Ti layer (thickness: 20 nm) | |
|---|---|
| Process gas | Ar = 35 sccm |
| Pressure | 0.52 Pa |
| RF power | 2 kw |
| Heating of substrate | No |
| Sputtering conditions of TiN layer (thickness: 100 nm) | |
| Process gas | $N_2$/Ar = 100/35 sccm |
| Pressure | 1.0 Pa |
| RF power | 6 kw |
| Heating of substrate | No |
| CVD Condition of formation of tungsten | |
| Gas | $WF_6/H_2$/Ar = 40/400/2250 sccm |
| Pressure | $10.7 \times 10^3$ Pa |
| Forming temperature | 450° C. |
| Conditions of etching tungsten layer, TiN layer and Ti layer | |
| Etching at first stage: Etching of tungsten layer | |
| Gas | $SF_6$/Ar/He = 110/90/5 sccm |
| Pressure | 46 Pa |
| RF power | 275 W |
| Etching at second stage: Etching of TiN layer/Ti layer | |
| Gas | Ar/$Cl_2$ = 75/5 sccm |
| Pressure | 6.5 Pa |
| RF power | 250 W |

[Step-130]

Then, preferably, an adhesive layer (not shown) made of titanium oxide is formed on the insulating layer 16. Then, a first electrode material layer made of Ir for constituting the first electrode (lower electrode) 21 is formed on the adhesive layer, for example, by a sputtering method, and the first electrode material layer and the adhesive layer are patterned by photolithography and a dry etching method, whereby the first electrode 21 can be formed.

[Step-140]

Then, a ferroelectric thin film made of a Bi-containing layer perovskite-type ferroelectric material (specifically, for example, $Bi_2SrTa_2O_9$ having a crystallization temperature of 750° C.) is formed on the entire surface, for example, by a MOCVD method, followed by drying in air at 250° C. and then heat treatment is carried out in an oxygen atmosphere at 750° C. for 1 hour, to promote crystallization. Then, the ferroelectric thin film is patterned by photolithography and a dry etching method as required, whereby the ferroelectric layer 22 can be formed.

[Step-150]

Then, an $IrO_{2-x}$ layer and a Pt layer are consecutively formed on the entire surface by a sputtering method, and the Pt layer and the $IrO_{2-x}$ layer are consecutively patterned by photolithography and a dry etching method, to form the second electrode 23. When the etching damages the ferroelectric layer 22, it is sufficient to carry out heat treatment at a temperature necessary for recovery from the damage.

[Step-160]

Then, an insulation layer 26A is formed on the entire surface.

In the process for the production of the nonvolatile memories of Examples 3 to 8, the above step is followed by;

formation and flattening of an insulating interlayer 26, formation of an opening portion 27 and formation of a contact hole 28, formation of a first electrode 31, a ferroelectric 32 made of $Bi_2Sr(Ta_{1.5}Nb_{0.5})O_9$ having a crystallization temperature of 700° C., and formation of a second electrode 33, and formation of an insulation layer 36A.

For promotion of crystallization, the ferroelectric 32 made of $Bi_2Sr(Ta_{1.5}Nb_{0.5})O_9$ may be heat-treated in an oxygen atmosphere at 700° C. for 1 hour.

Each second electrode is not necessarily required to work as a plate line. In such a case, after completion of the insulation layer 26A, 36A, the second electrode 23 and the second electrode 33 are connected through a contact hole (via hole), and a plate line being connected to the contact hole is also formed on the insulation layer 26A, 36A.

The following Table 3 shows a condition of forming the ferroelectric thin film made, for example, of $Bi_2SrTa_2O_9$. In Table 3, "thd" stands for tetramethylheptandione. Further, source materials shown in Table 3 are in the form of a solution thereof in a solvent containing tetrahydrofuran (THF) as a main component.

TABLE 3

| Formation by MOCVD method | |
| --- | --- |
| Source material | $Sr(thd)_2$-tetraglyme |
| | $Bi(C_6H_5)_3$ |
| | $Ta(O-iC_3H_7)_4(thd)$ |
| Forming temperature | 400–700° C. |
| Process gas | $Ar/O_2 = 1000/1000$ cm$^3$ |
| Forming rate | 5–20 nm/minute |

Alternatively, a ferroelectric thin film made of $Bi_2SrTa_2O_9$ may be formed on the entire surface by a pulse laser abrasion method, a sol-gel method or an RF sputtering method. Forming conditions in these cases will be shown below. When a thick ferroelectric thin film is formed by a sol-gel method, spin coating and drying, or spin coating and calcining (or annealing) are repeated as required.

TABLE 4

| Formation by pulse laser abrasion method | |
| --- | --- |
| Target | $Bi_2SrTa_2O_9$ |
| Laser used | KrF Excimer laser (wavelength 248 nm, pulse width 25 nanosecond, 5 Hz) |
| Forming temperature | 400–800° C. |
| Oxygen concentration | 3 Pa |

TABLE 5

| Formation by sol-gel method | |
| --- | --- |
| Material | $Bi(CH_3(CH_2)_3CH(C_2H_5)COO)_3$ [bismuth-diethylhexanoic acid, $Bi(OOc)_3$] |
| | $Sr(CH_3(CH_2)_3CH(C_2H_5)COO)_2$ [strontium-diethylhexanoic acid, $Sr(OOc)_2$] |
| | $Ta(OEt)_5$ [tantalum ethoxide] |
| Spin coating condition | 3000 rpm × 20 seconds |
| Drying | 250° C. × 7 minutes |
| Calcining | 700–800° C. × 1 hour (RTA treatment is added as required) |

TABLE 6

| Formation by RF sputtering method | |
| --- | --- |
| Target | $Bi_2SrTa_2O_9$ ceramic target |
| RF power | 1.2 W–2.0 W/target 1 cm$^2$ |
| Ambient pressure | 0.2–1.3 Pa |
| Forming temperature | room temperature —600° C. |
| Process gas | flow rate of $Ar/O_2 = 2/1-9/1$ |

The following Table 7 shows a condition of formation of PZT or PLZT by a magnetron sputtering method when the ferroelectric layer is constituted of PZT or PLZT. Alternatively, PZT or PLZT may be formed by a reactive sputtering method, an electron beam deposition method, a sol-gel method or an MOCVD method.

TABLE 7

| | |
| --- | --- |
| Target | PZT or PLZT |
| Process gas | $Ar/O_2 = 90$ vol %/10 vol % |
| Pressure | 4 Pa |
| Power | 50 W |
| Forming temperature | 500° C. |

Further, PZT or PLZT may be formed by a pulse laser abrasion method. The following Table 8 shows a forming condition thereof.

TABLE 8

| | |
| --- | --- |
| Target | PZT or PLZT |
| Laser used | KrF Excimer laser (wavelength 248 nm, pulse width 25 nanoseconds, 3 Hz) |
| Output energy | 400 mJ (1.1 J/cm$^2$) |
| Forming temperature | 550–600° C. |
| Oxygen concentration | 40–120 Pa |

EXAMPLE 2

Figure 4:
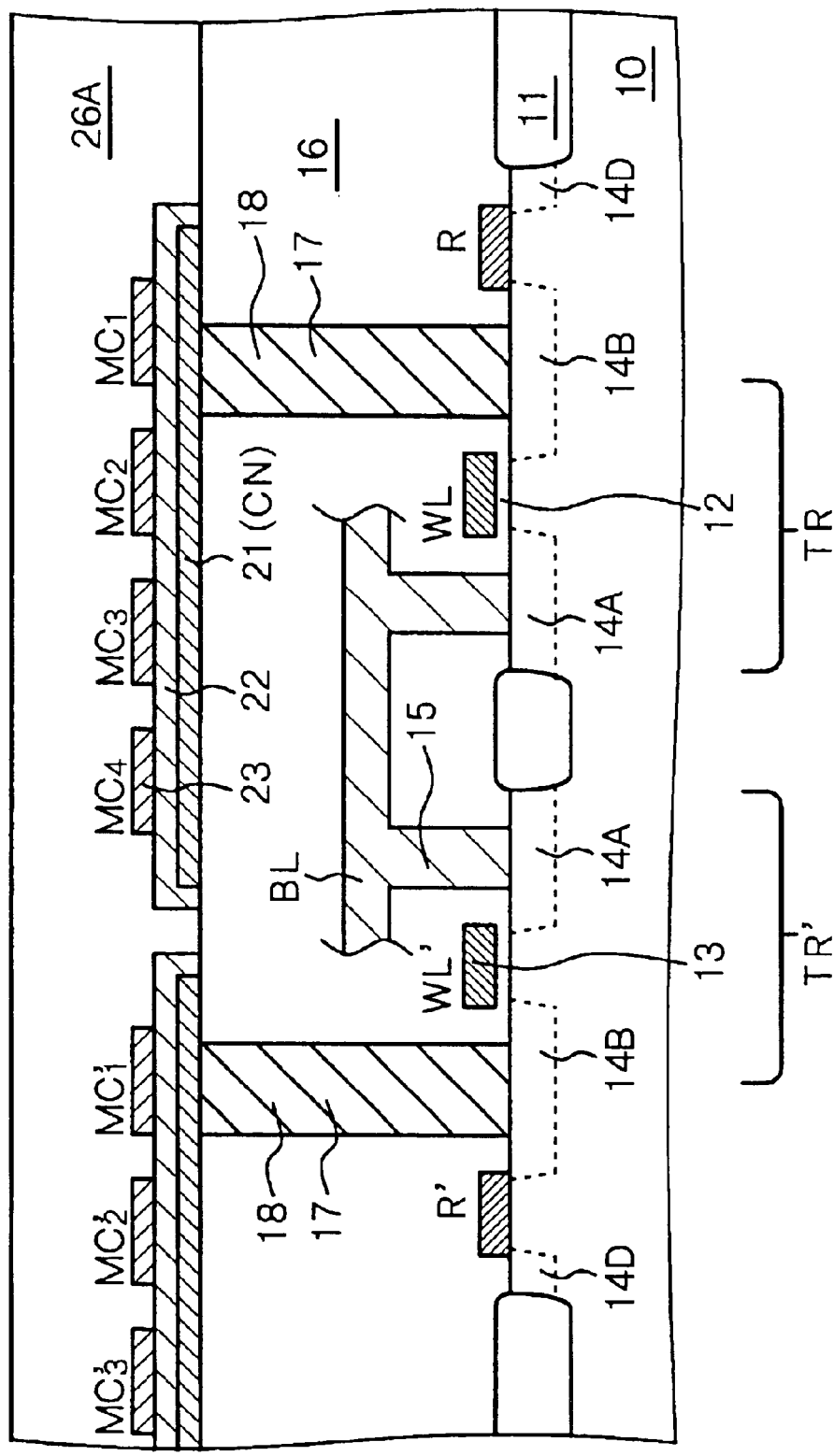
FIG. 4 is a schematic partial cross-sectional view of a ferroelectric-type nonvolatile semiconductor memory of Example 2, taken by cutting the ferroelectric-type nonvolatile semiconductor memory with an imaginary perpendicular plane in parallel with the extending direction of a bit line.
Figure 5:
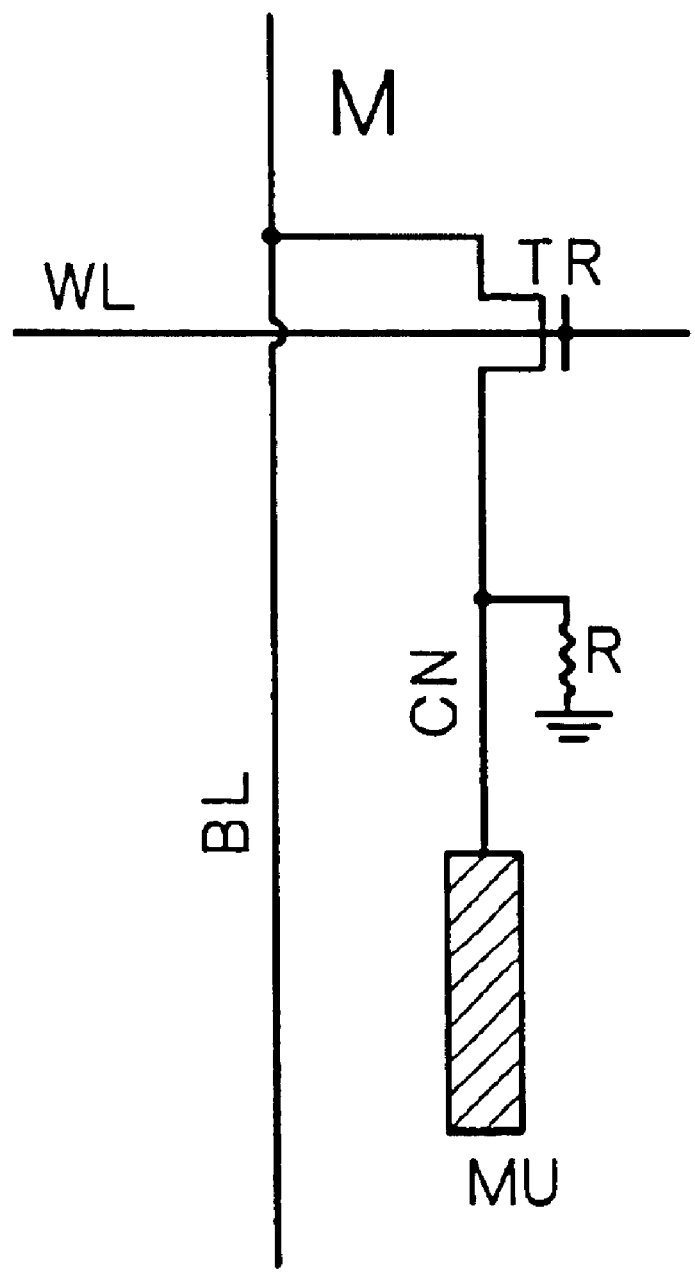
FIG. 5 is a conceptual circuit diagram of the ferroelectric-type nonvolatile semiconductor memory of Example 2.
Figure 6:
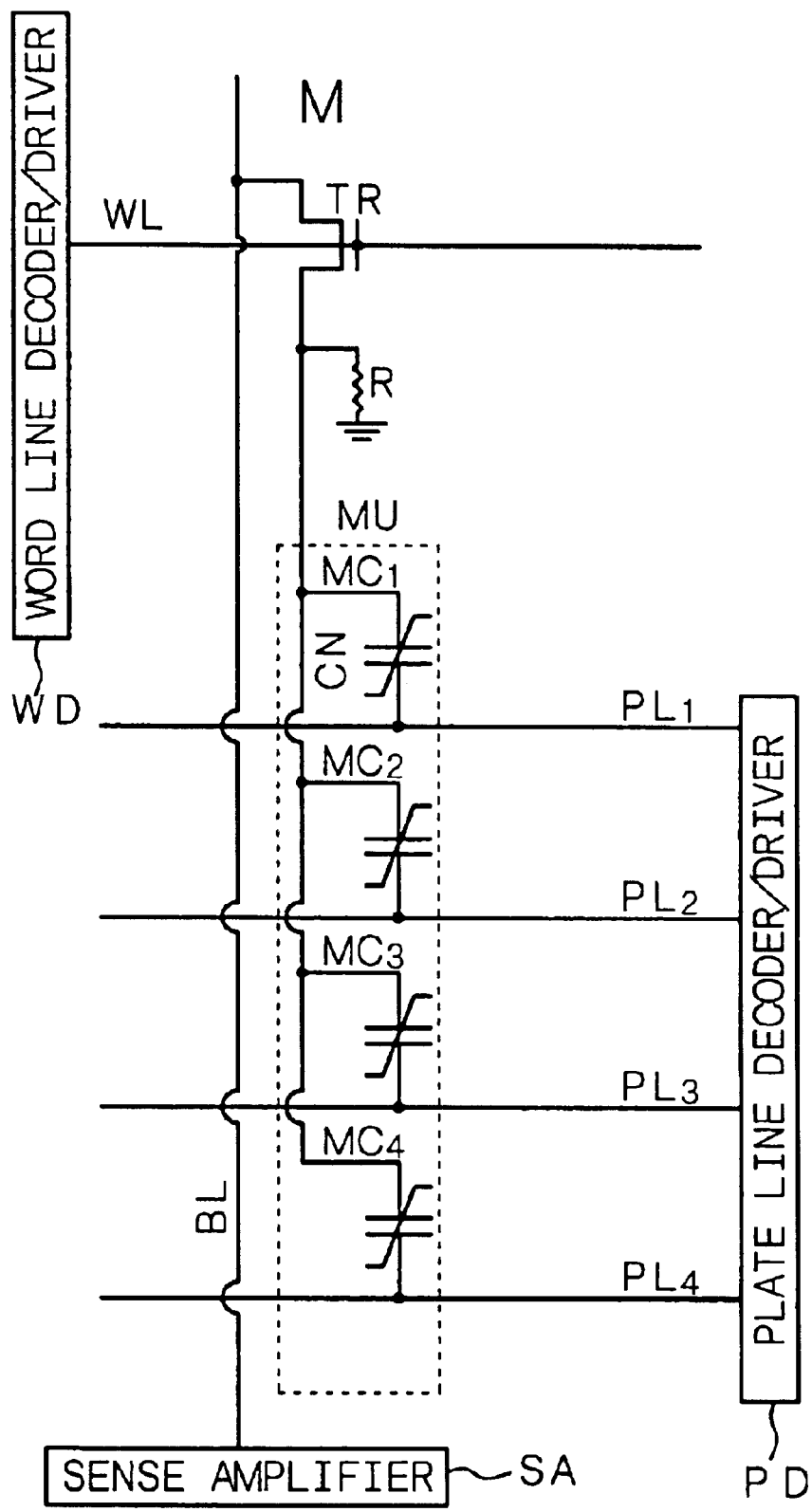
FIG. 6 is a more specific circuit diagram of the conceptual circuit diagram shown in FIG. 5.

Example 2 is concerned with the nonvolatile memory according to the first aspect (more specifically, first-B aspect) of the present invention. FIG. 4 shows a schematic partial cross-sectional view of the nonvolatile memory of Example 2, taken by cutting the nonvolatile memory with an imaginary plane in parallel with the extending direction of a bit line. FIG. 5 shows a conceptual circuit diagram of the nonvolatile memory of Example 2, and FIG. 6 shows a more specific circuit diagram of the conceptual circuit diagram shown in FIG. 5. FIG. 4 also shows two nonvolatile memories adjacent to each other in the bit line direction. Reference numerals indicating element constituting one of the adjacent nonvolatile memories are marked by "'".

The nonvolatile memory of Example 2 has the same structure as that of the nonvolatile memory of Example 1 except that the nonvolatile memory of Example 2 has a high-resistance element R for grounding the common first electrode 21 (common node CN) in place of the transistor for switching $TR_S$ for grounding the common first electrode (common node CN), so that the detailed explanation thereof will be omitted. The high-resistance element R is composed of a polysilicon layer having a resistance value of $1 \times 10^6 \Omega$ (1 MΩ) to $1 \times 10^{12} \Omega$ (1 TΩ). The high-resistance element R and the transistors (not shown) that are provided in the plate line decoders/drivers PD and are provided for grounding the plate lines $PL_m$ constitute the circuit for grounding the plate lines that are M in number and the common first electrode.

The high-resistance element R can be formed on the semiconductor substrate 10 when the MOS type transistor is produced in [Step-100]. One end of the high-resistance element R is connected to the other source/drain region 14B of the transistor for selection TR. The other end of the high-resistance element R is connected to a grounding line 14D.

Generally, the operation time period of the nonvolatile memory is of the order of several tens nanoseconds. For avoiding the deterioration of a signal being transmitted through the common node CN in the operation of the nonvolatile memory, therefore, the time constant (first time constant) for extracting charges through the high-resistance element R is required to be sufficiently greater than the operation time period of the nonvolatile memory. For stabilizing the potential of the common node CN in the non-operation (standby) of the nonvolatile memory, the time constant (second time constant) for extracting charges is required to be small. Taking account of the above requirements, desirably, the first time constant is at least 100 nanoseconds, and the second time constant is 100 milliseconds or less. The parasitic capacity of the common node is of the order of several tens fF to several hundreds fF. Therefore, the resistance value of the high-resistance element R is determined to be $1 \times 10^6 \Omega$ (1 MΩ) to $1 \times 10^{12} \Omega$ (1 TΩ).

When the memory cell $MC_M$ is operated, that is, when data is written into the memory cell $MC_M$ or data is read out from and re-written into the memory cell $MC_M$, the transistors (not shown) that are provided in the plate line decoders/drivers PD and are provided for grounding the plate lines $PL_m$ are brought into an OFF-state. When data stored, for example, in the memory cell $MC_m$ (m=any one of 1, 2, 3 and 4) is read out, the word line WL is selected, and a voltage, for example, of (½) $V_{cc}$ is applied to the plate lines $PL_j$ (m≠j). In this state, the plate line $PL_m$ is driven. The above $V_{cc}$ is, for example, a power source voltage. In this manner, a voltage (bit line potential) appears on the bit line BL through the transistor for selection TR depending upon the data stored in the memory cell $MC_m$. And, the above voltage (bit line potential) on the bit line BL is detected with a sense amplifier SA. The value of M is not limited to 4. The value of M may be any value so long as it satisfies M≧2, and examples of the value of M practically include exponent numbers of 2 (2, 4, 8, 16 . . . ).

The high-resistance element R has a resistance value of $1 \times 10^6 \Omega$ (1 MΩ) to $1 \times 10^{12} \Omega$ (1 TΩ), so that the high-resistance element R hardly has an influence on the voltage (bit line potential), etc., which appears on the bit line BL, when the nonvolatile memory is operated.

When the memory cell $MC_M$ is in non-operation (standby), the transistors (not shown) that are provided in the plate line decoders/drivers PD and are provided for grounding the plate lines $PL_m$ are brought to an ON-state. The first electrode (common node CN) is brought from a floating state to a grounded state in 100 milliseconds or less, and a state shown in FIG. 63A can be obtained. As a result, the change in the potential of the common first electrode (common node CN) can be suppressed. In the memory cell $MC_M$, therefore, the destruction of data caused due to the polarization attenuation phenomenon can be reliably prevented.

The operation and non-operation states of nonvolatile memories having a high-resistance element in various Examples to be described later are basically the same as those of the nonvolatile memory in Example 2.

EXAMPLE 3

Figure 7:
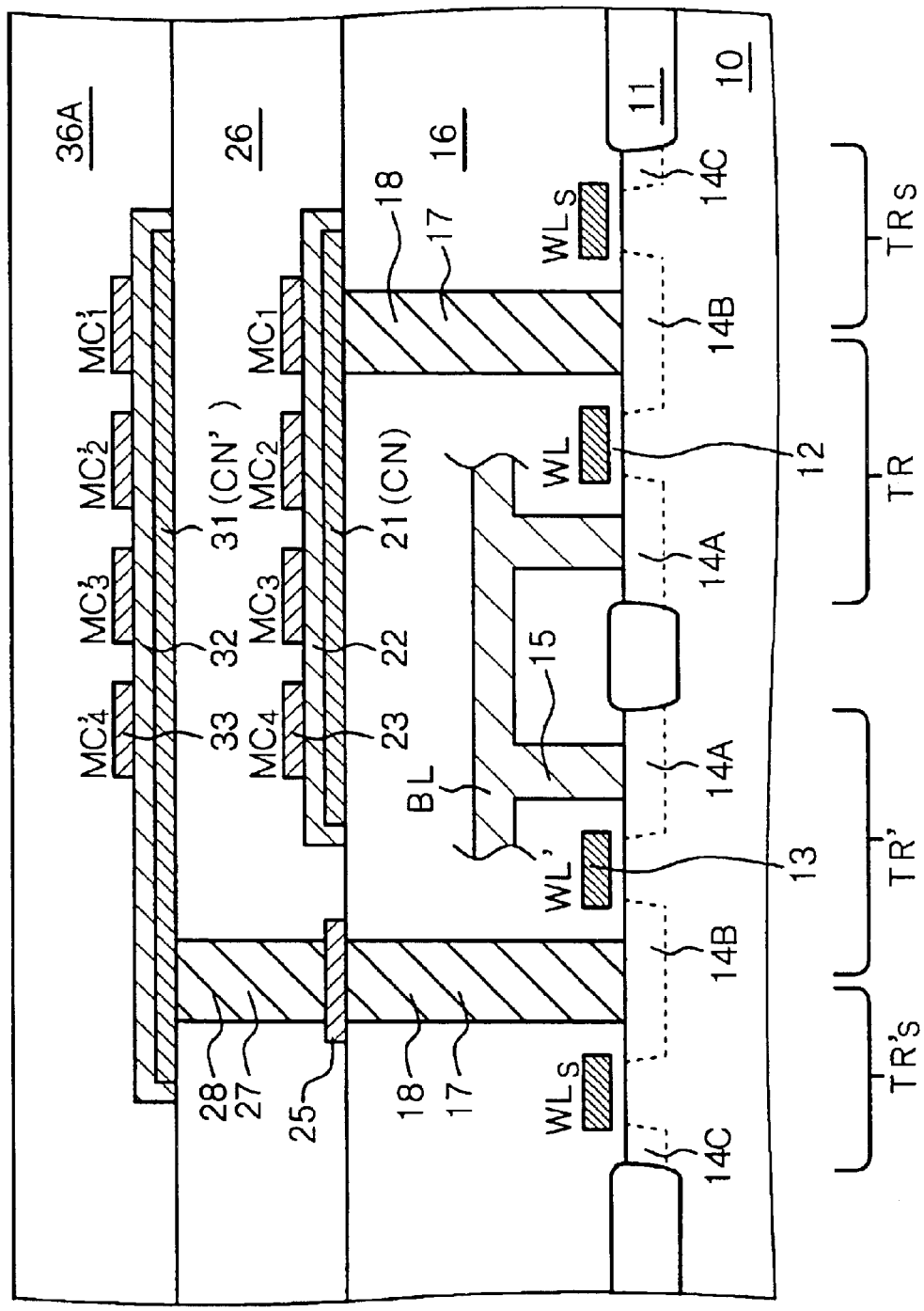
FIG. 7 is a schematic partial cross-sectional view of a ferroelectric-type nonvolatile semiconductor memory of Example 3, taken by cutting the ferroelectric-type nonvolatile semiconductor memory with an imaginary perpendicular plane in parallel with the extending direction of a bit line.
Figure 8:
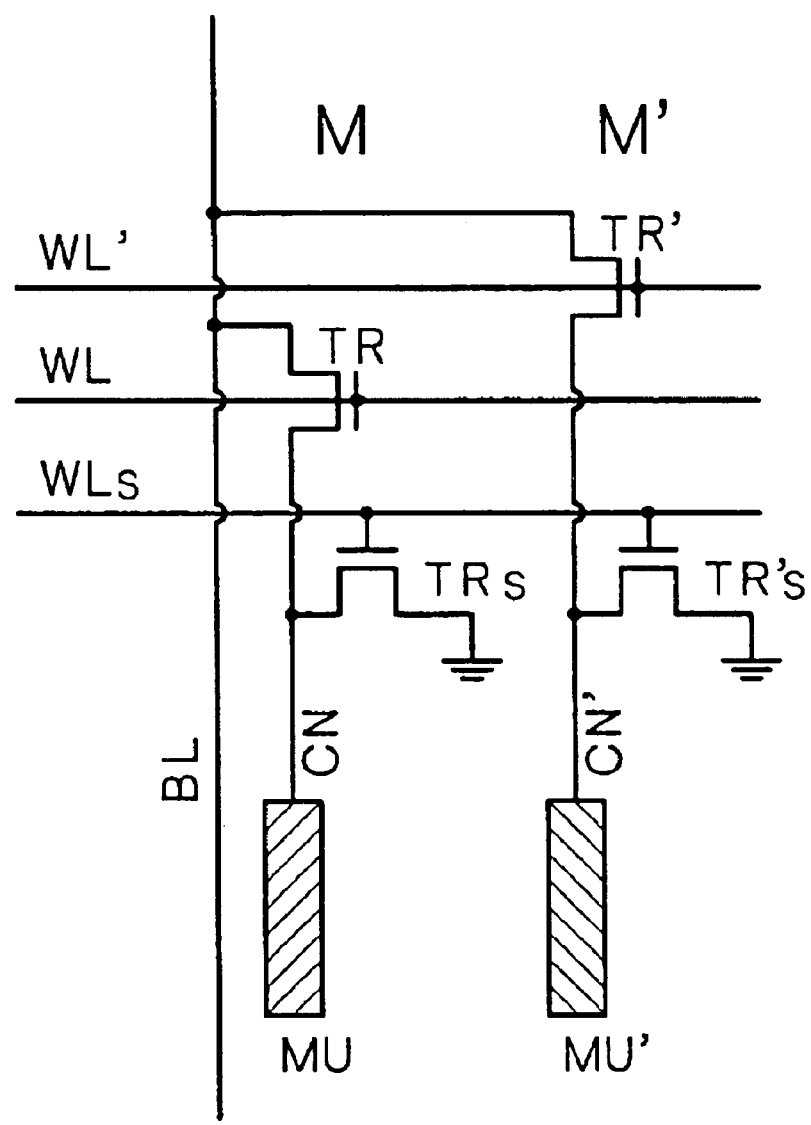
FIG. 8 is a conceptual circuit diagram of the ferroelectric-type nonvolatile semiconductor memory of Example 3.
Figure 9:
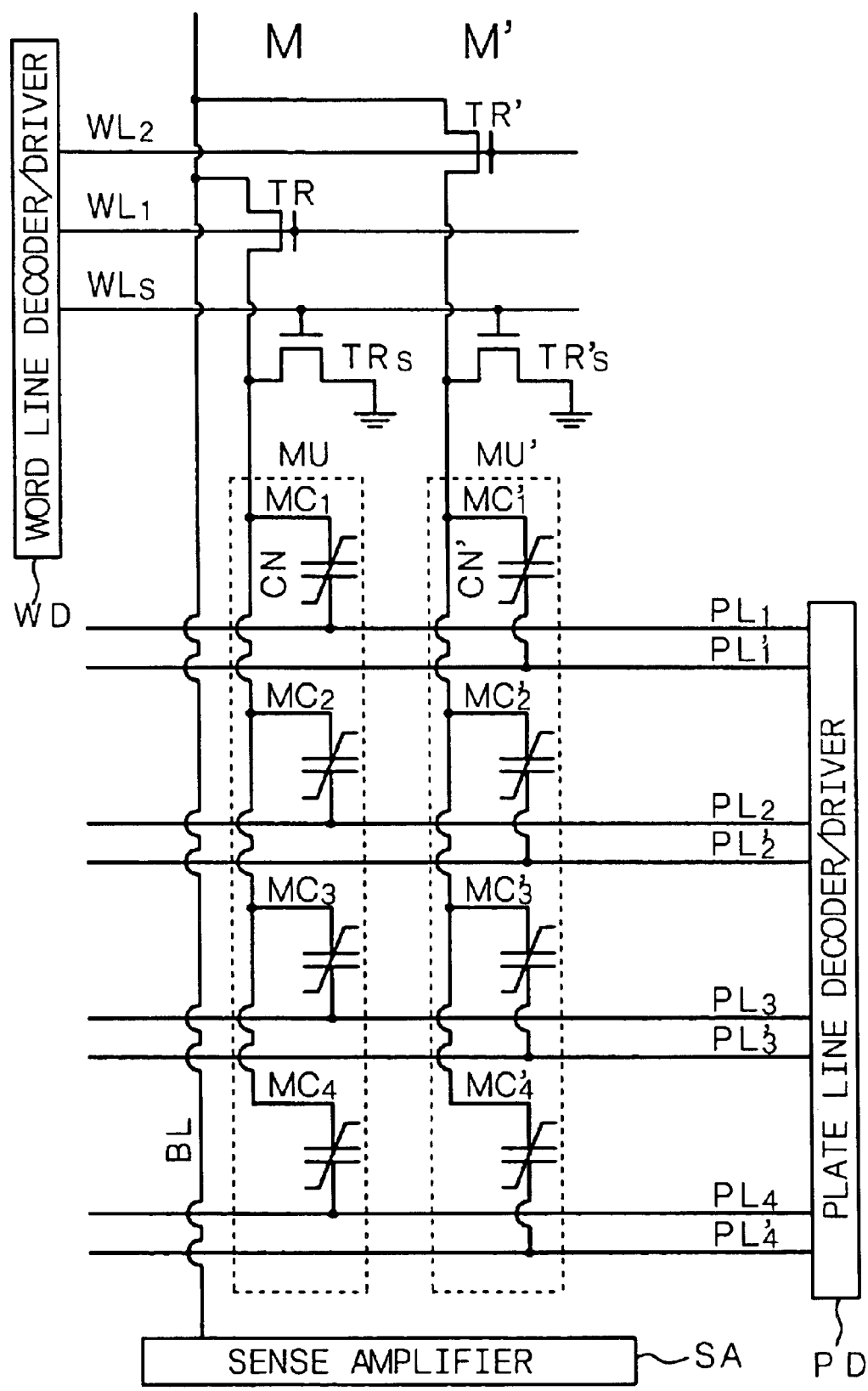
FIG. 9 is a more specific circuit diagram of the conceptual circuit diagram shown in FIG. 8.

In Example 3, memory cells $MC_M$ constituting a nonvolatile memory M having the same structure as that of the nonvolatile memory M explained in Example 1 and memory cells $MC_{M'}$ constituting a nonvolatile memory M' having the same structure as that of the nonvolatile memory M and sharing a bit line BL with the nonvolatile memory M are stacked through an insulating layer (to be referred to as "insulating interlayer 26" for convenience). FIG. 7 shows a schematic partial cross-sectional view of the two nonvolatile memories, taken by cutting the two nonvolatile memories with an imaginary plane in parallel with the extending direction of a bit line. FIG. 8 shows a conceptual circuit diagram of the above nonvolatile memories, and FIG. 9 shows a more specific circuit diagram of the conceptual circuit diagram shown in FIG. 8.

Figure 10:
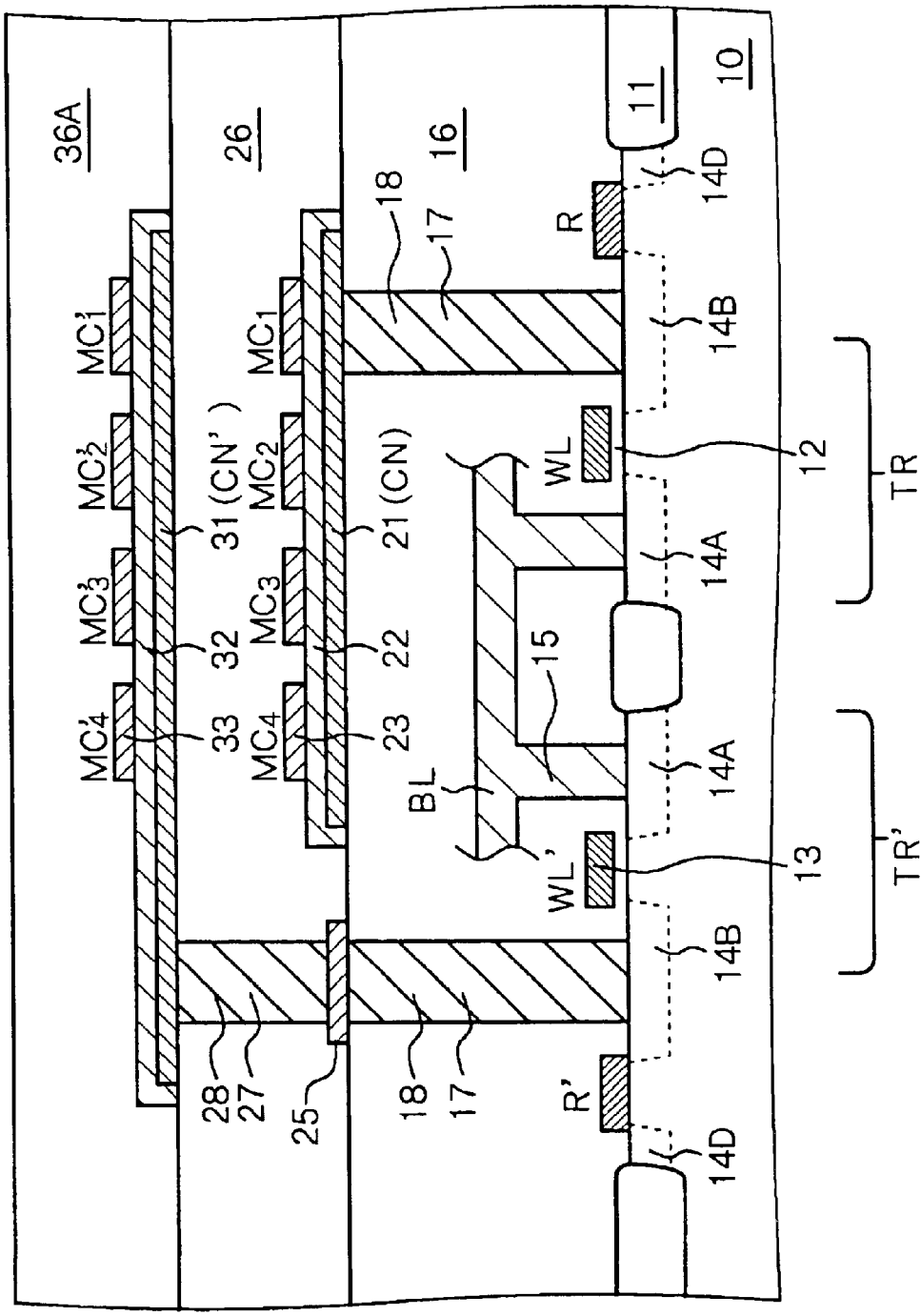
FIG. 10 is a schematic partial cross-sectional view of a variant of the ferroelectric-type nonvolatile semiconductor memory of Example 3, taken by cutting the variant with an imaginary perpendicular plane in parallel with the extending direction of a bit line.
Figure 11:
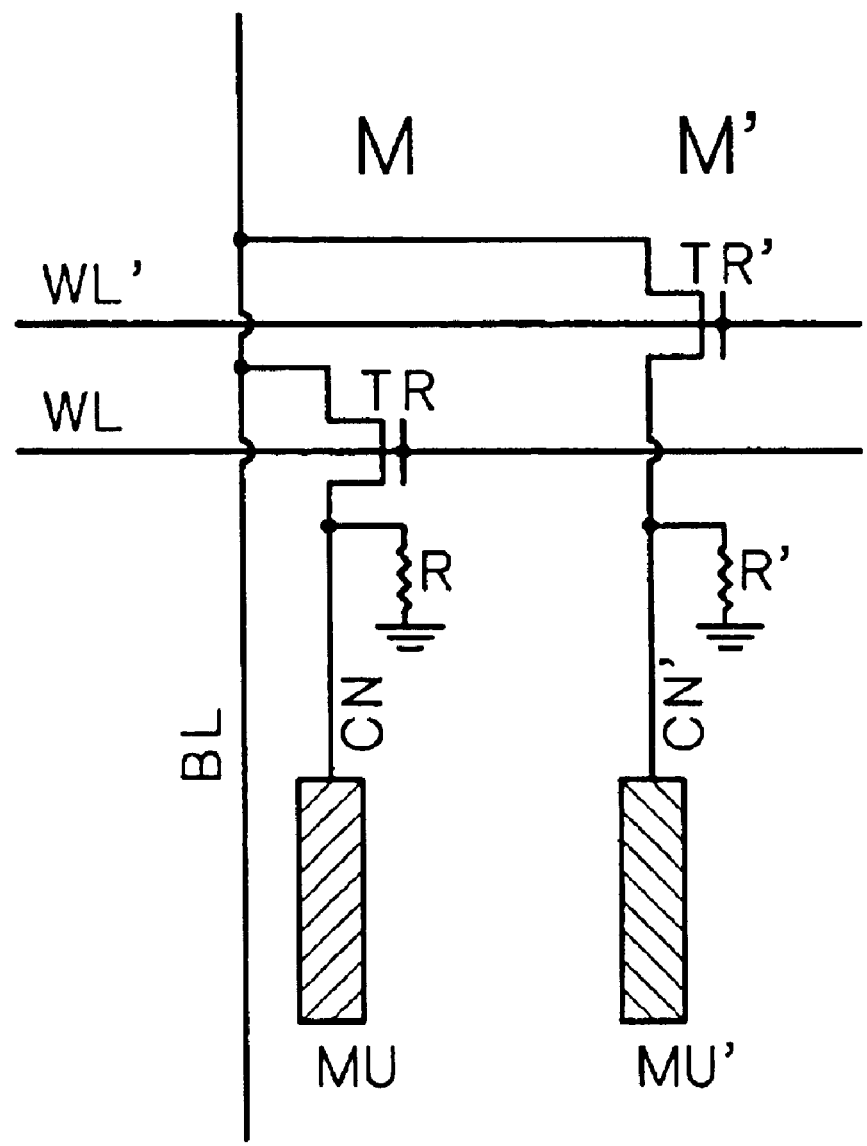
FIG. 11 is a conceptual circuit diagram of the variant of the ferroelectric-type nonvolatile semiconductor memory of Example 3.
Figure 12:
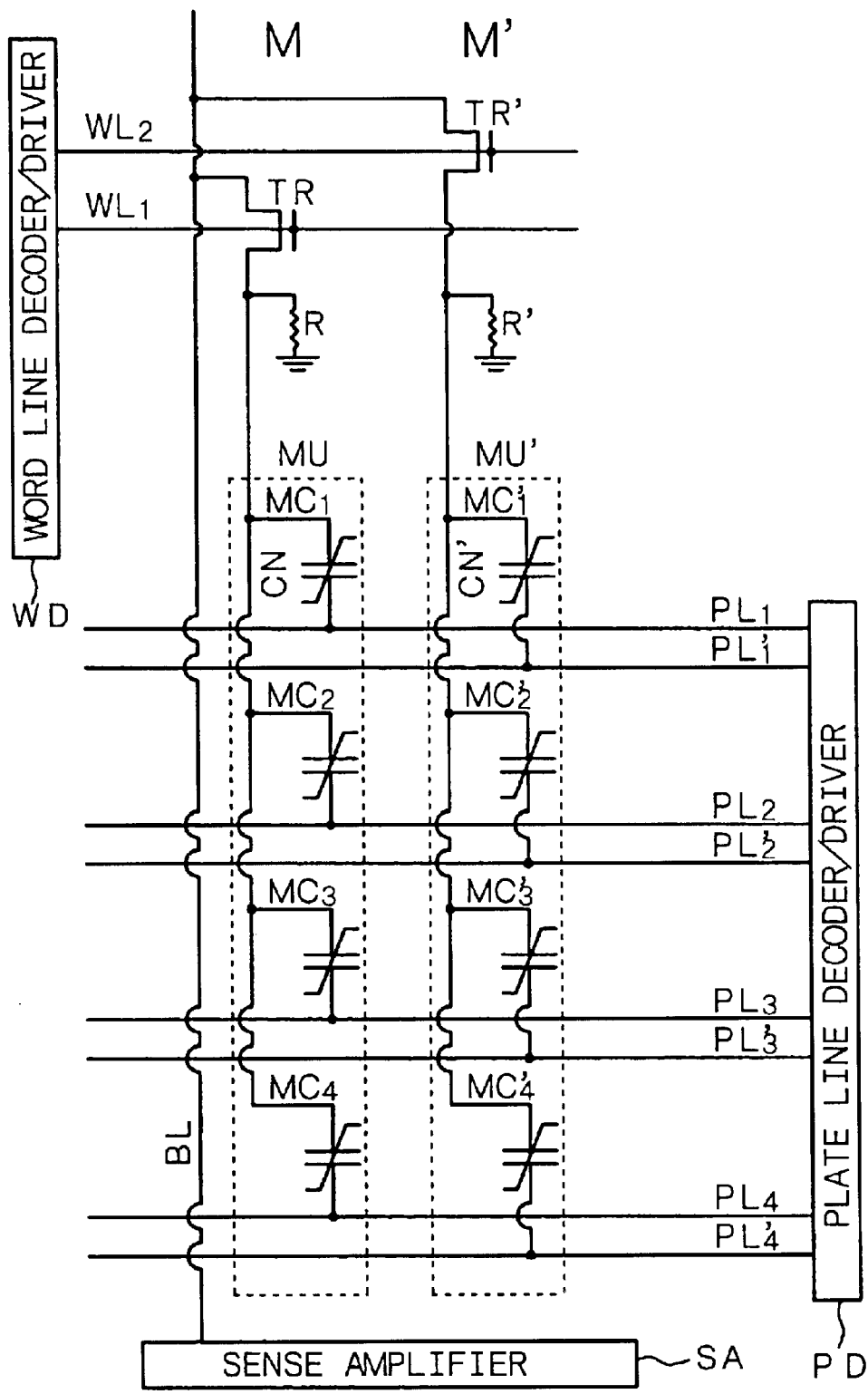
FIG. 12 is a more specific circuit diagram of the conceptual circuit diagram shown in FIG. 11.

Alternatively, memory cells $MC_M$ constituting a nonvolatile memory M having the same structure as that of the nonvolatile memory M explained in Example 2 and memory cells $MC_{M'}$ constituting a nonvolatile memory M' having the same structure as that of the nonvolatile memory M and sharing a bit line BL with the nonvolatile memory M are stacked through an insulating interlayer 26. FIG. 10 shows a schematic partial cross-sectional view of the two nonvolatile memories, taken by cutting the two nonvolatile memories with an imaginary plane in parallel with the extending direction of a bit line. FIG. 11 shows a conceptual circuit diagram of the above nonvolatile memories, and FIG. 12 shows a more specific circuit diagram of the conceptual circuit diagram shown in FIG. 11.

The memory cell $MC_{M'}$ constituting the nonvolatile memory M' positioned above the memory cell $MC_M$ constituting the nonvolatile memory M comprises a first electrode 31, a ferroelectric layer 32 and a second electrode 33. The first electrode 31 is connected to the other source/drain region 14B of a transistor for selection TR' through a contact hole 28 formed in an opening portion 27 made through the insulating interlayer 26, a pad portion 25 formed on an insulating layer 16 and a contact hole 18 formed in an opening portion 17 made through the insulating layer 16. Further, the memory cells $MC_{M'}$ are covered with an insulation layer 36A. Except for the above points, the nonvolatile memory M' is structurally the same as the nonvolatile memory M explained in Example 1 or 2, so that the detailed explanation thereof will be omitted. The circuit diagram shows that the transistors for switching $TR_S$ and $TR_S'$ are controlled by the same word line $WL_S$, while there may be employed a constitution in which these transistors are controlled by different word lines.

Figure 13:
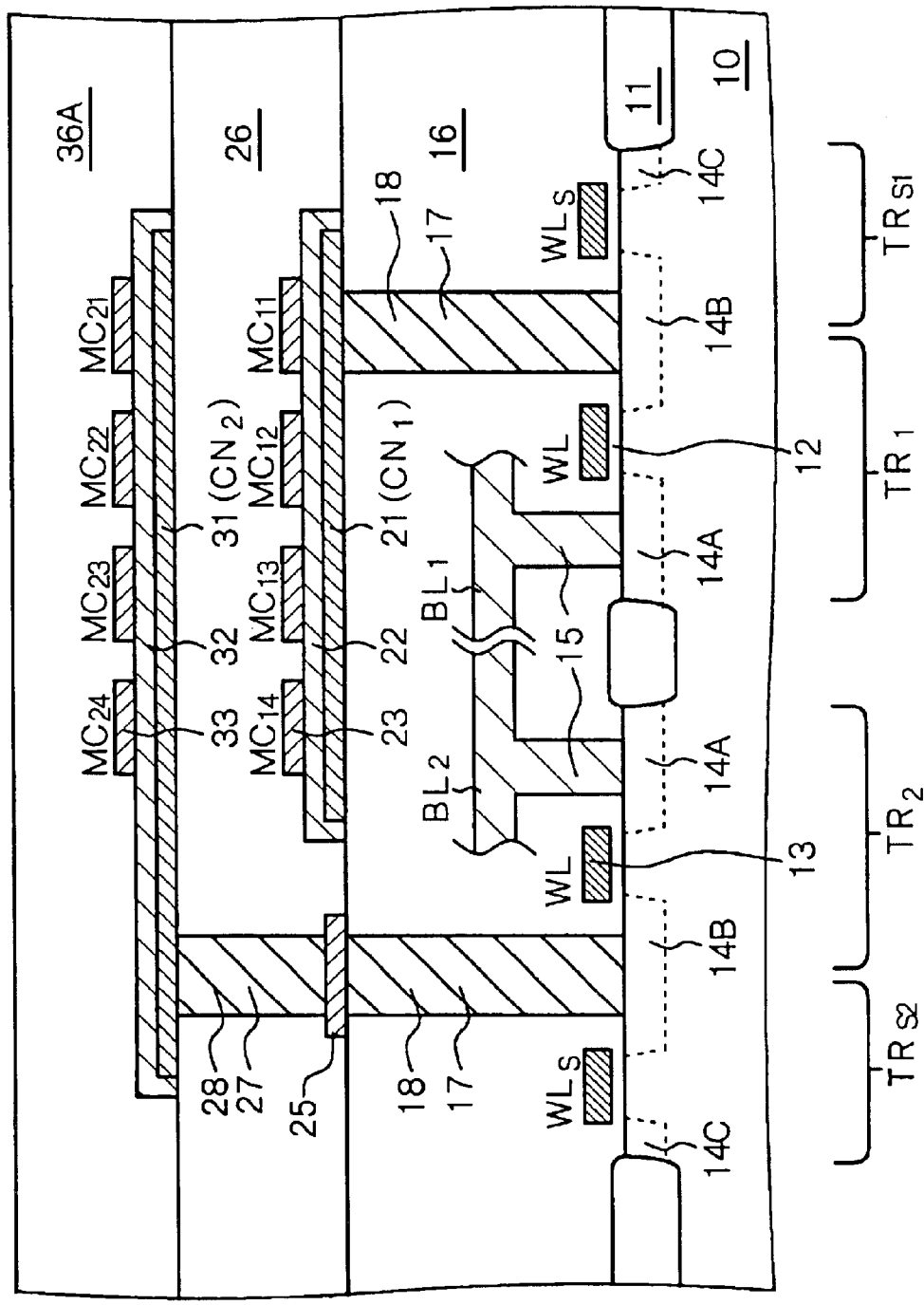
FIG. 13 is a schematic partial cross-sectional view of another variant of the ferroelectric-type nonvolatile semiconductor memory of Example 3, taken by cutting the variant with an imaginary perpendicular plane in parallel with the extending direction of a bit line.
Figure 14:
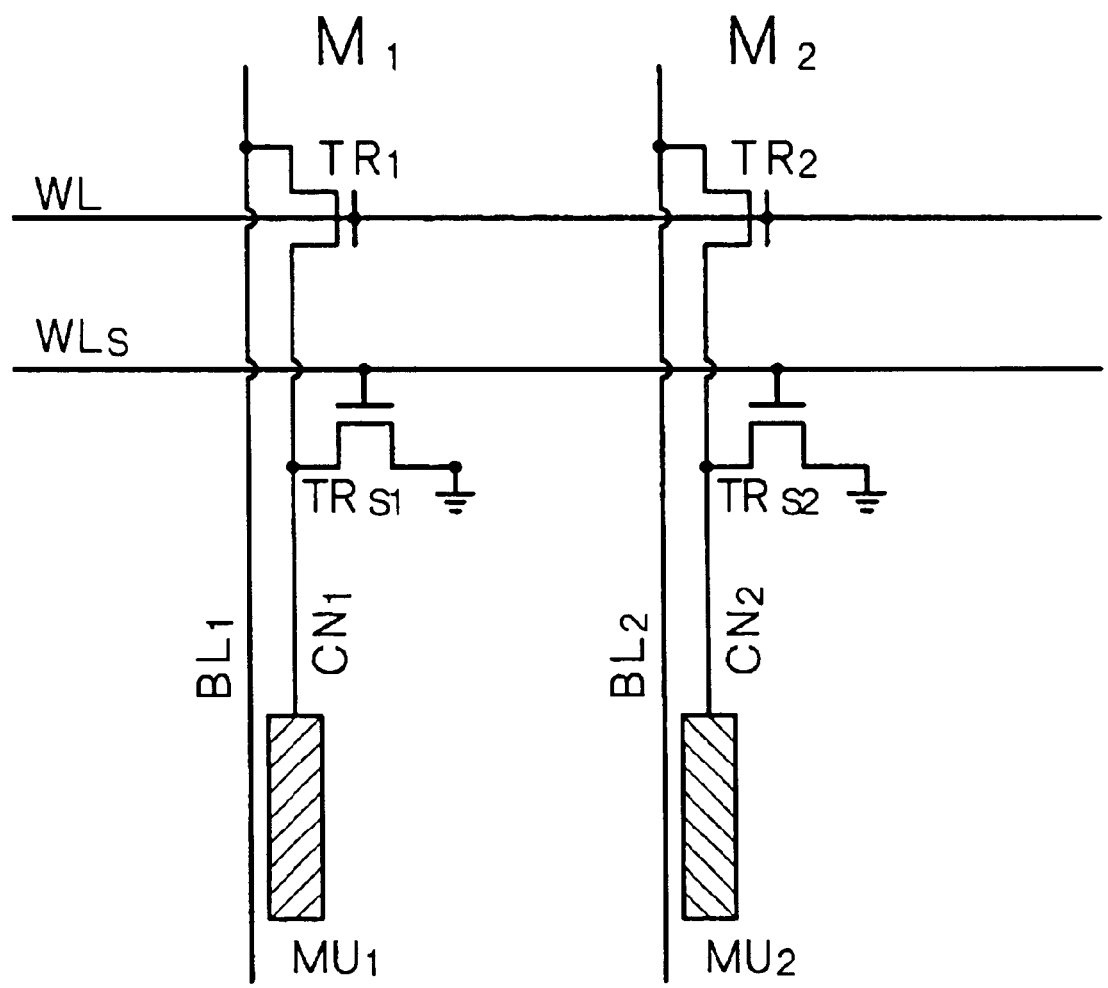
FIG. 14 is a conceptual circuit diagram of another variant of the ferroelectric-type nonvolatile semiconductor memory of Example 3.
Figure 15:
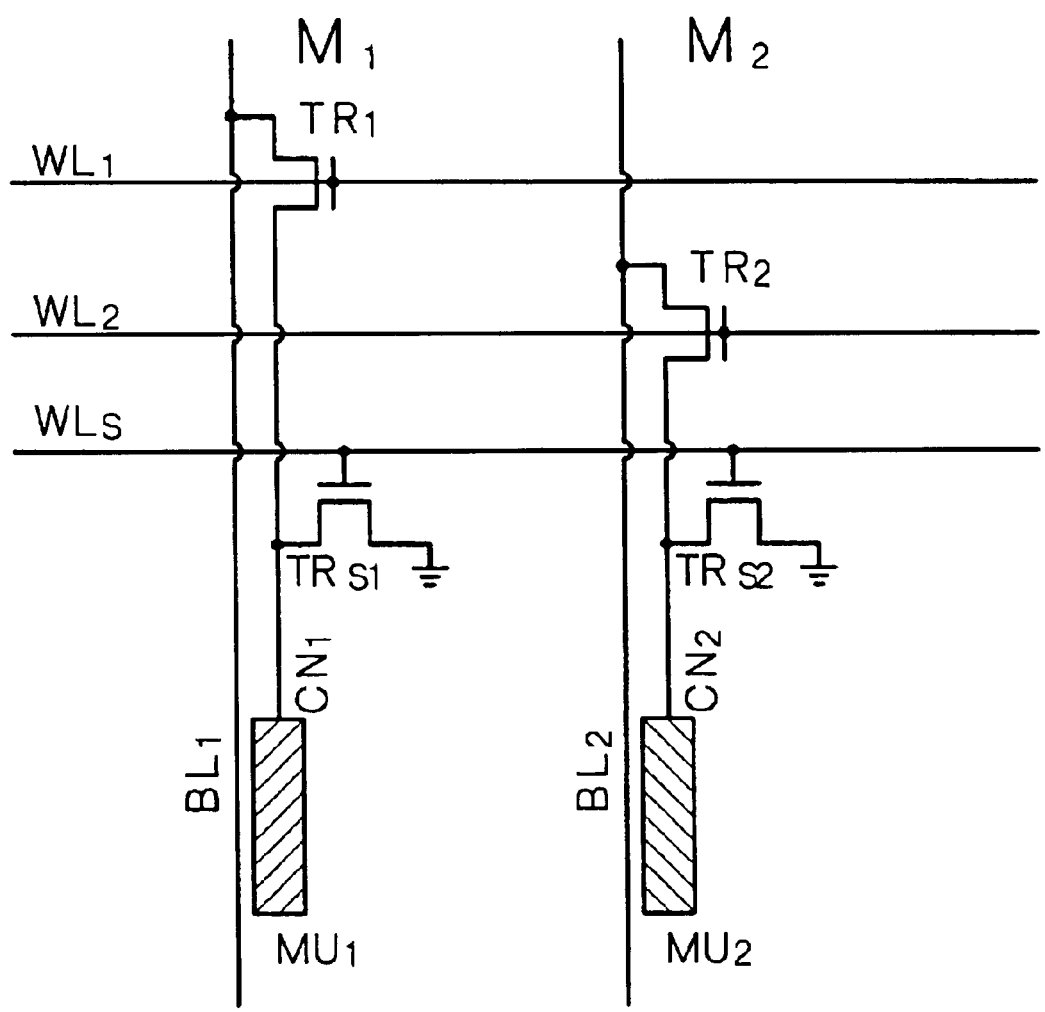
FIG. 15 is a conceptual circuit diagram of still another variant of the ferroelectric-type nonvolatile semiconductor memory of Example 3.
Figure 16:
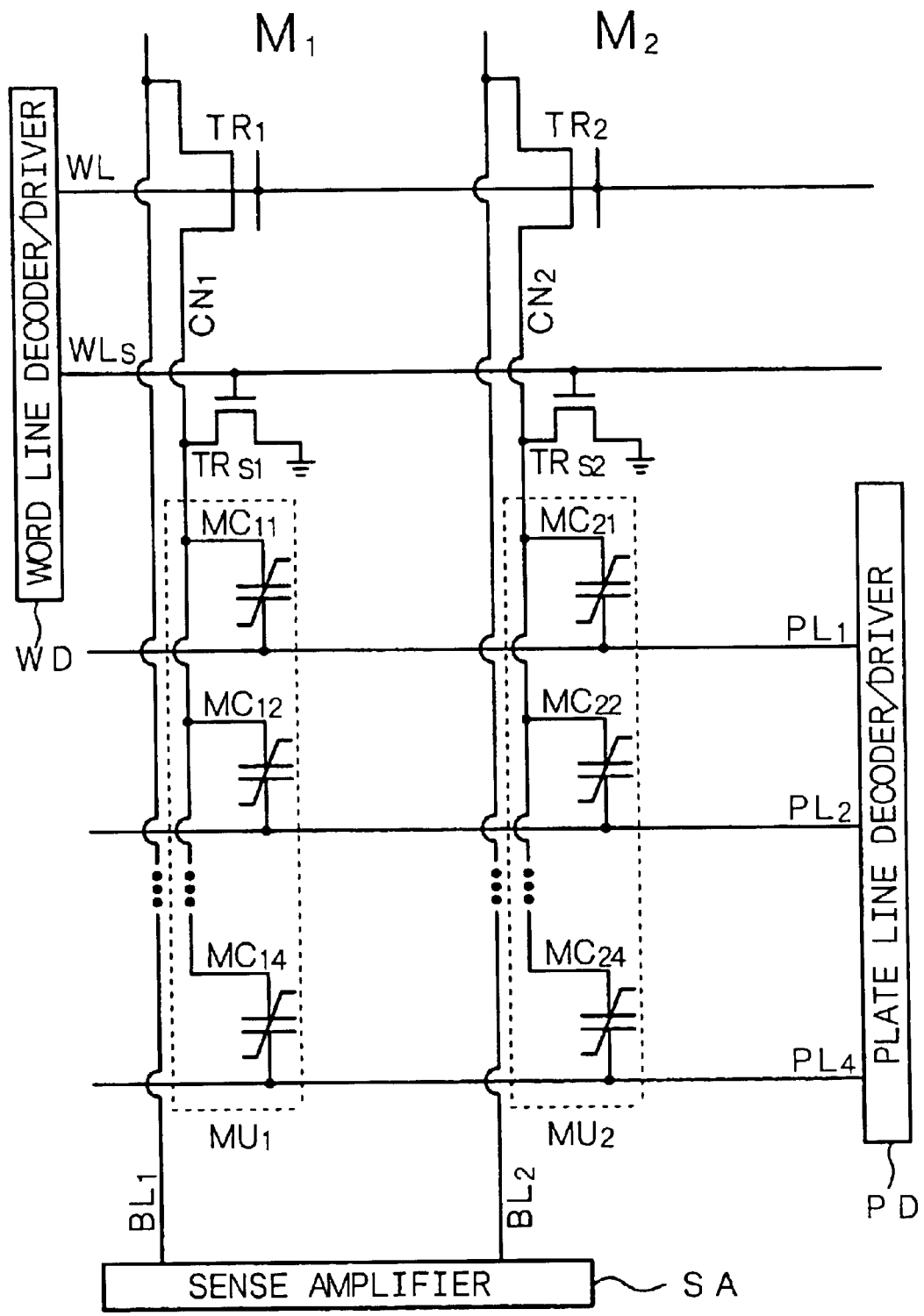
FIG. 16 is a more specific circuit diagram of the conceptual circuit diagram shown in FIG. 14.
Figure 17:
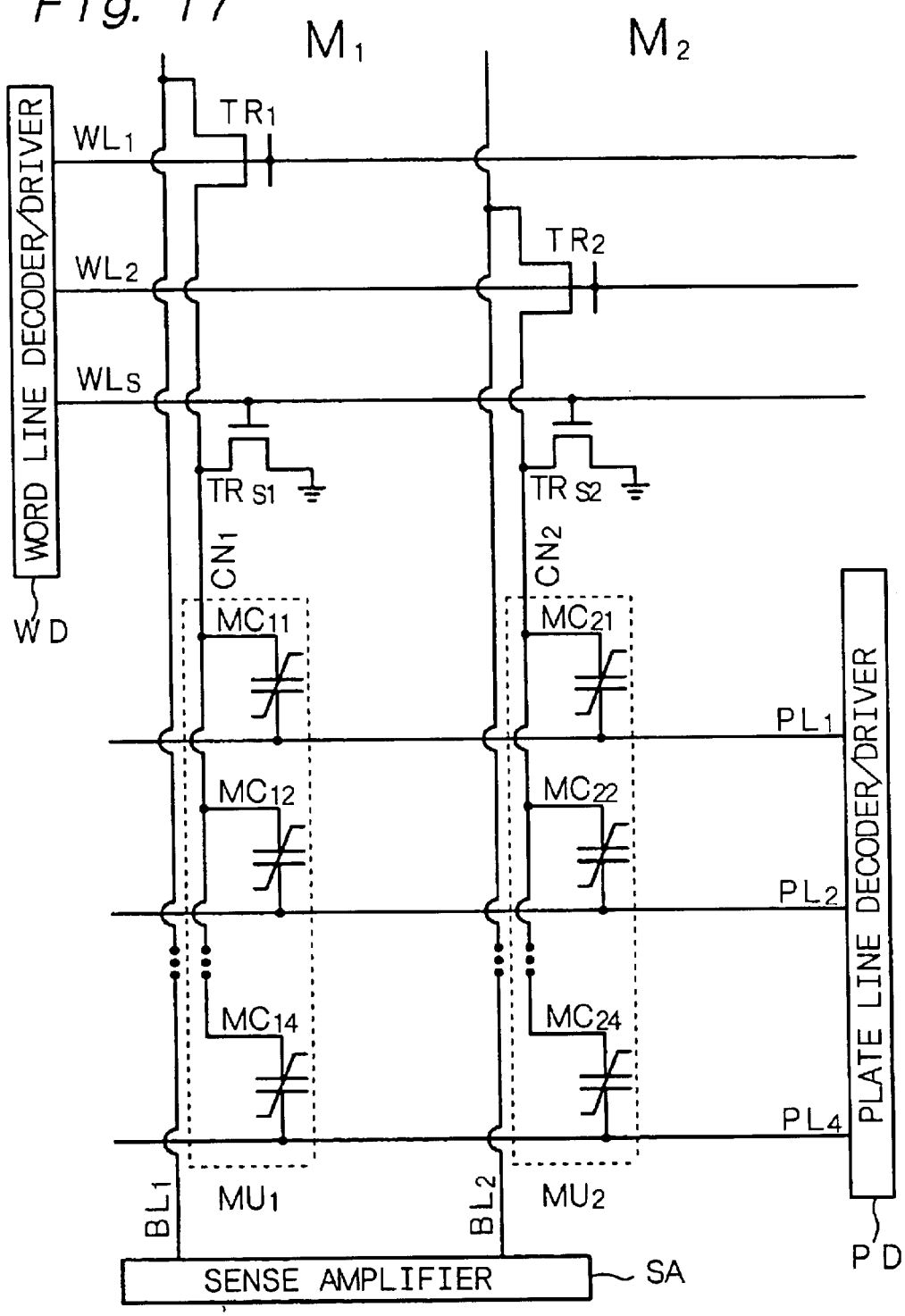
FIG. 17 is a more specific circuit diagram of the conceptual circuit diagram shown in FIG. 15.

Alternatively, memory cells $MC_{1M}$ constituting a nonvolatile memory $M_1$ having the same structure as that of the nonvolatile memory M explained in Example 1 and memory cells $MC_{2M}$ constituting a nonvolatile memory $M_2$ having the same structure as that of the nonvolatile memory $M_1$ and sharing plate lines $PL_M$ with the nonvolatile memory $M_1$ are stacked through an insulating layer (to be called "insulating interlayer 26" for convenience). FIG. 13 shows a schematic partial cross-sectional view of the two nonvolatile memories, taken by cutting the nonvolatile memories with an imaginary plane in parallel with the extending direction of a bit line. FIGS. 14 and 15 show conceptual circuit diagrams of the above nonvolatile memories, FIG. 16 shows a more specific circuit diagram of the conceptual circuit diagram shown in FIG. 14, and FIG. 17 shows a more specific circuit diagram of the conceptual circuit diagram shown in FIG. 15.

Figure 18:
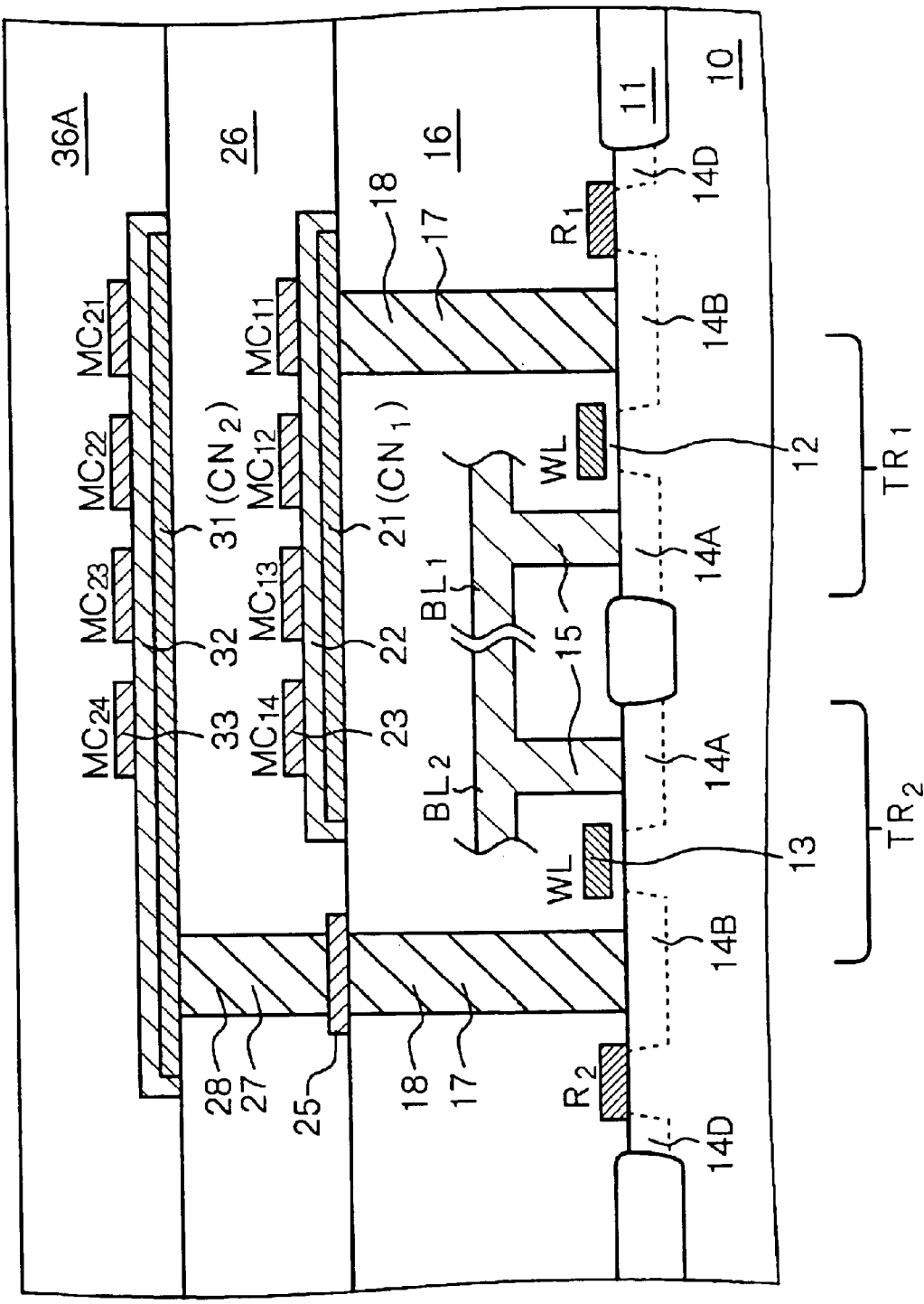
FIG. 18 is a schematic partial cross-sectional view of further still another variant of the ferroelectric-type nonvolatile semiconductor memory of Example 3, taken by cutting the variant with an imaginary perpendicular plane in parallel with the extending direction of a bit line.
Figure 19:
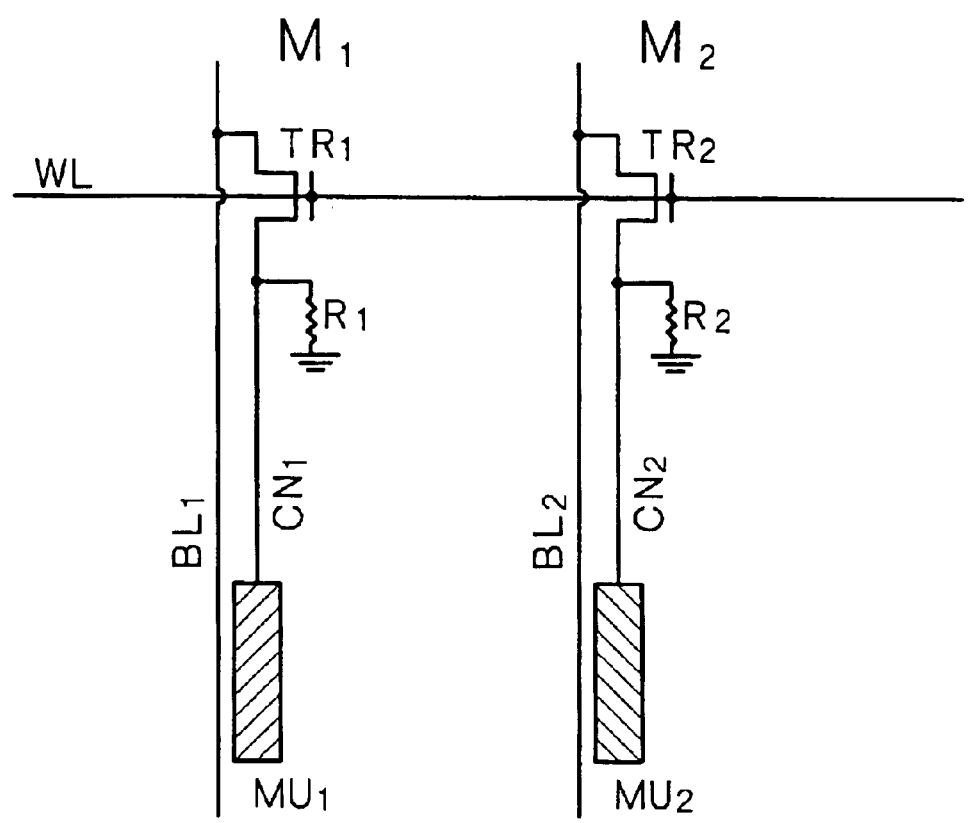
FIG. 19 is a conceptual circuit diagram of further still another variant of the ferroelectric-type nonvolatile semiconductor memory of Example 3.
Figure 20:
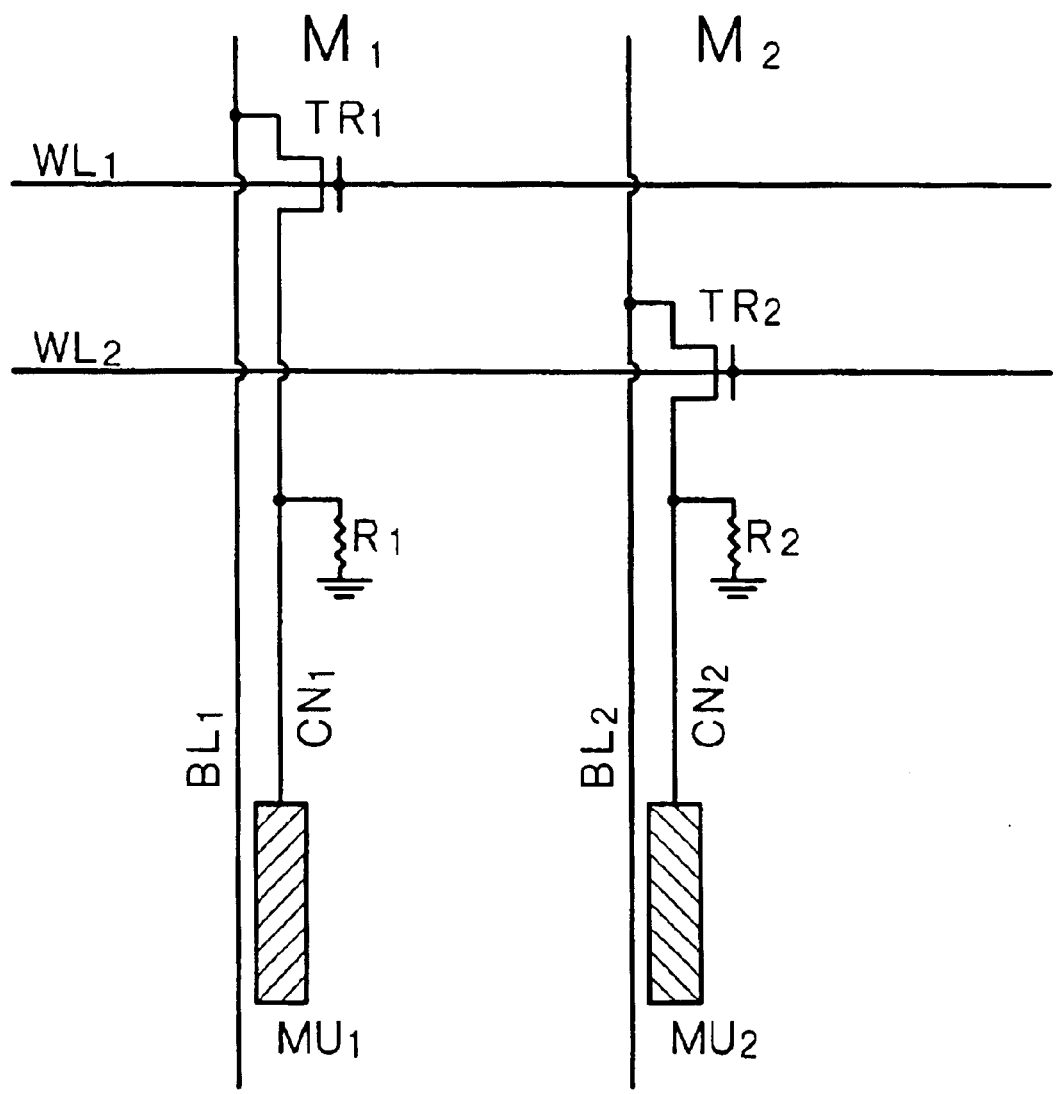
FIG. 20 is a conceptual circuit diagram of yet another variant of the ferroelectric-type nonvolatile semiconductor memory of Example 3.
Figure 21:
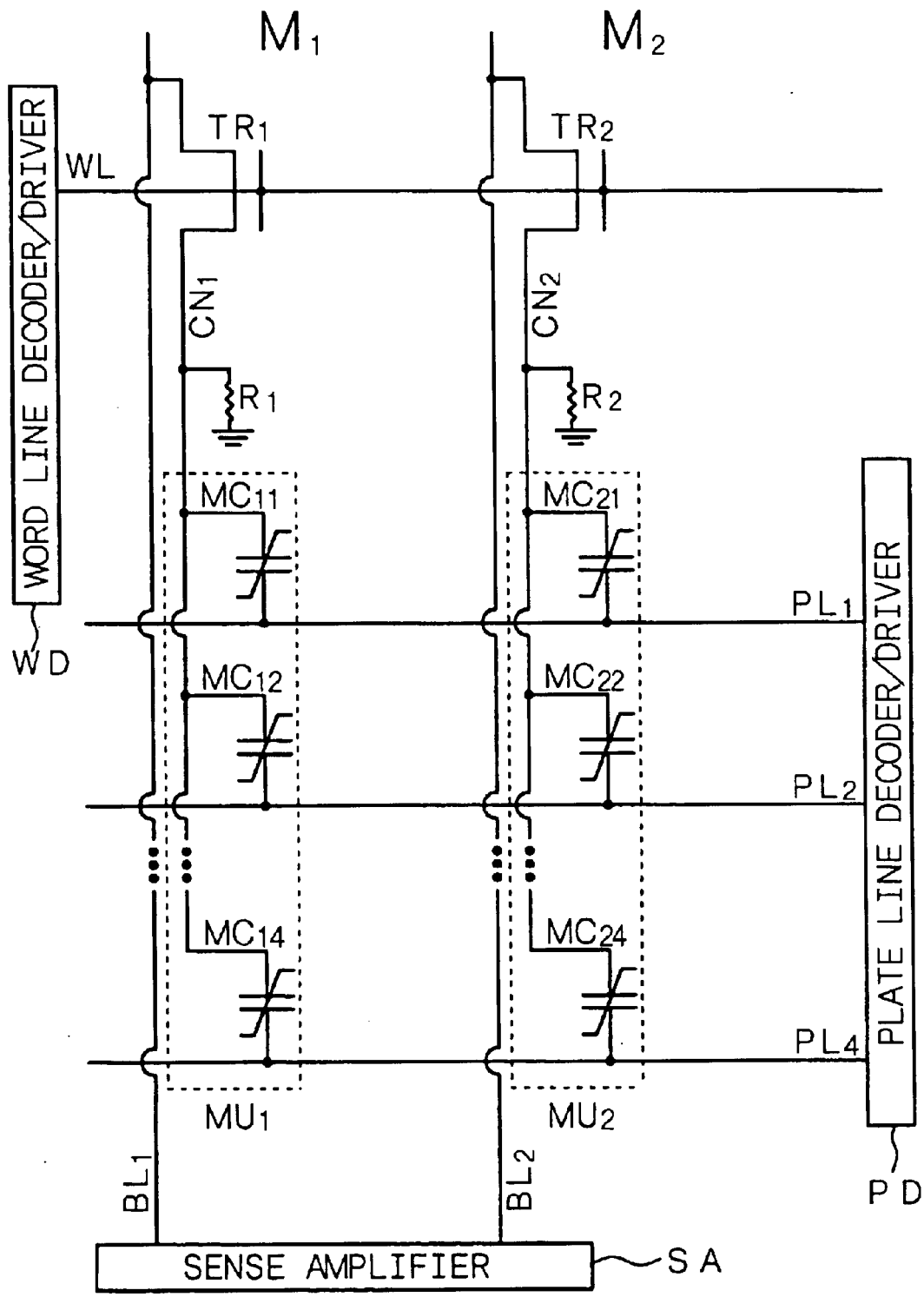
FIG. 21 is a more specific circuit diagram of the conceptual circuit diagram shown in FIG. 19.
Figure 22:
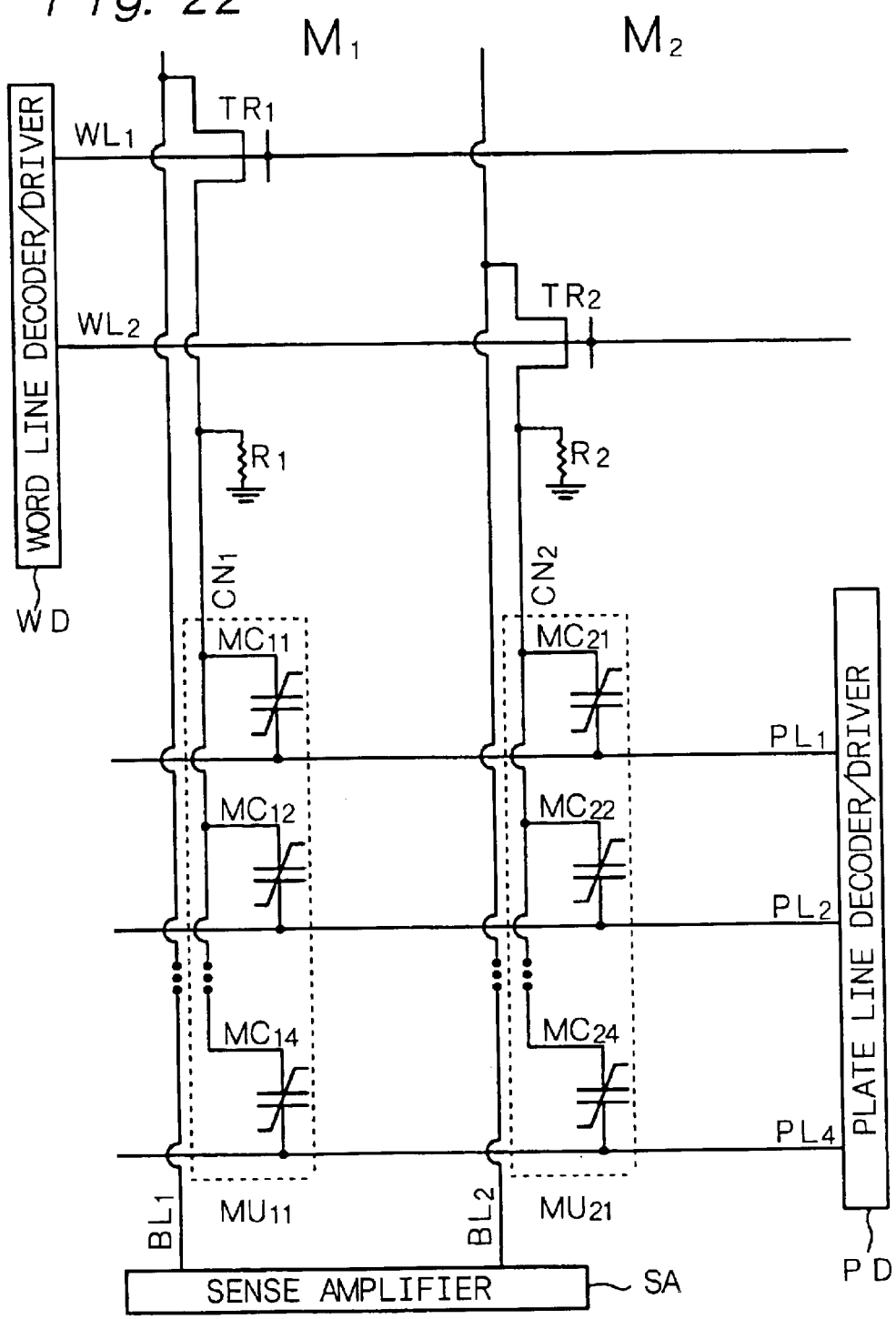
FIG. 22 is a more specific circuit diagram of the conceptual circuit diagram shown in FIG. 20.

Alternatively, memory cells $MC_{1M}$ constituting a nonvolatile memory $M_1$ having the same structure as that of the nonvolatile memory M explained in Example 2 and memory cells $MC_{2M}$ constituting a nonvolatile memory $M_2$ having the same structure as that of the nonvolatile memory $M_1$ and sharing plate lines $PL_M$ with the nonvolatile memory $M_1$ are stacked through an insulating layer (to be called "insulating interlayer 26" for convenience). FIG. 18 shows a schematic partial cross-sectional view of the two nonvolatile memories, taken by cutting the nonvolatile memories with an imaginary plane in parallel with the extending direction of a bit line. FIGS. 19 and 20 show conceptual circuit diagrams of the above nonvolatile memories, FIG. 21 shows a more specific circuit diagram of the conceptual circuit diagram shown in FIG. 19, and FIG. 22 shows a more specific circuit diagram of the conceptual circuit diagram shown in FIG. 20.

The memory cell $MC_{2M}$ constituting the nonvolatile memory $M_2$ positioned above the memory cell $MC_{1M}$ constituting the nonvolatile memory $M_1$ comprises a first electrode 31, a ferroelectric layer 32 and a second electrode 33. The first electrode 31 is connected to the other source/drain region 14B of a transistor for selection $TR_2$ through a contact hole 28 formed in an opening portion 27 made through the insulating interlayer 26, a pad portion 25 formed on an insulating layer 16 and a contact hole 18 formed in an opening portion 17 made through the insulating layer 16. Except for the above points, the nonvolatile memory $M_2$ is structurally the same as the nonvolatile memory M explained in Example 1 or 2, so that the detailed explanation thereof will be omitted. The plate line $PL_m$ constituting the memory cell $MC_{1m}$ and the plate line $PL_m$ constituting the memory cell $MC_{2m}$ are connected to each other in a region that is not shown.

In the nonvolatile memories $M_1$ and $M_2$ whose circuit diagrams are shown in FIGS. 14 and 16 and FIGS. 19 and 21, the transistors for selection $TR_1$ and $TR_2$ constituting the nonvolatile memories $M_1$ and $M_2$ are connected to the same word line WL. And, complementary data is stored in a pair of the memory cells $MC_{1m}$ and $MC_{2m}$ (m=1, 2 . . . , M). When data stored, for example, in the memory cells $MC_{1m}$ and $MC_{2m}$ (m=any one of 1, 2, 3 and 4) is read out, the word line WL is selected, and a voltage, for example, of (½) $V_{cc}$ is applied to the plate lines $PL_j$ (m≠j). In this state, the plate line $PL_m$ is driven. The above $V_{cc}$ is, for example, a power source voltage. In this manner, the complementary data appears, as voltages (bit line potentials), on a pair of the bit lines $BL_1$ and $BL_2$ from a pair of the memory cells $MC_{1m}$ and $MC_{2m}$ through the transistors for selection $TR_1$ and $TR_2$. And, the voltages (bit line potentials) on the pair of the bit lines $BL_1$ and $BL_2$ are detected with a sense amplifier SA.

There may be employed a constitution in which the transistors for selection $TR_1$ and $TR_2$ constituting the nonvolatile memories $M_1$ and $M_2$ are connected to different word lines $WL_1$ and $WL_2$, the memory cells $MC_{1m}$ and $MC_{2m}$ are independently controlled, and a reference voltage is applied to one of the bit lines $BL_1$ and $BL_2$, whereby data can be read out from each of the memory cells $MC_{1m}$ and $MC_{2m}$. For circuit diagrams when the above constitution is employed, see FIGS. 15 and 17 and FIGS. 20 and 22. When transistors for selection $TR_1$ and $TR_2$ are simultaneously driven, circuits for such are equivalent to the circuits shown in FIGS. 14 and 16 and FIGS. 19 and 21.

As described above, 1 bit as data is stored in each of the memory cells $MC_{1m}$ and $MC_{2m}$ (m=1, 2, 3, 4) (see FIGS. 15 and 17 and FIGS. 20 and 22), or the complementary data as 1 bit is stored in a pair of the memory cells $MC_{1nm}$ and $MC_{2nm}$ (see FIGS. 14 and 16 and FIGS. 19 and 21). In an actual nonvolatile memory, sets of the above memory units for storing 8 bits or 4 bits each are arranged as access units in the form of an array. And, data is written into, or data is read out from and re-written into, a plurality of access units (memory block) sharing the word line WL ($WL_1$, $WL_2$) of the transistor for selection and the plate lines $PL_M$, in the block (or altogether). That is, in the memory block, all of the nonvolatile memories are brought into an operating state altogether and consecutively, or brought into a non-operating (standby) state altogether.

The value of M is not limited to 4. The value of M may be any number so long as it satisfies M≧2, and examples of the value of M practically include exponent numbers of 2 (2, 4, 8, 16 . . . ). Further, the value of N may be any number so long as it satisfies N≧2, and examples of the value of N practically include exponent numbers of 2 (2, 4, 8, . . . ).

EXAMPLE 4

Figure 23:
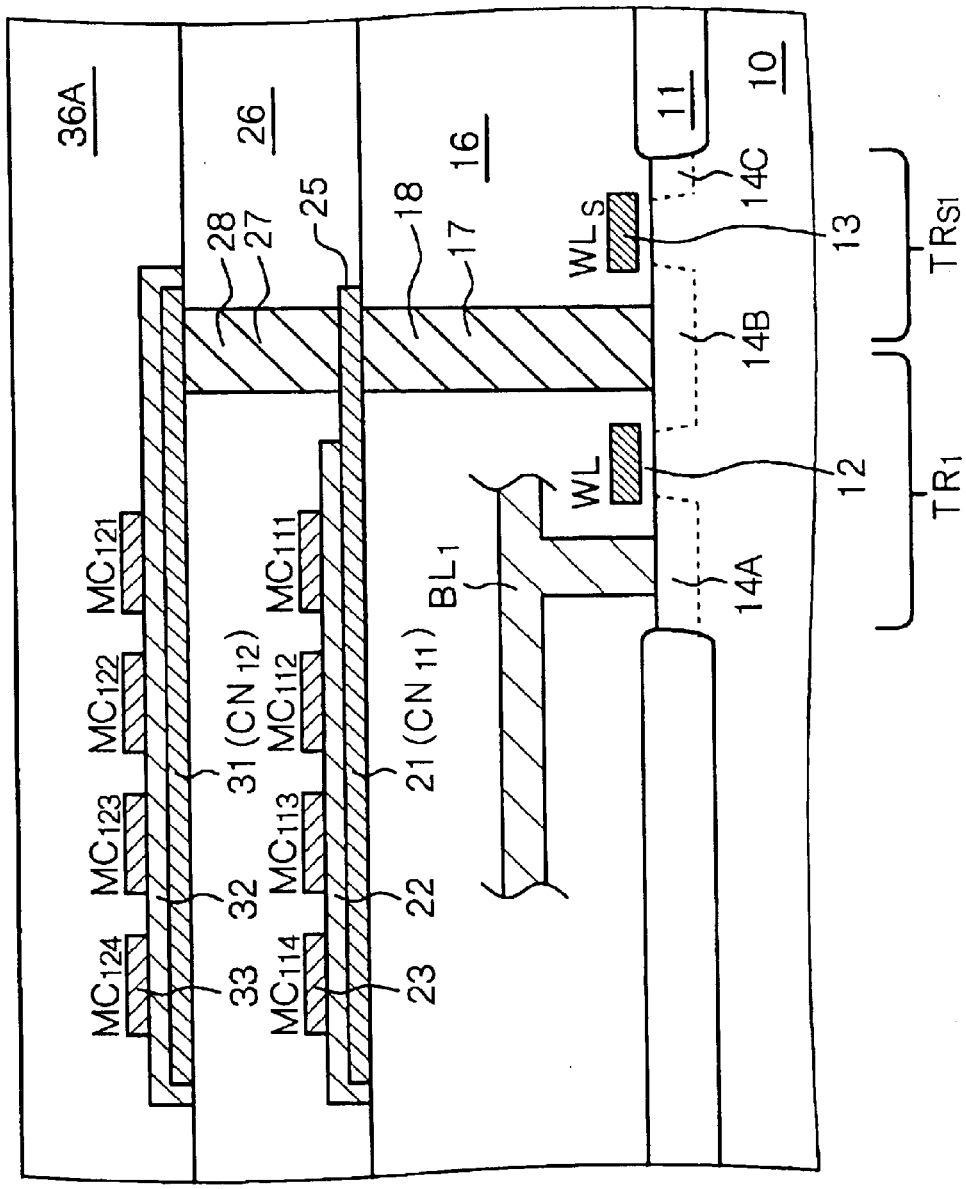
FIG. 23 is a schematic partial cross-sectional view of a ferroelectric-type nonvolatile semiconductor memory of Example 4, taken by cutting the ferroelectric-type nonvolatile semiconductor memory with an imaginary perpendicular plane in parallel with the extending direction of a bit line.
Figure 24A:
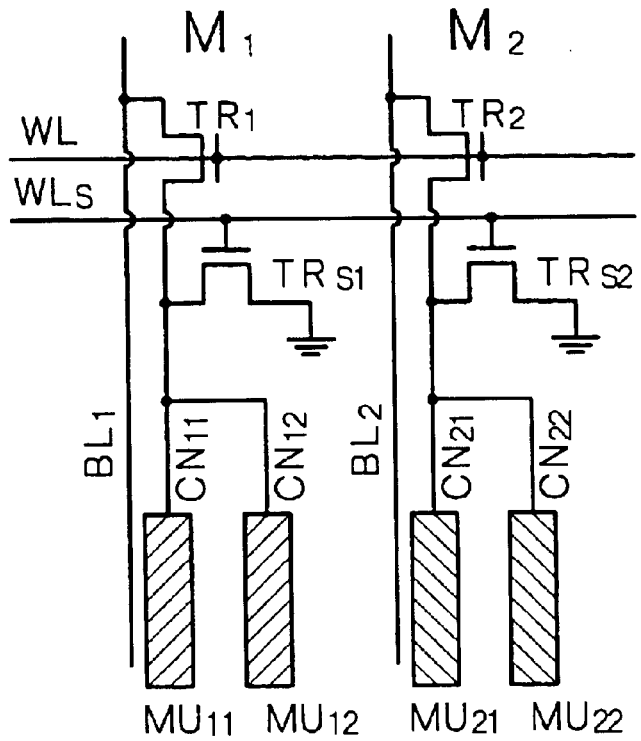
FIGS. 24A and 24B are conceptual circuit diagrams of the ferroelectric-type nonvolatile semiconductor memory of Example 4.
Figure 24B:
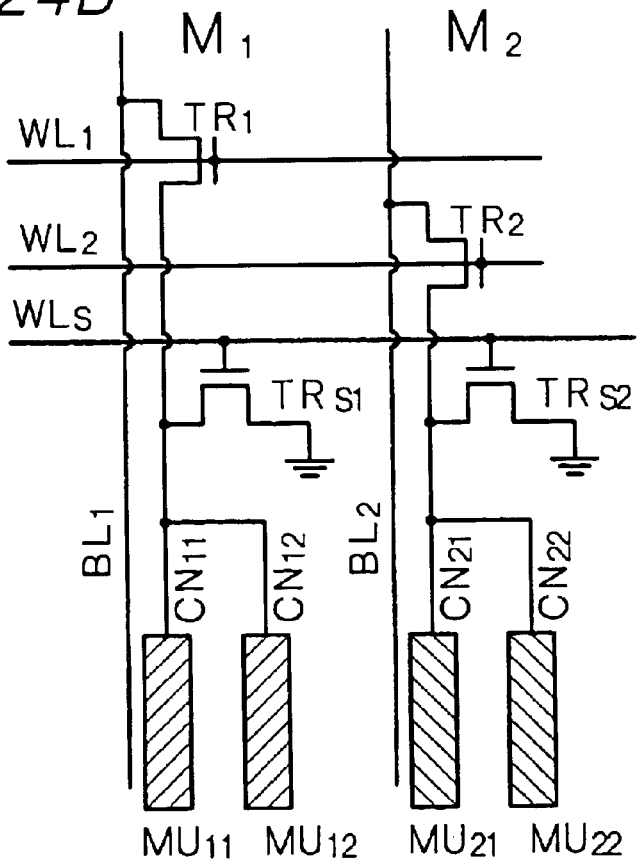
Figure 25:
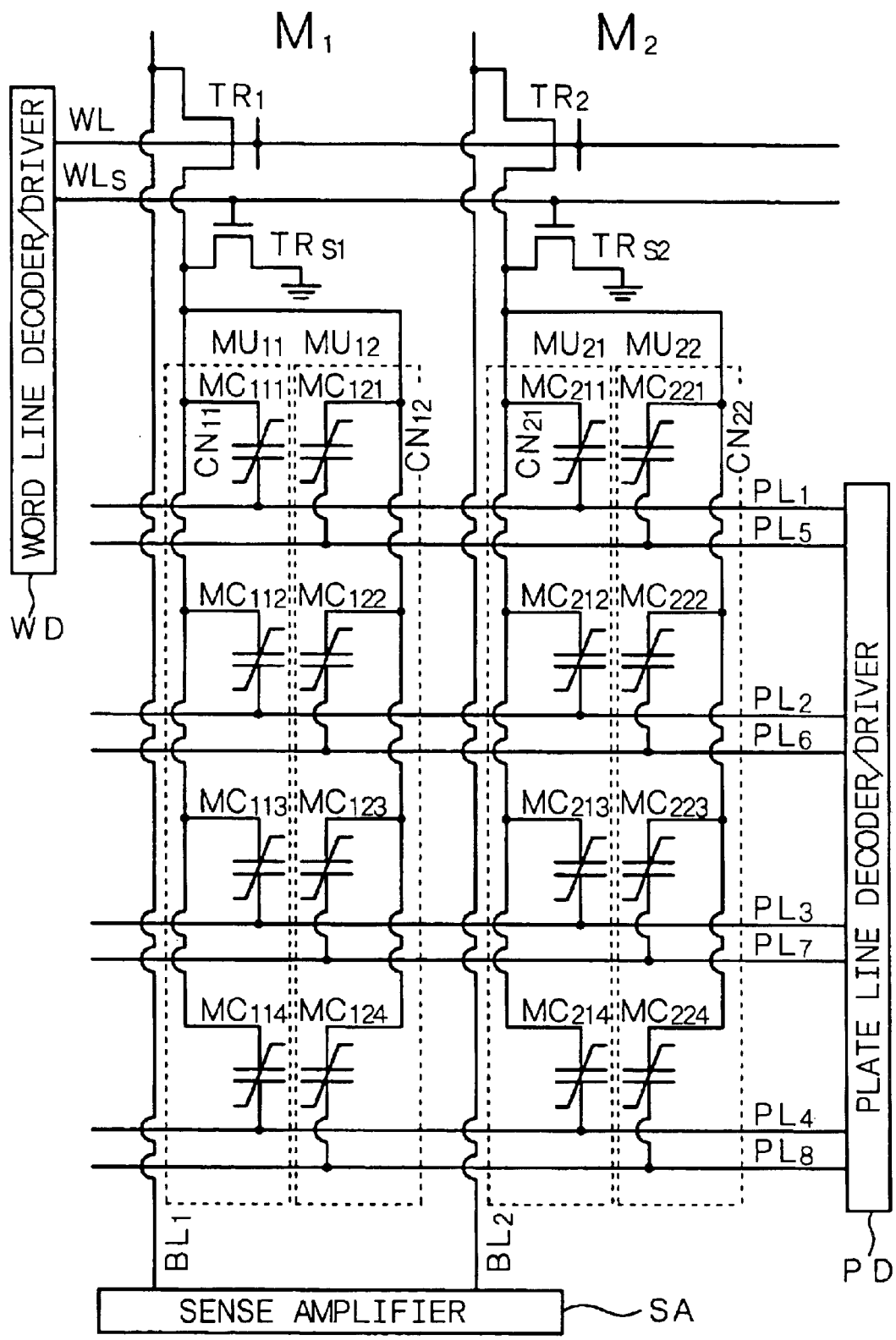
FIG. 25 is a more specific circuit diagram of the conceptual circuit diagram shown in FIG. 24A.
Figure 26:
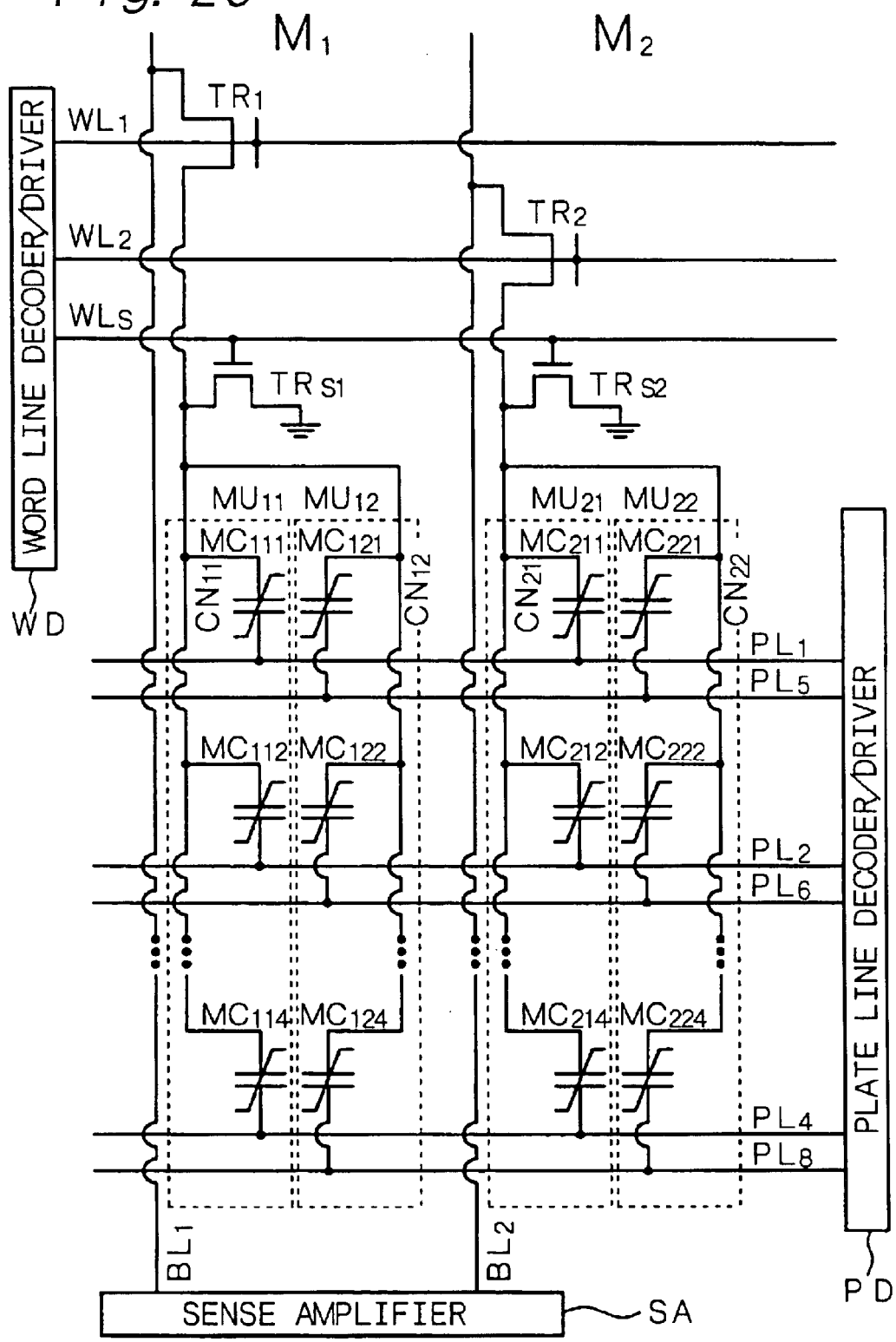
FIG. 26 is a more specific circuit diagram of the conceptual circuit diagram shown in FIG. 24B.

Example 4 is concerned with the second aspect (more specifically, second-A aspect) of the present invention. FIG. 23 shows a schematic partial cross-sectional view of a nonvolatile memory of Example 4, taken by cutting the nonvolatile memory with an imaginary line in parallel with the extending direction of a bit line. Further, FIGS. 24A and 24B show conceptual circuit diagrams of the nonvolatile memory of Example 4, FIG. 25 shows a more specific circuit diagram of the conceptual circuit diagram shown in FIG. 24A, and FIG. 26 shows a more specific circuit diagram of the conceptual circuit diagram shown in FIG. 24B. While FIGS. 24A and 24B, FIG. 25 and FIG. 26 show two nonvolatile memories $M_1$ and $M_2$, these nonvolatile memories $M_1$ and $M_2$ are structurally the same, and the nonvolatile memory $M_1$ will be explained below.

The nonvolatile memory $M_1$ in Example 4 comprises;

(A) a bit line $BL_1$, (B) a transistor for selection $TR_1$, (C) memory units $MU_{1N}$ that are N in number (N≧2, and N=2 in Example 4), each memory unit being composed of memory cells $MC_{1NM}$ that are M in number (M≧2, and M=4 in Example 4), and (D) plate lines are M×N in number.

The memory units $MU_{1N}$ that are N in number are stacked through an insulating layer (to be called "insulating interlayer 26" for convenience hereinafter), and each memory cell comprises a first electrode 21 or 31, a ferroelectric layer 22 or 32, and a second electrode 23 or 33. In each memory unit $MU_{1n}$, the first electrodes 21 of the memory cells $MC_{1nM}$ are in common, and the common first electrode is connected to the bit line $BL_1$ through the transistor for selection $TR_1$. Specifically, in the memory unit $MU_{11}$, the first electrodes 21 of the memory cells $MC_{11M}$ are in common (the common first electrode will be referred to as "first common node $CN_{11}$"), and the common first electrode 21 (first common node $CN_{11}$) is connected to the bit line $BL_1$ through the transistor for selection $TR_1$. In the memory unit $MU_{12}$, further, the first electrodes 31 of the memory cells $MC_{12M}$ are in common (the common first electrode will be referred to as "second common node $CN_{12}$"), and the common first electrode 31 (second common node $CN_{12}$) is connected to the bit line $BL_1$ through the transistor for selection $TR_1$. Further, in the memory unit $MU_{1n}$ positioned as an n-th (n=1, 2 ..., N) layer, the second electrode 23 or 33 of the m-th-place (m=1, 2 ..., M) memory cell $MC_{1nm}$ is connected to the [(n−1)M+m]-th-place plate line $PL_{(n-1)M+m}$. The plate line $PL_{(n-1)M+m}$ is also connected to the second electrode 23 or 33 of each memory cell constituting the nonvolatile memory $M_2$. In Example 4, more specifically, each plate line is extending from the second electrode 23 or 33.

One source/drain region 14A of the transistor for selection $TR_1$ is connected to the bit line $BL_1$ through a contact hole 15, and the other source/drain region 14B of the transistor for selection $TR_1$ is connected to the common first electrode 21 (first common node $CN_{11}$) in the memory unit $MU_{11}$ of the first layer through a contact hole 18 formed through an insulating layer 16. Further, the other source/drain region 14B of the transistor for selection $TR_1$ is connected to the common first electrode 31 (second common node $CN_{12}$) in the memory unit $MU_{12}$ of the second layer through the contact hole 18 formed through the insulating layer 16 and a contact hole 28 formed through an insulating interlayer 26. In the drawings, reference numeral 36A indicates an insulation layer.

The bit line $BL_1$ is connected to a sense amplifier SA. Further, the plate line $PL_{(n-1)M+m}$ is connected to a plate line decoder/driver PD. A word line WL (or word line $WL_1$ and $WL_2$) is connected to a word line decoder/driver WD. The word line WL is extending in the direction perpendicular to the paper surface of FIG. 23. Further, the second electrode 23 of the memory cell $MC_{11m}$ constituting the nonvolatile memory $M_1$ is common to the second electrode of the memory cell $MC_{21m}$ constituting the nonvolatile memory $M_2$ that is adjacent to the nonvolatile memory $M_1$ in the direction perpendicular to the paper surface of FIG. 23, and works as the plate line $PL_{(n-1)M+m}$. Further, the second electrode 33 of the memory cell $MC_{12m}$ constituting the nonvolatile memory $M_1$ is common to the second electrode of the memory cell $MC_{22m}$ constituting the nonvolatile memory $M_2$ that is adjacent to the nonvolatile memory $M_1$ in the direction perpendicular to the paper surface of FIG. 23, and works as the plate line $PL_{(n-1)M+m}$. Further, the word line WL is common to the transistor for selection $TR_1$ constituting the nonvolatile memory $M_1$ and the transistor for selection $TR_2$ constituting the nonvolatile memory $M_2$ that is adjacent to the nonvolatile memory $M_1$ in the direction perpendicular to the paper surface of FIG. 23.

Further, the nonvolatile memory $M_1$ has a circuit for short-circuiting the plate lines that are M×N in number and the first electrode (first common node $CN_{11}$ and second common node $CN_{12}$). In other words, the nonvolatile memory $M_1$ has a transistor for switching $TR_{S1}$, which is for grounding the common first electrode (first common node $CN_{11}$ and second common node $CN_{12}$). Specifically, the short-circuiting circuit comprises the transistor for switching $TR_{S1}$ and transistors (not shown) that are provided in the plate line decoders/drivers PD and are provided for grounding the plate lines $PL_{(n-1)M+m}$. The word line $WL_S$ for controlling the operation of the transistor for switching $TR_{S1}$ is connected to the word line decoder/driver WD. The operation of the transistor for switching $TR_{S2}$, which constitutes the nonvolatile memory $M_2$ that is adjacent in the direction perpendicular to the paper surface of FIG. 23, is also controlled by the word line $WL_S$. One source/drain region of the transistor for switching $TR_{S1}$ is common to the other source/drain region 14B of the transistor for selection $TR_1$, and the other source/drain region 14C of the transistor for switching $TR_{S1}$ is connected to a grounding line (not shown).

In the nonvolatile memories $M_1$ and $M_2$ whose circuit diagrams are shown in FIG. 24A and FIG. 25, the transistors for selection $TR_1$ and $TR_2$ constituting the nonvolatile memories $M_1$ and $M_2$ are connected to the same word line WL. And, complementary data is stored in a pair of the memory cells $MC_{1nm}$ and $MC_{2nm}$ (n=1, 2 ..., N and m=1, 2 ... M). For example, when data stored in the memory cells $MC_{1nm}$ and $MC_{2nm}$ (m is one of 1, 2, 3 and 4) is read out, the word line WL is selected, and a voltage, for example, of (½) $V_{cc}$ is applied to the plate lines other than the plate line $PL_{(n-1)M+m}$. In this state, the plate line $PL_{(n-1)M+m}$ is driven. The above $V_{cc}$ is, for example, a power source voltage. In this manner, the complementary data appears, as voltages (bit line potentials), on a pair of the bit lines $BL_1$ and $BL_2$ from the memory cells $MC_{1nm}$ and $MC_{2nm}$. And, the voltages (bit line potentials) on the above pair of the bit lines $BL_1$ and $BL_2$ are detected with the sense amplifier SA.

The transistors for selection $TR_1$ and $TR_2$ constituting the nonvolatile memory $M_1$ and $M_2$ are connected to different word lines $WL_1$ and $WL_2$, the memory cells $MC_{1nm}$ and $MC_{2nm}$ are independently controlled, and a reference voltage is applied to one of the pair of the bit lines $BL_1$ and $BL_2$, whereby data can be read out from each of the memory cells $MC_{1nm}$ and $MC_{2nm}$. For circuit diagrams for employing the above constitution, see FIG. 24B and FIG. 26. When the transistors for selection $TR_1$ and $TR_2$ are simultaneously driven, a circuit for such is equivalent to the circuit shown in FIG. 24A and FIG. 25.

As described above, 1 bit as data is stored in each of the memory cells $MC_{1nm}$ and $MC_{2nm}$ (n=1, 2 and m=1, 2, 3, 4) (see FIG. 24B and FIG. 26), or the complementary data as 1 bit is stored in a pair of the memory cells $MC_{1m}$ and $MC_{2nm}$ (see FIG. 24A and FIG. 25). In an actual nonvolatile memory, sets of the above memory units for storing 8 bits or 4 bits each are arranged as access units in the form of an array. And, data is written into, or data is read out from and re-written into, a plurality of access units (memory block) sharing the word line WL ($WL_1$, $WL_2$) of the transistor for selection and the plate lines $PL_M$, in the block (or altogether). That is, in the memory block, all of the nonvolatile memories are brought into an operating state altogether and consecutively, or brought into a non-operating (standby) state altogether.

The value of M is not limited to 4. The value of M may be any number so long as it satisfies M≧2, and examples of the value of M practically include exponent numbers of 2 (2, 4, 8, 16 ... ). Further, the value of N may be any number so long as it satisfies N≧2, and examples of the value of N practically include exponent numbers of 2 (2, 4, 8, . . . ).

A pair of the transistors for selection $TR_1$ and $TR_2$ in a pair of the nonvolatile memories occupy a region surrounded by the word lines WL and a pair of the bit lines $BL_1$ and $BL_2$. Therefore, if the word lines and the bit lines are arranged at a smallest pitch, therefore, a pair of the transistors for selection $TR_1$ and $TR_2$ in a pair of the nonvolatile memories have a minimum area of $8F^2$. Since, however, a pair of the transistors for selection $TR_1$ and $TR_2$ are shared by M sets of pairs of the memory cells $MC_{11m}$, $MC_{12m}$, $MC_{21m}$ and $MC_{22m}$ (m=1, 2 . . . , M), the number of the transistors for selection $TR_1$ and $TR_2$ per bit can be decreased, and the layout of the word lines WL is moderate, so that the nonvolatile memory can be easily decreased in size. Further, with regard to the peripheral circuits, M bits can be selected with one word line decoder/driver WD and the plate line decoders/drivers PD that are M in number. When the above constitution is employed, therefore, the layout in which the cell area is close to $8F^2$ can be attained, and a chip size almost equal to a DRAM can be attained.

EXAMPLE 5

Figure 27:
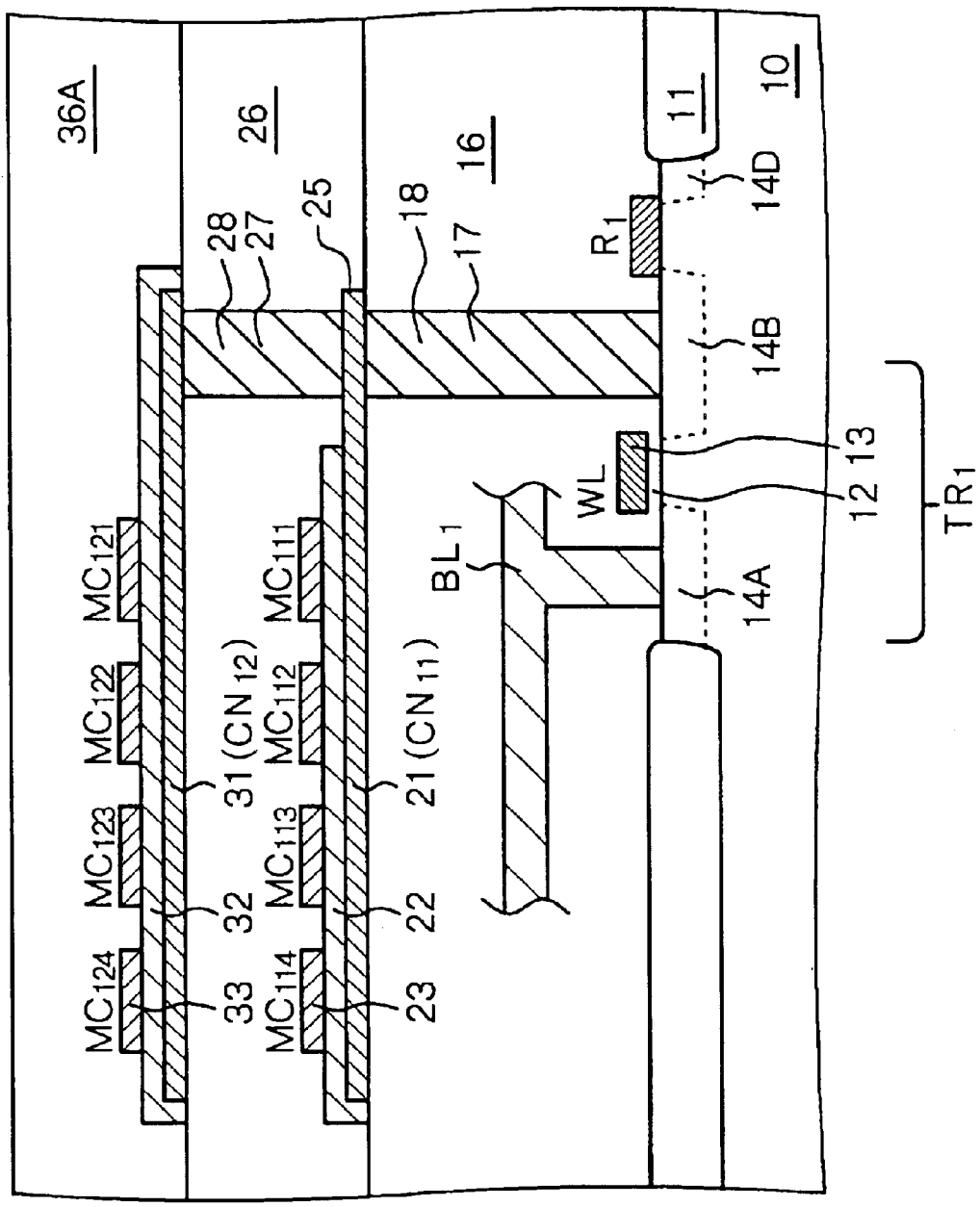
FIG. 27 is a schematic partial cross-sectional view of a ferroelectric-type nonvolatile semiconductor memory of Example 5, taken by cutting the ferroelectric-type nonvolatile semiconductor memory with an imaginary perpendicular plane in parallel with the extending direction of a bit line.
Figure 28A:
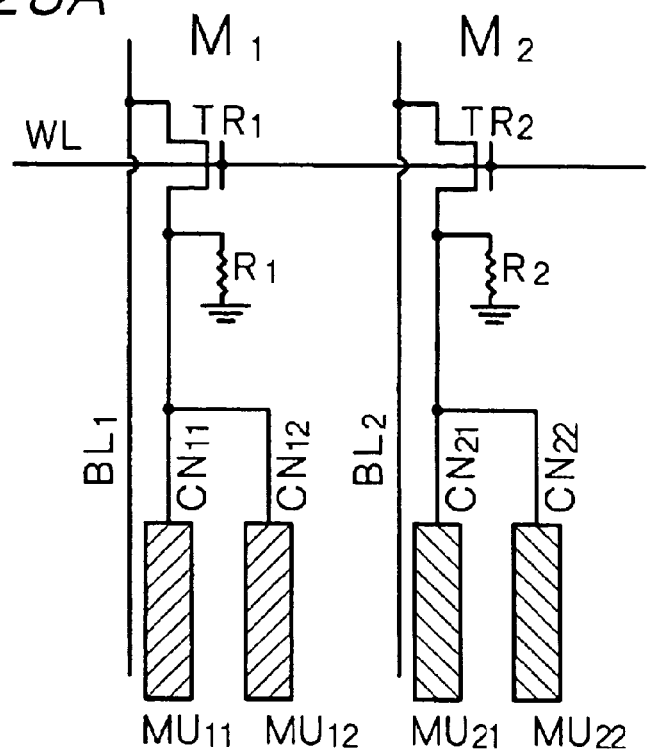
FIGS. 28A and 28B are conceptual circuit diagrams of the ferroelectric-type nonvolatile semiconductor memory of Example 5.
Figure 28B:
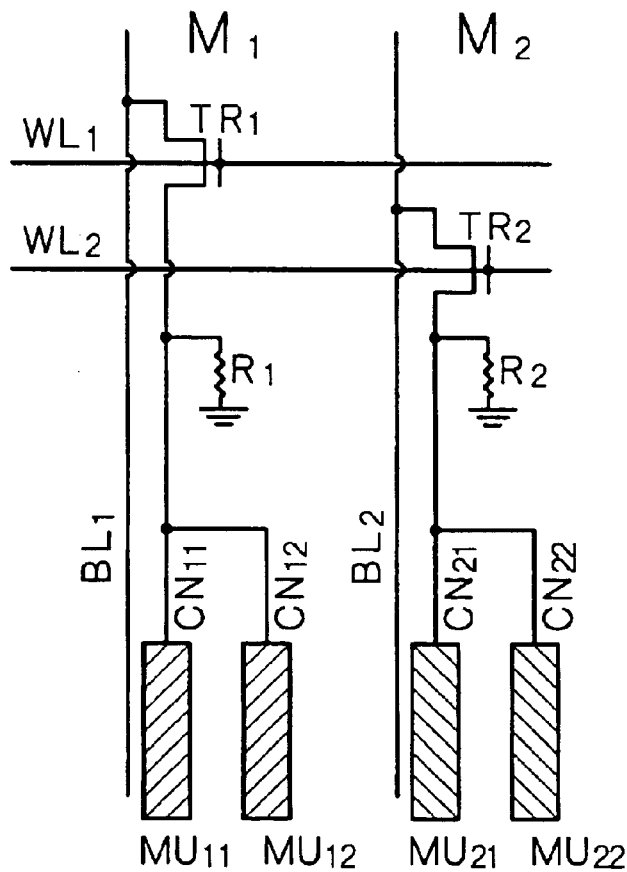
Figure 29:
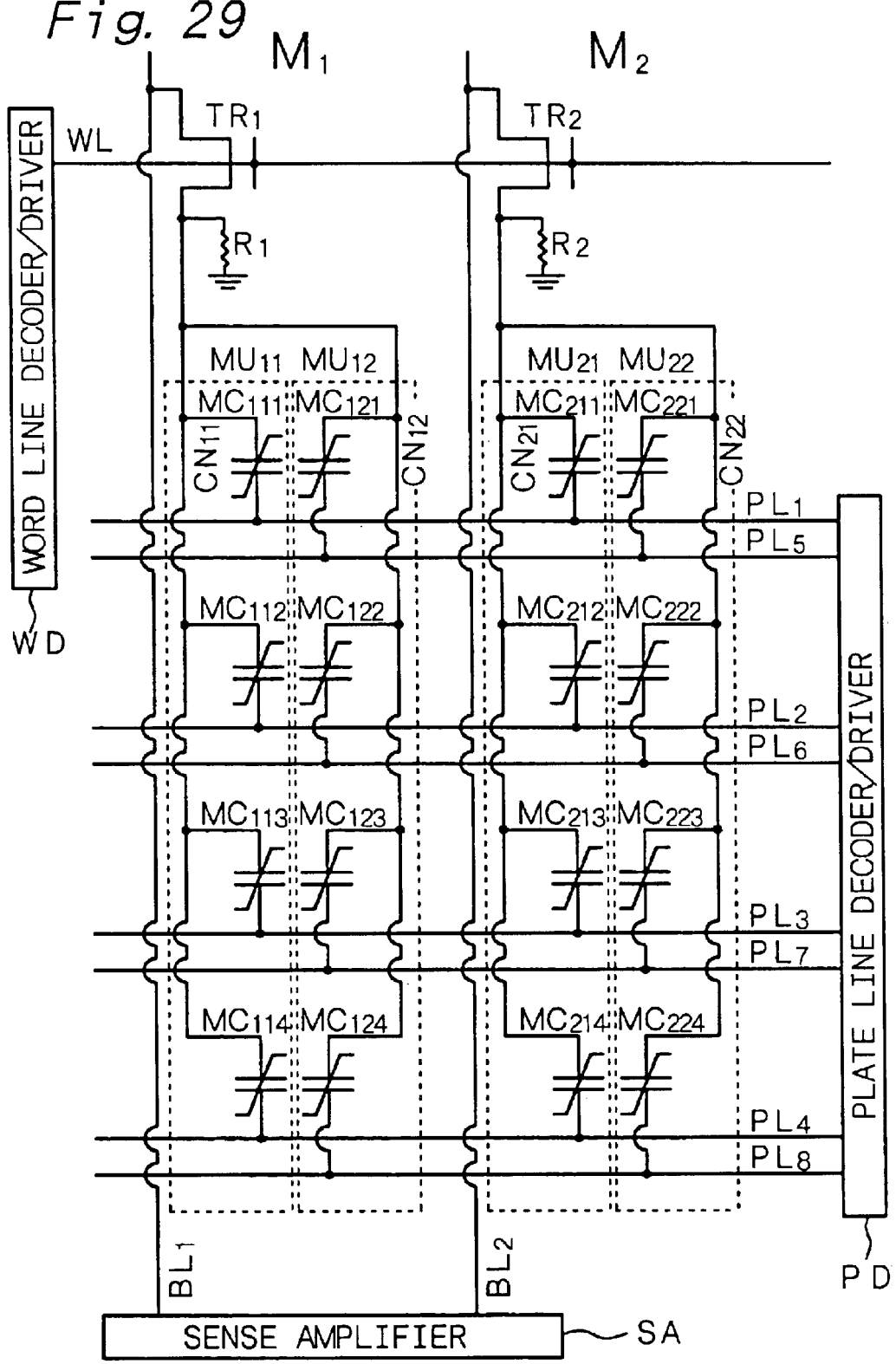
FIG. 29 is a more specific circuit diagram of the conceptual circuit diagram shown in FIG. 28A.
Figure 30:
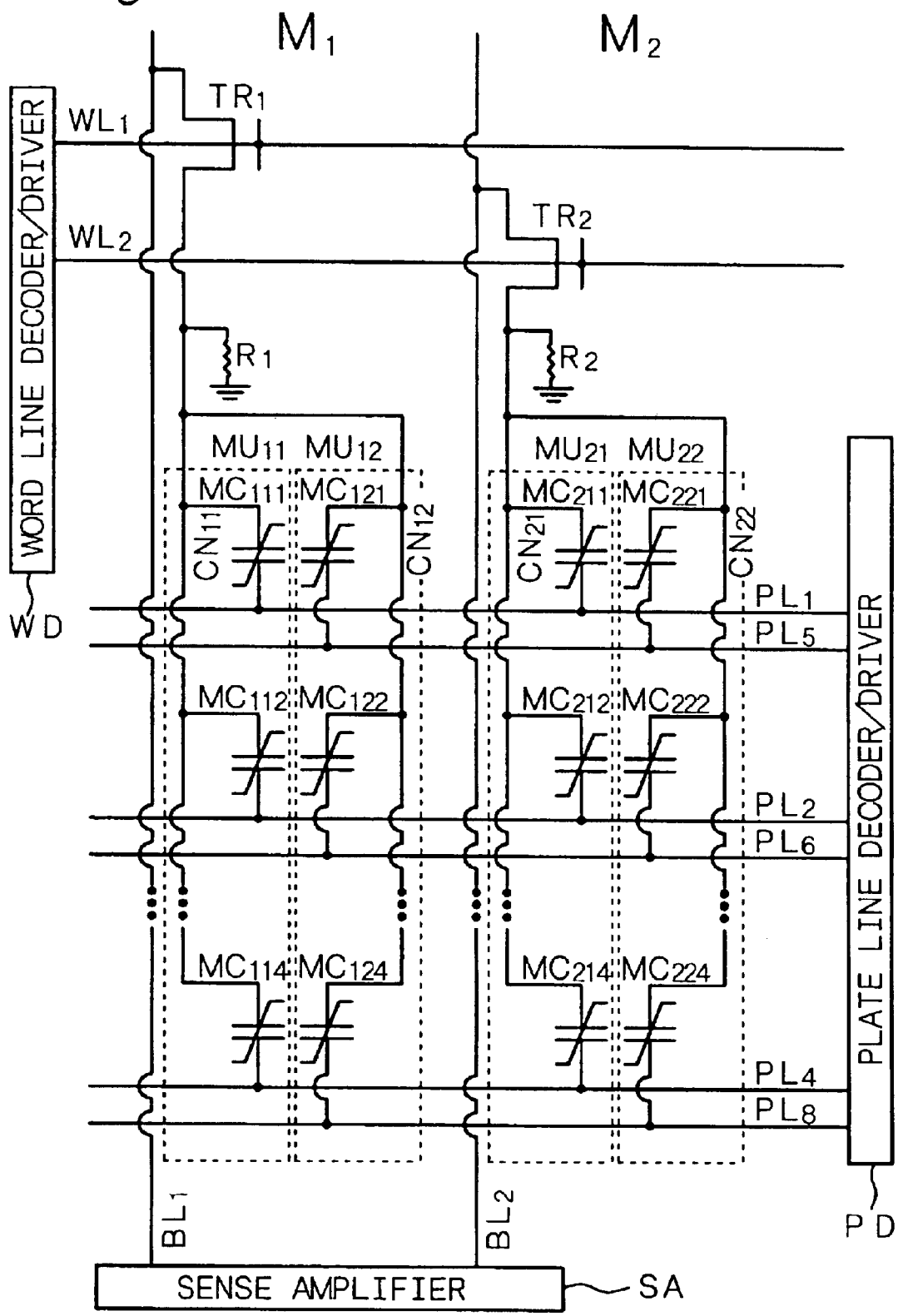
FIG. 30 is a more specific circuit diagram of the conceptual circuit diagram shown in FIG. 28B.

Example 5 is concerned with the nonvolatile memory according to the second aspect (more specifically, second-B aspect) of the present invention. FIG. 27 shows a schematic partial cross-sectional view of the nonvolatile memory of Example 5, take by cutting the nonvolatile memory with an imaginary plane in parallel with the extending direction of a bit line. Further, FIGS. 28A and 28B show conceptual circuit diagrams of the nonvolatile memory of Example 5, FIG. 29 shows a more specific circuit diagram of the conceptual circuit diagram shown in FIG. 28A, and FIG. 30 shows a more specific circuit diagram of the conceptual circuit diagram shown in FIG. 28B. While FIGS. 28A and 28B, FIG. 29 and FIG. 30 show two nonvolatile memories $M_1$ and $M_2$, these nonvolatile memories $M_1$ and $M_2$ are structurally the same, and the nonvolatile memory $M_1$ will be explained below.

The nonvolatile memory $M_1$ has the same structure as that of the nonvolatile memory of Example 4 except that a high-resistance element $R_1$ for grounding the common first electrode (common node $CN_{11}$ and $CN_{12}$) is provided in place of the transistor for switching $TR_{S1}$ for grounding common first electrode (common node $CN_{11}$ and $CN_{12}$), so that the detailed explanation thereof will be omitted. The high-resistance element $R_1$ is formed of a polysilicon layer having a resistance value of $1 \times 10^6 \Omega$ (1 MΩ) to $1 \times 10^{12} \Omega$ (1 TΩ). The high-resistance element $R_1$ and transistors (not shown) that are provided in the plate line decoders/drivers PD and are provided for grounding the plate lines $PL_{(n-1)M+m}$ constitute a circuit for short-circuiting the plate lines that are M×N in number and the common first electrode (common node $CN_{11}$ and $CN_{12}$).

The high-resistance element $R_1$ can be formed on the semiconductor substrate 10 when the MOS type transistor is formed in [Step-100]. One end of the high-resistance element $R_1$ is connected to the other source/drain region 14B of the transistor for selection $TR_1$. Further, the other end of the high-resistance element $R_1$ is connected to a grounding line 14D.

The nonvolatile memory whose circuit diagrams are shown in FIGS. 28A and FIG. 29 can be operated like the nonvolatile memory whose circuit diagrams are shown in FIG. 24A and FIG. 25, and the nonvolatile memory whose circuit diagrams are shown in FIG. 28B and FIG. 30 can be operated like the nonvolatile memory whose circuit diagrams are shown in FIG. 24B and FIG. 26, so that the detailed explanation thereof is omitted.

EXAMPLE 6

Figure 31:
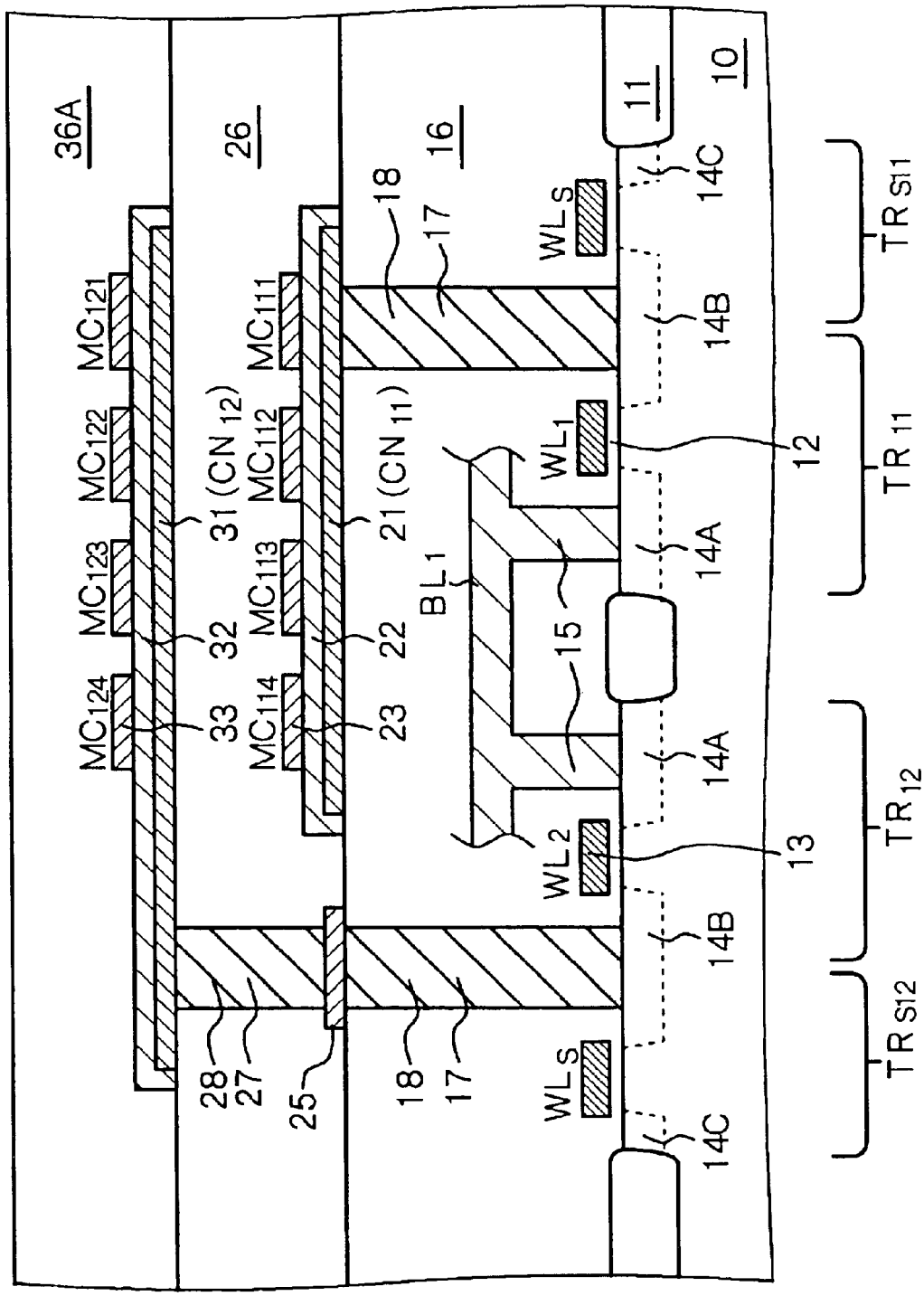
FIG. 31 is a schematic partial cross-sectional view of a ferroelectric-type nonvolatile semiconductor memory of Example 6, taken by cutting the ferroelectric-type nonvolatile semiconductor memory with an imaginary perpendicular plane in parallel with the extending direction of a bit line.
Figure 32:
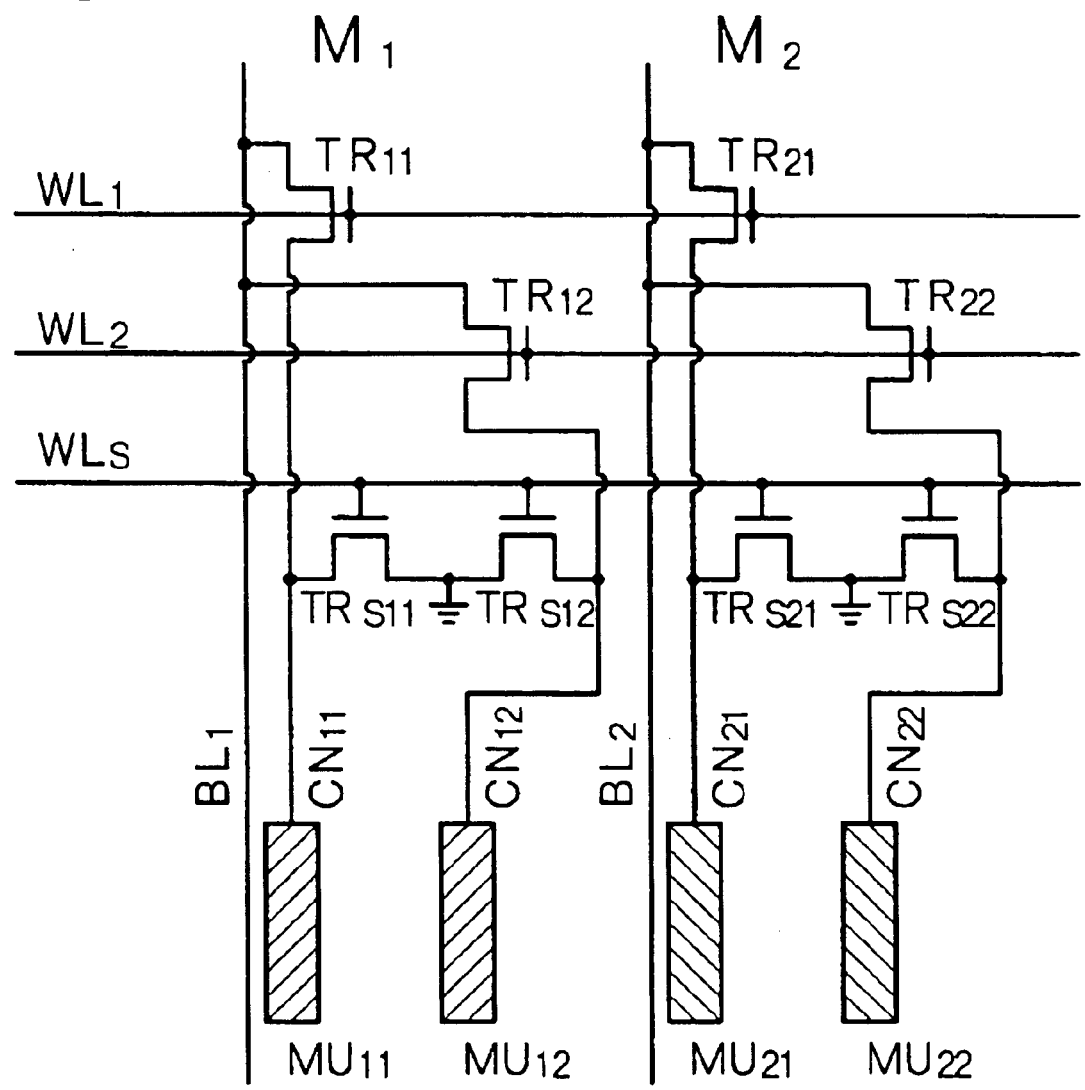
FIG. 32 is a conceptual circuit diagram of the ferroelectric-type nonvolatile semiconductor memory of Example 6.
Figure 33:
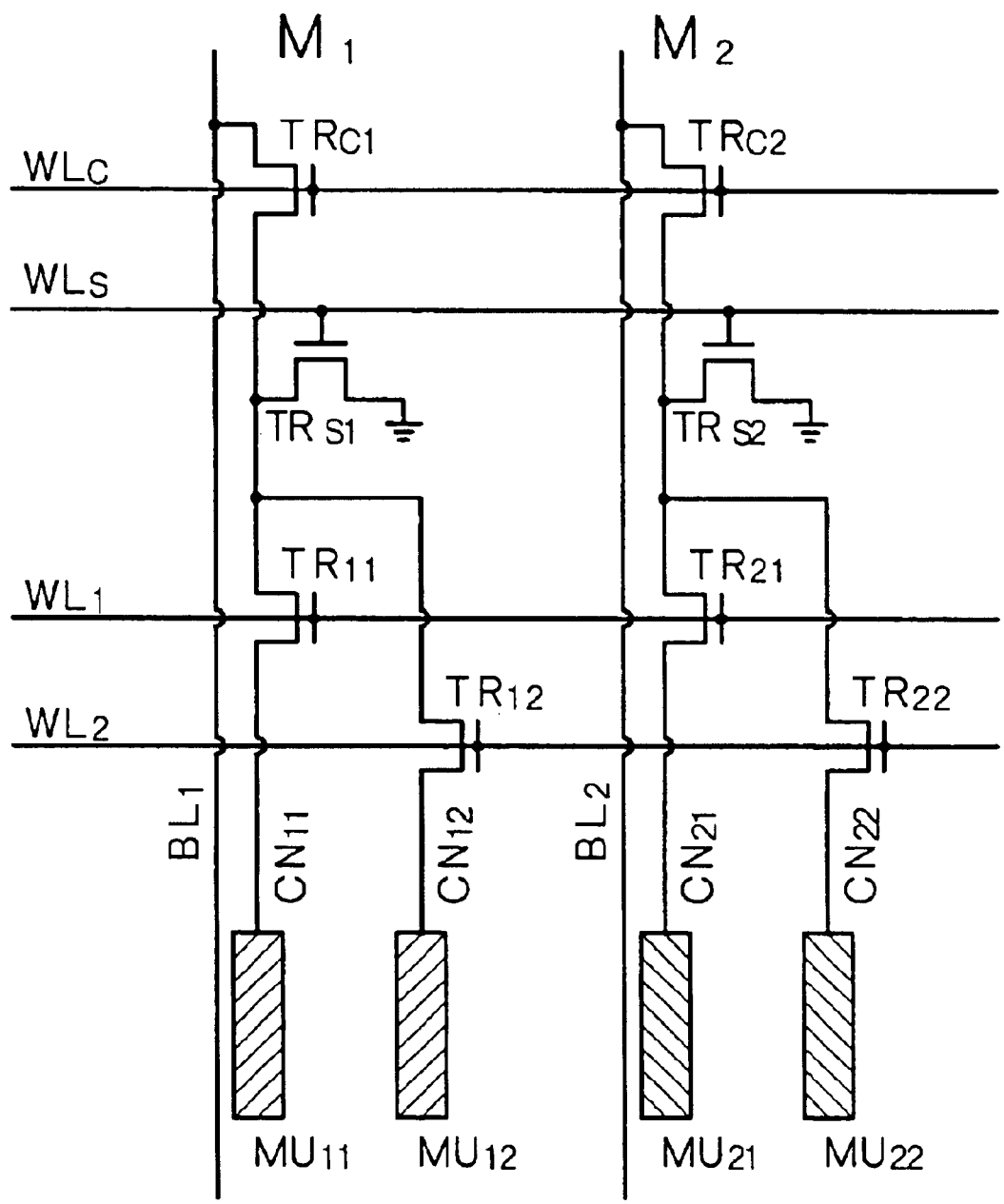
FIG. 33 is a conceptual circuit diagram of a variant of the ferroelectric-type nonvolatile semiconductor memory of Example 6.
Figure 34:
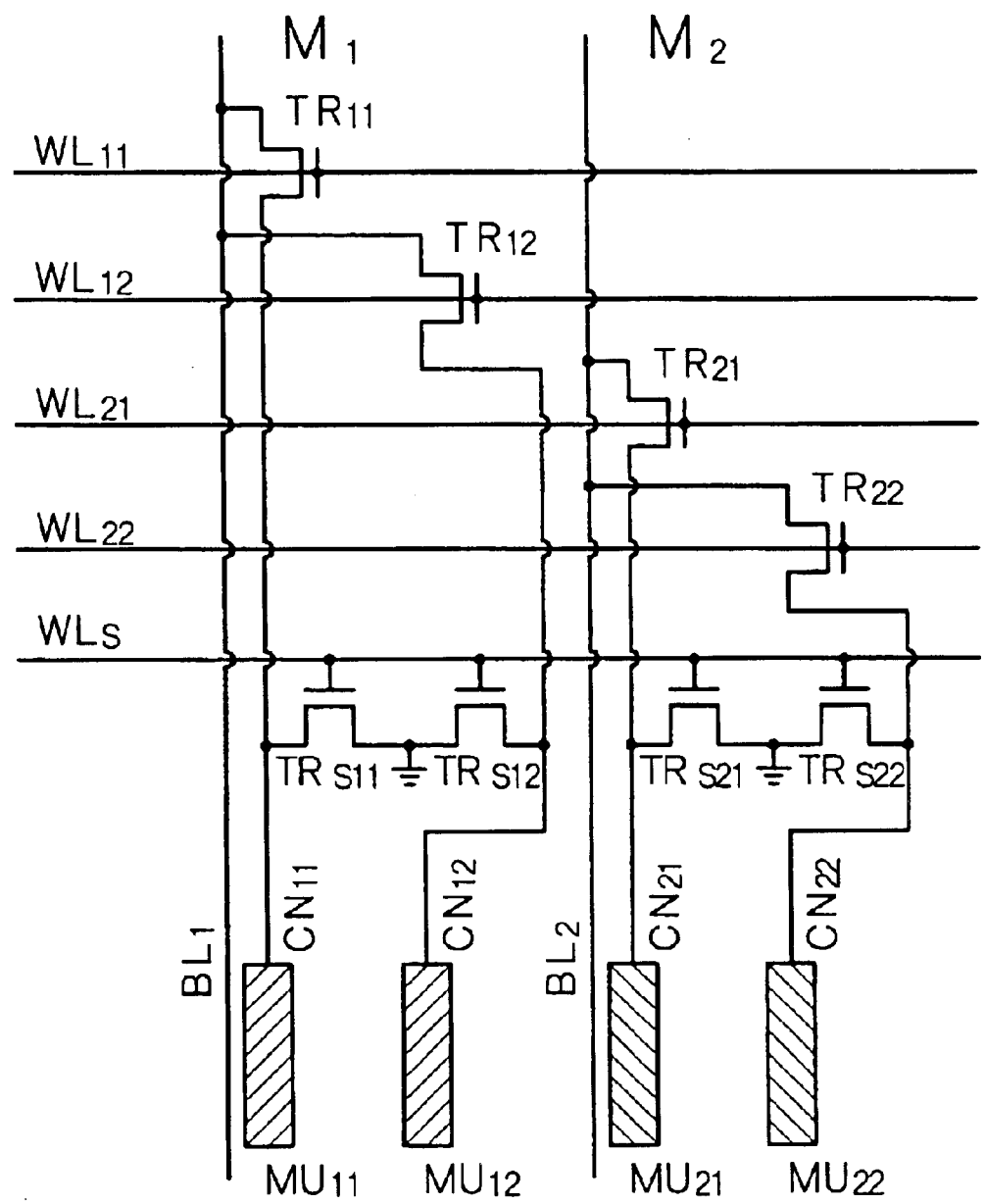
FIG. 34 is a conceptual circuit diagram of another variant of the ferroelectric-type nonvolatile semiconductor memory of Example 6.
Figure 35:
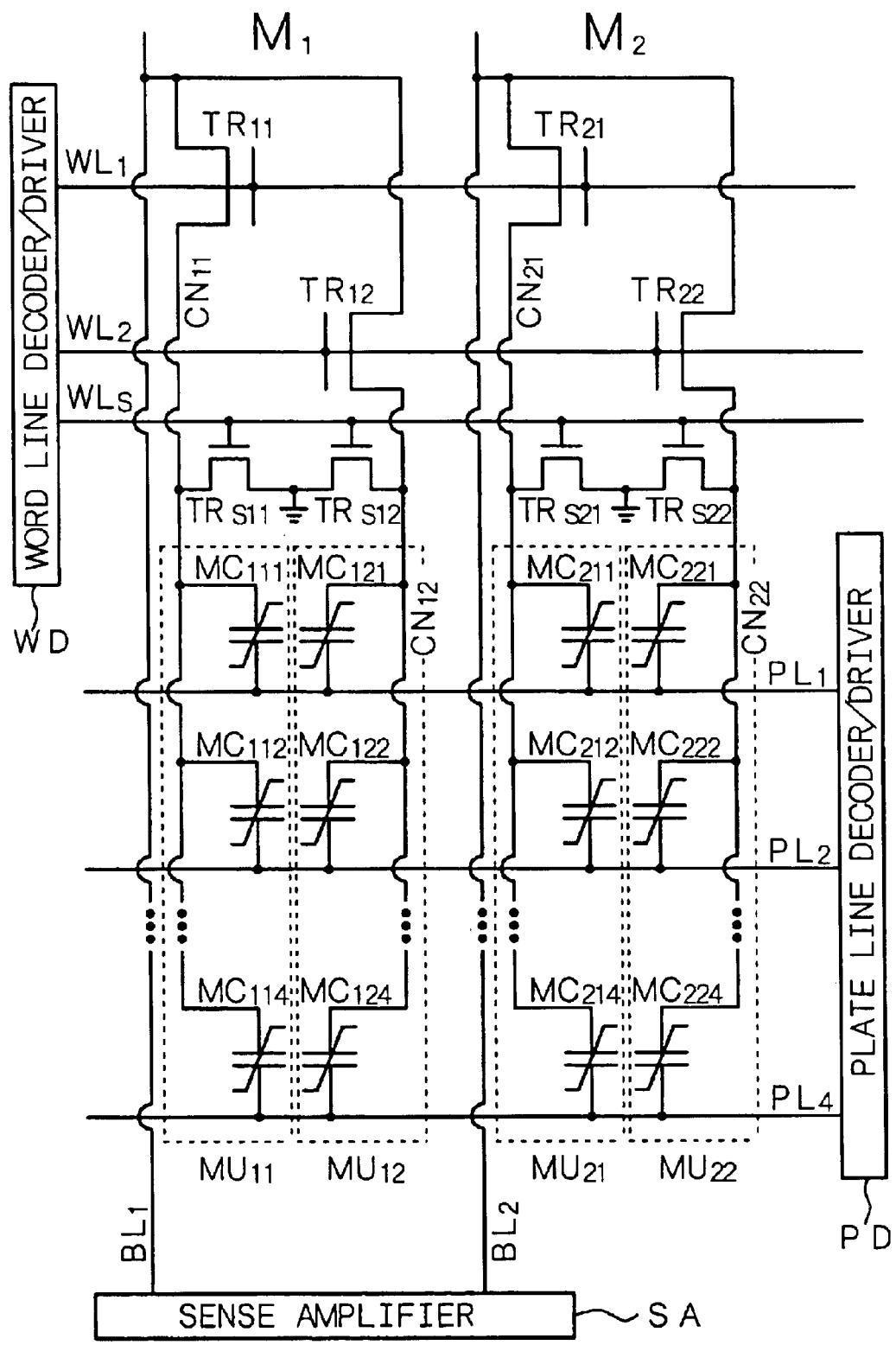
FIG. 35 is a more specific circuit diagram of the conceptual circuit diagram shown in FIG. 32.
Figure 36:
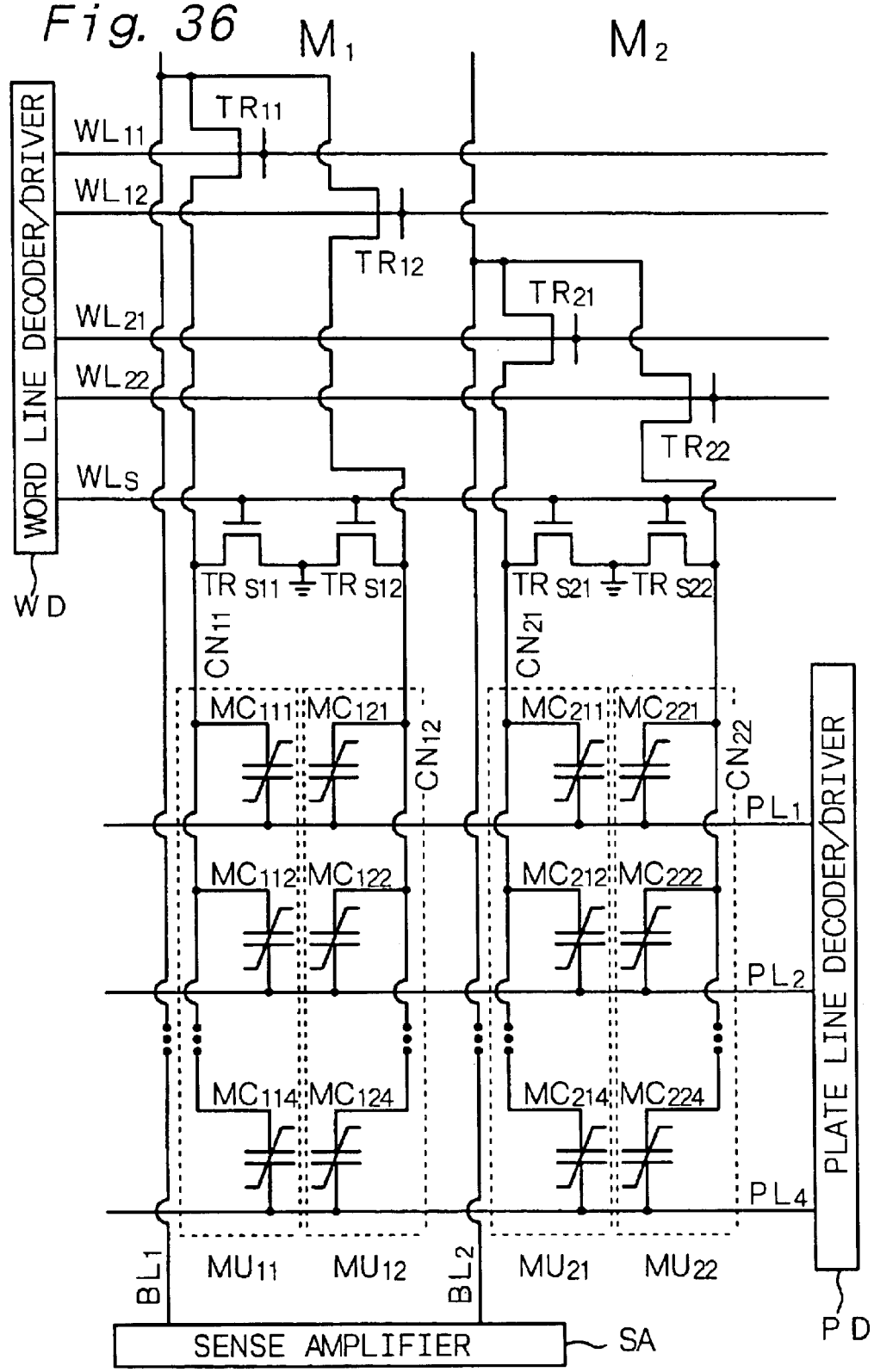
FIG. 36 is a more specific circuit diagram of the conceptual circuit diagram shown in FIG. 34.

Example 6 is concerned with the nonvolatile memory according to the third aspect (more specifically, third-A aspect) of the present invention. FIG. 31 shows a schematic partial cross-sectional view of the nonvolatile memory of Example 6, taken by cutting the nonvolatile memory with an imaginary plane in parallel with the extending direction of a bit line. Further, FIGS. 32 to 34 show conceptual circuit diagrams of the nonvolatile memory of Example 6, FIG. 35 shows a more specific circuit diagram of the conceptual circuit diagram shown in FIG. 32, and FIG. 36 shows a more specific circuit diagram of the conceptual circuit diagram shown in FIG. 34. While FIGS. 32 to 34 show two nonvolatile memories $M_1$ and $M_2$, these nonvolatile memories $M_1$ and $M_2$ are structurally the same, and the nonvolatile memory $M_1$ will be explained below.

The nonvolatile memory $M_1$ of Example 6 comprises;

(A) a bit line $BL_1$, (B) transistors for selection $TR_{11}$ and $TR_{12}$, that are N in number (N≧2, and N=2 in Example 6), (C) memory units $MU_{11}$ or $MU_{12}$ that are N in number, each memory unit being composed of memory cells $MC_{11M}$ or $MC_{12M}$ that are M in number (M≧2, and M=4 in Example 6), and (D) plate lines $PL_M$ that are M in number.

The memory units $MU_{1N}$ that are N in number are stacked through an insulating layer (insulating interlayer 26). Each memory cell comprises a first electrode, a ferroelectric layer and a second electrode. Specifically, each memory cell $MC_{11M}$ constituting the memory unit $MU_{11}$ of the first-place (to be referred to as "first layer" hereinafter) comprises a first electrode 21, a ferroelectric 22 and a second electrode 23, and each memory cell $MC_{12M}$ constituting the memory unit $MU_{12}$ of the second-place (to be referred to as "second layer" hereinafter) comprises a first electrode 31, a ferroelectric 32 and a second electrode 33. Further, in each memory unit $MU_{1n}$, the first electrodes 21 or 31 of the memory cells $MC_{1nm}$ are in common. Specifically, in the memory unit $MU_{11}$ of the first layer, the first electrodes 21 of the memory cells $MC_{11M}$ are in common. The common first electrode 21 will be sometimes referred to as "first common node $CN_{11}$". In the memory unit $MU_{12}$ of the second layer, the first electrodes 31 of the memory cells $MC_{12M}$ are in common. The common first electrode 31 will be sometimes referred to as "second common node $CN_{12}$". Further, in the n-th-place (n=1, 2 . . . N, and to be referred to as "of n-th layer" hereinafter) memory unit $MU_{1n}$, the second electrode 23 or 33 of the m-th-place (m=1, 2 . . . , M) memory cell is connected to the m-th-place plate line $PL_m$ common to the memory units $MU_{1n}$. In Example 6, more specifically, each plate line is extending from the second electrode 23 or 33.

The common first electrode in the memory units $MU_{1n}$ of the n-th layer (n=1, 2 . . . , N) is connected to the bit line $BL_1$ through the n-th-place transistor for selection $TR_{1n}$. Specifically, one source/drain region 14A of each of the transistors for selection $TR_{11}$ and $TR_{12}$ is connected to the bit line $BL_1$, and the other source/drain region 14B of the first-place transistor for selection $TR_{11}$ is connected to the common first electrode 21 (first common node $CN_{11}$) in the memory unit $MU_{11}$ of the first layer through a contact hole 18 formed through an insulating layer 16. The other source/ drain region 14B of the second-place transistor for selection $TR_{12}$ is connected to the common first electrode 31 (second common node $CN_{12}$) in the memory unit $MU_{12}$ of the second layer through a contact hole 18 formed through the insulating layer 16, a pad portion 25 and a contact hole 28 formed through the insulating interlayer 26.

The bit line $BL_1$ is connected to a sense amplifier SA. The plate line $PL_M$ is connected to a plate line decoder/driver PD. Further, word lines $WL_1$ and $WL_2$ (or word lines $WL_{11}$, $WL_{12}$, $WL_{21}$ and $WL_{22}$) are connected to a word line decoder/driver WD. The word lines $WL_1$ and $WL_2$ are extending in the direction perpendicular to the paper surface of FIG. 31. The second electrode 23 of the memory cell $MC_{11m}$ constituting the nonvolatile memory $M_1$ is common to the second electrode of the memory cell $MC_{21m}$ constituting the nonvolatile memory $M_2$ that is adjacent in the direction perpendicular to the paper surface of FIG. 31, and works as the plate line $PL_m$. Further, the second electrode 33 of the memory cell $MC_{12m}$ constituting the nonvolatile memory $M_1$ is common to the second electrode of the memory cell $MC_{22m}$ constituting the nonvolatile memory $M_2$ that is adjacent in the direction perpendicular to the paper surface of FIG. 31, and works as the plate line $PL_m$. These plate lines $PL_m$ are connected to each other in a region that is not shown. Further, the word line $WL_1$ is common to the transistor for selection $TR_{11}$ constituting the nonvolatile memory $M_1$ and the transistor for selection $TR_{21}$ constituting the nonvolatile memory $M_2$ that is adjacent in the direction perpendicular to the paper surface of FIG. 31. Further, the word line $WL_2$ is common to the transistor for selection $TR_{12}$ constituting the nonvolatile memory $M_1$ and the transistor for selection $TR_{22}$ constituting the nonvolatile memory $M_2$ that is adjacent in the direction perpendicular to the paper surface of FIG. 31.

Further, there is provided a circuit for short-circuiting the plate lines that are M in number and the common first electrodes that are N in number (first common nodes $CN_{11}$ and second common nodes $CN_{12}$). In other words, there are provided transistors for switching $TR_{S11}$ and $TR_{S12}$ for grounding the common first electrodes (first common nodes $CN_1$ and second common nodes $CN_{12}$). Specifically, the short-circuiting circuit comprises the transistors for switching $TR_{S11}$ and $TR_{S12}$ and transistors (not shown) that are provided in the plate line decoders/drivers PD and are provided for grounding the plate lines $PL_m$. A word line $WL_S$ for controlling the operation of the transistors for switching $TR_{S11}$ and $TR_{S12}$ is connected to the word line decoder/driver WD. Further, one source/drain region of the transistor for switching $TR_{S11}$ is common to the other source/drain region 14B of the first-place transistor for selection $TR_{11}$, and one source/drain region of the transistor for switching $TR_{S12}$ is common to the other source/drain region 14B of the second-place transistor for selection $TR_{12}$. Further, the other source/drain region 14C of each of the transistors for switching $TR_{S11}$ and $TR_{S12}$ is connected to a grounding line (not shown).

In the nonvolatile memories $M_1$ and $M_2$ whose circuit diagrams are shown in FIGS. 32 and 35, the transistors for selection $TR_{1n}$ and $TR_{2n}$ constituting the nonvolatile memories $M_1$ and $M_2$ are connected to the same word line $WL_n$. And, complementary data is stored in a pair of the memory cells $MC_{1nm}$ and $MC_{2nm}$ (n=1, 2, and m=1, 2 . . . , M). For example, when data stored in the memory cells $MC_{11m}$ and $MC_{21m}$ (m is one of 1, 2, 3 and 4 in this case) is read out, the word line $WL_1$ is selected, a voltage, for example, of (½) $V_{cc}$ is applied to the plate lines $PL_j$ (m≠j), and in this case, the plate line $PL_m$ is driven. In this manner, the complementary data appears, as voltages (bit line potentials), on a pair of the bit lines $BL_1$ and $BL_2$ from a pair of the memory cells $MC_{11m}$ and $MC_{21m}$ through the transistors for selection $TR_{11}$ and $TR_{21}$. And, the voltages (bit line potentials) on the pair of the bit lines $BL_1$ and $BL_2$ are detected with the sense amplifier SA.

The transistors for selection $TR_{11}$, $TR_{12}$, $TR_{21}$ and $TR_{22}$ constituting the nonvolatile memories $M_1$ and $M_2$ are connected to different word lines $WL_{11}$, $WL_{12}$, $WL_{21}$ and $WL_{22}$, respectively, the memory cells $MC_{1nm}$ and $MC_{2nm}$ are independently controlled, and a reference voltage is applied to one of a pair of the bit lines $BL_1$ and $BL_2$, whereby data can be also read out from each of the memory cells $MC_{1nm}$ and $MC_{2nm}$. For circuit diagrams when the above constitution is employed, see FIGS. 34 and 36. When the transistors for selection $TR_{11}$ and $TR_{21}$ are simultaneously driven, and when the transistors for selection $TR_{12}$ and $TR_{22}$ are simultaneously driven, circuits for such are equivalent to the circuits shown in FIGS. 32 and 35.

As described above, 1 bit as data is stored in each of the memory cells $MC_{1nm}$ and $MC_{2nm}$ (n=1, 2 and m=1, 2, 3, 4) (see FIGS. 34 and 36), or the complementary data as 1 bit is stored in a pair of the memory cells $MC_{1nm}$ and $MC_{2nm}$ (see FIGS. 32 and 35). In an actual nonvolatile memory, sets of the above memory units for storing 8 bits or 4 bits each are arranged as access units in the form of an array. And, data is written into, or data is read out from and re-written into, a plurality of access units (memory block) sharing the word lines $WL_1$ and $WL_2$ (or word lines $WL_{11}$, $WL_{12}$, $WL_{21}$ and $WL_{22}$) of the transistors for selection and the plate lines $PL_M$, in the block (or altogether). That is, in the memory block, all of the nonvolatile memories are brought into an operating state altogether and consecutively, or brought into a non-operating (standby) state altogether.

The value of M is not limited to 4. The value of M may be any number so long as it satisfies M≧2, and examples of the value of M practically include exponent numbers of 2 (2, 4, 8, 16 . . . ). Further, the value of N may be any number so long as it satisfies N≧2, and examples of the value of N practically include exponent numbers of 2 (2, 4, 8, . . . ).

FIG. 33 shows a conceptual circuit diagram of a variant of FIG. 32. In the circuit diagram shown in FIG. 33, a transistor for switching $TR_{S1}$ and a transistor for controlling $TR_{C1}$ are provided between one source/drain region of the first-place and the second-place transistors for selection $TR_{11}$ and $TR_{12}$ and the bit lines $BL_1$, and a transistor for switching $TR_{S2}$ and a transistor for controlling $TR_{C2}$ are provided between one source/drain region of the first-place and the second-place transistors for selection $TR_{21}$ and $TR_{22}$ and the bit lines $BL_2$. When the nonvolatile memory is operated, the transistors for controlling $TR_{C1}$ and $TR_{C2}$ come into an ON-state, and the transistors for switching $TR_{S1}$ and $TR_{S2}$ come into an OFF-state. In the non-operation (standby) of the nonvolatile memory, the transistors for controlling $TR_{C1}$ and $TR_{C2}$ come into an OFF-state, and the transistors for switching $TR_{S1}$ and $TR_{S2}$ and the transistors for selection $TR_{11}$, $TR_{12}$, $TR_{21}$ and $TR_{22}$ come into an ON-state. The transistors for controlling $TR_{C1}$ and $TR_{C2}$ are controlled by a word line $WL_C$ for controlling, and the word line $WL_C$ for controlling is connected to the word line decoder/driver WD.

EXAMPLE 7

Figure 37:
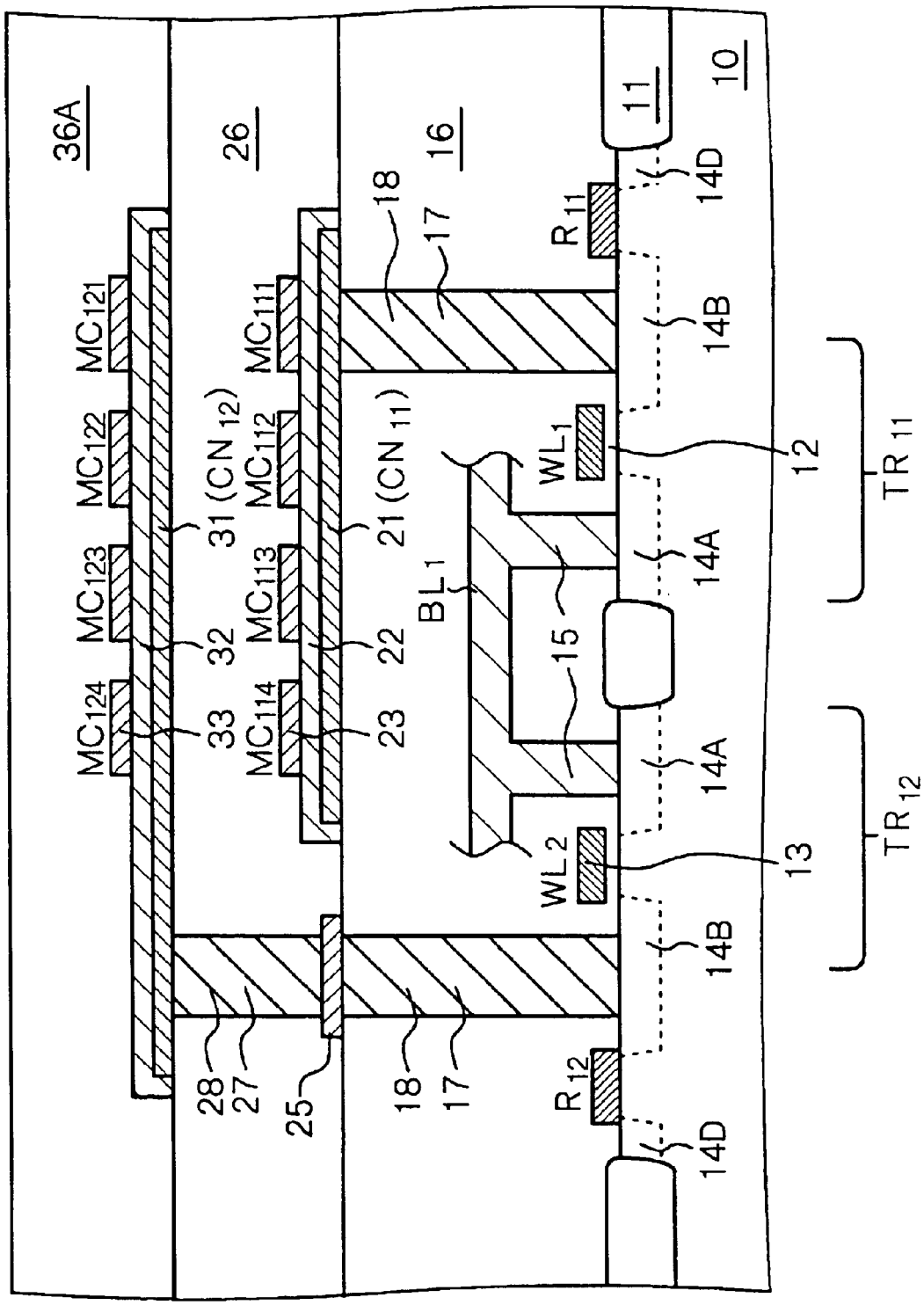
FIG. 37 is a schematic partial cross-sectional view of a ferroelectric-type nonvolatile semiconductor memory of Example 7, taken by cutting the ferroelectric-type nonvolatile semiconductor memory with an imaginary perpendicular plane in parallel with the extending direction of a bit line.
Figure 38:
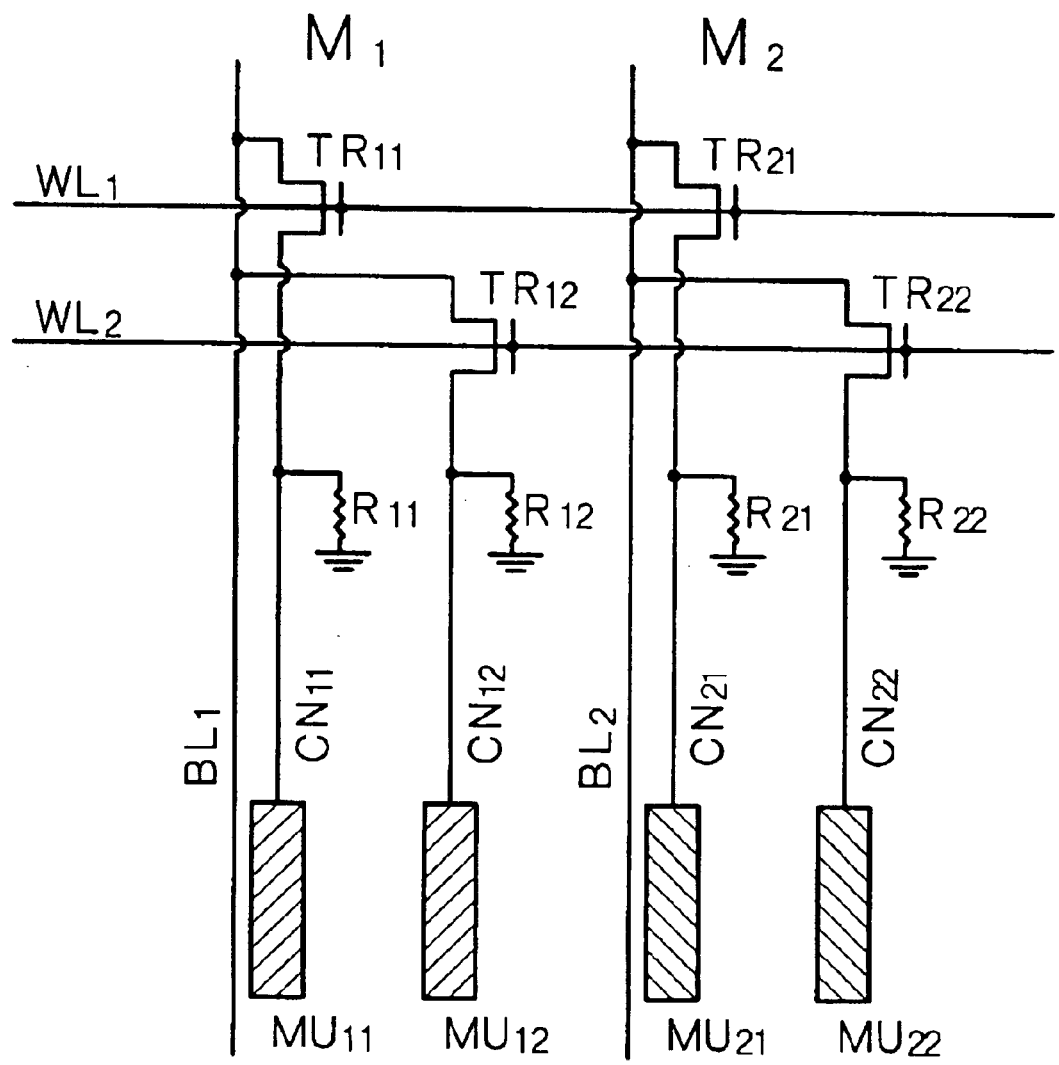
FIG. 38 is a conceptual circuit diagram of the ferroelectric-type nonvolatile semiconductor memory of Example 7.
Figure 39:
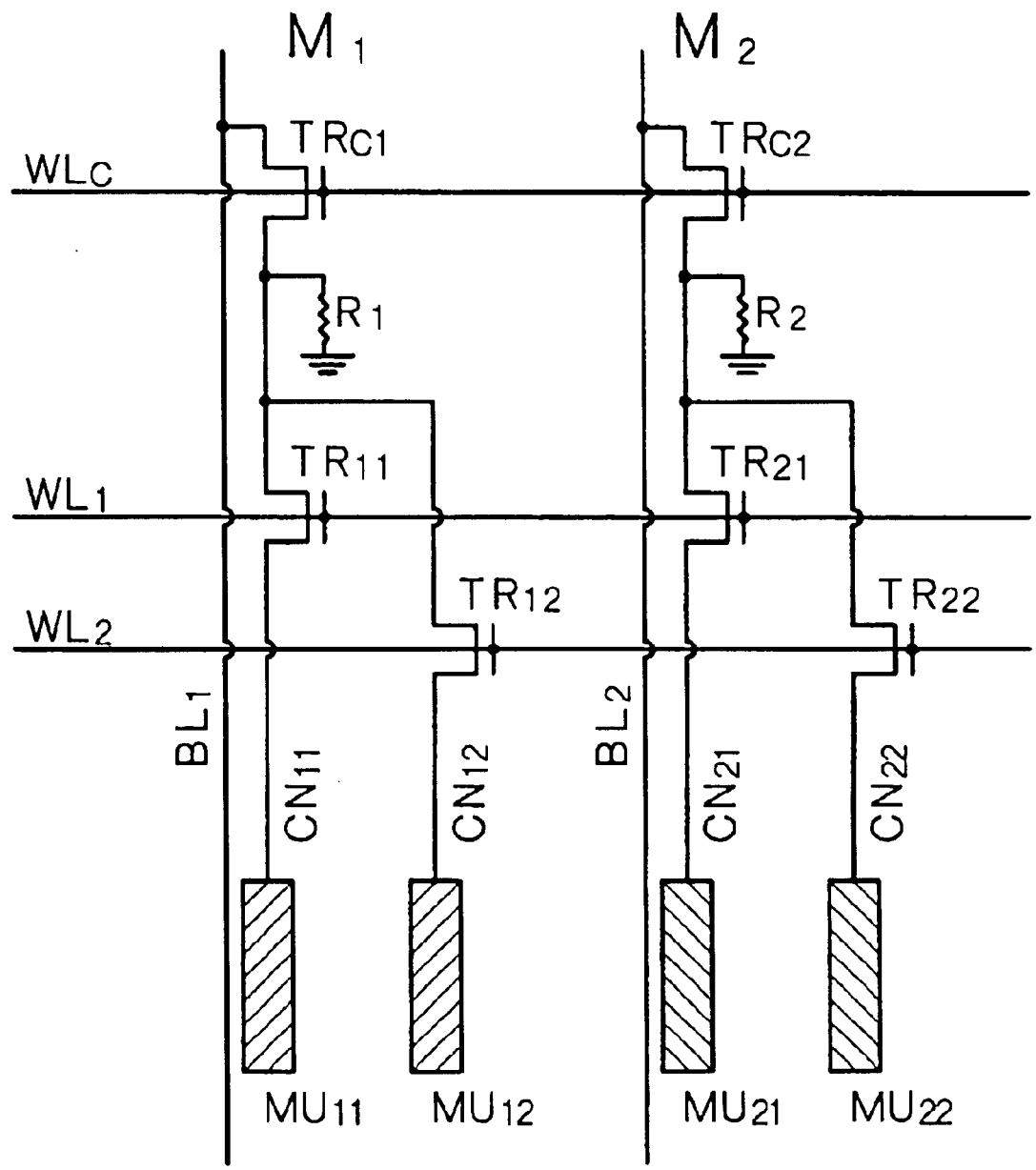
FIG. 39 is a conceptual circuit diagram of a variant of the ferroelectric-type nonvolatile semiconductor memory of Example 7.
Figure 40:
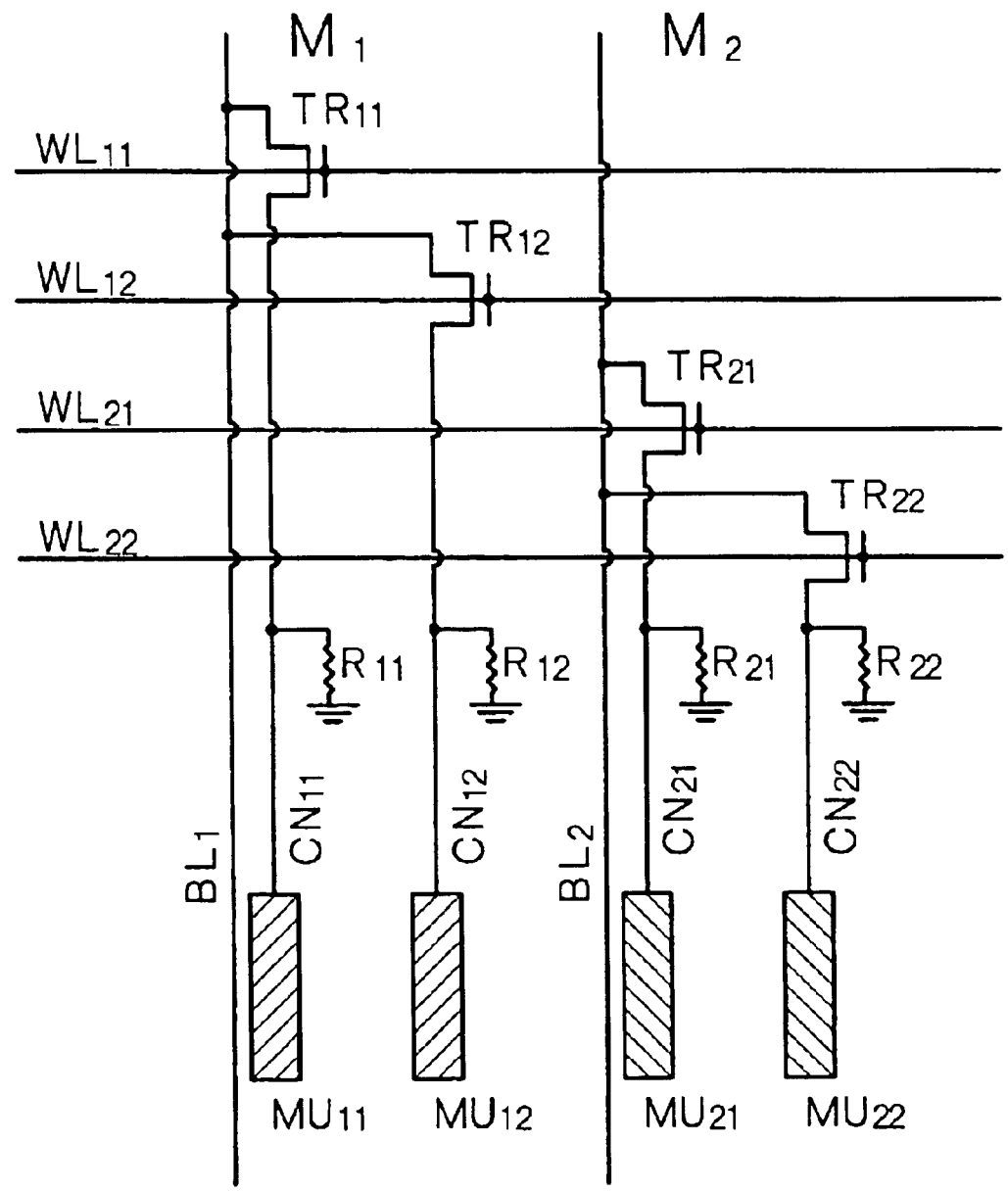
FIG. 40 is a conceptual circuit diagram of another variant of the ferroelectric-type nonvolatile semiconductor memory of Example 7.
Figure 41:
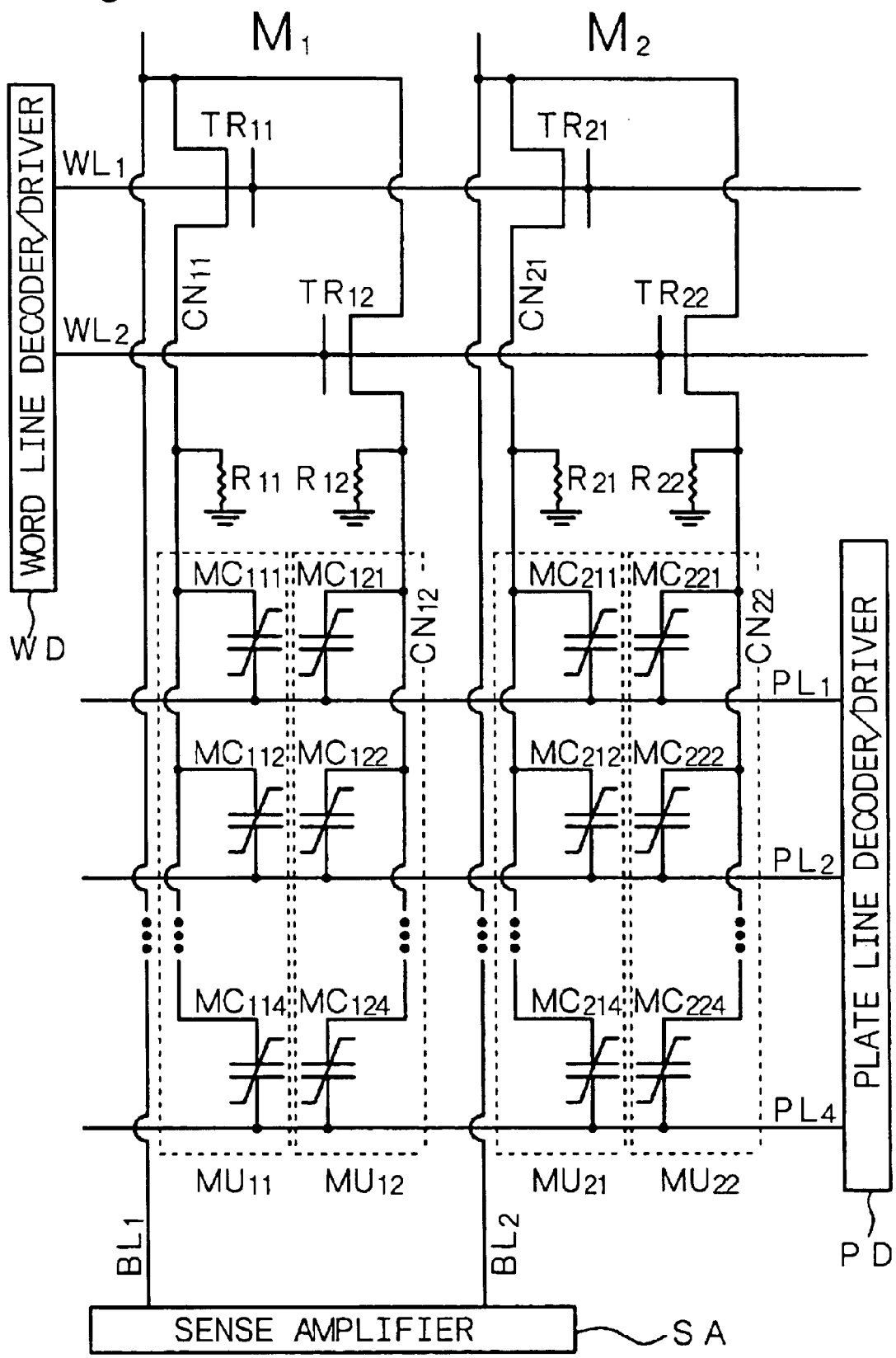
FIG. 41 is a more specific circuit diagram of the conceptual circuit diagram shown in FIG. 38.
Figure 42:
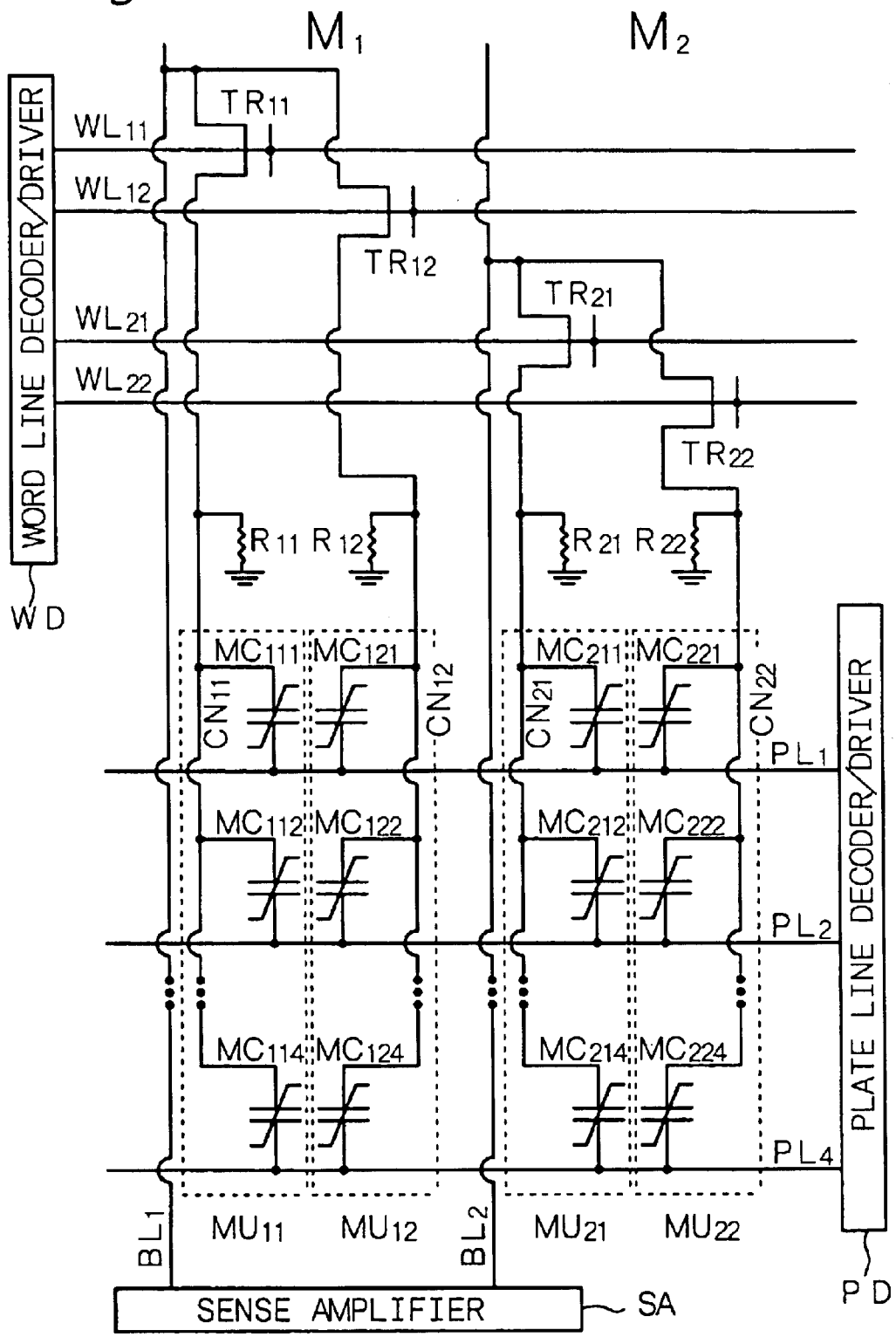
FIG. 42 is a more specific circuit diagram of the conceptual circuit diagram shown in FIG. 40.

Example 7 is concerned with the nonvolatile memory according to the third aspect (more specifically, third-B aspect) of the present invention. FIG. 37 shows a schematic partial cross-sectional view of the nonvolatile memory of Example 7, taken by cutting the nonvolatile memory with an imaginary plane in parallel with the extending direction of a bit line. Further, FIGS. 38 to 40 show conceptual circuit diagrams of the nonvolatile memory of Example 7, FIG. 41 shows a more specific circuit diagram of the conceptual circuit diagram shown in FIG. 38, and FIG. 42 shows a more specific circuit diagram of the conceptual circuit diagram shown in FIG. 40. While FIGS. 38 to 40 show two nonvolatile memories $M_1$ and $M_2$, these nonvolatile memories $M_1$ and $M_2$ are structurally the same, and the nonvolatile memory $M_1$ will be explained below.

The nonvolatile memory $M_1$ of Example 7 has the same structure as that of the nonvolatile memory of Example 6 except that high-resistance elements $R_{11}$ and $R_{12}$ for grounding the common first electrodes (common nodes $CN_{11}$ and $CN_{12}$) are provided in place of the transistors for switching $TR_{S11}$ and $TR_{S12}$ for grounding the common first electrodes (common nodes $CN_{11}$, and $CN_{12}$), so that the detailed explanation thereof will be omitted. Each of the high-resistance elements $R_{11}$ and $R_{12}$ is formed of a polysilicon layer having a resistance value of $1\times10^6\Omega$ (1 M$\Omega$) to $1\times10^{12}\Omega$ (1 T$\Omega$). The high-resistance elements $R_{11}$ and $R_{12}$ and transistors (not shown) that are provided in the plate line decoders/drivers PD and are provided for grounding the plate lines $PL_m$ constitute a circuit for short-circuiting the plate lines that are M in number and the common first electrodes that are N in number.

The high-resistance elements $R_{11}$ and $R_{12}$ can be formed on the semiconductor substrate 10 when the MOS type transistor is formed in [Step-100]. One end of each of the high-resistance elements $R_{11}$ and $R_{12}$ is connected to the other source/drain region 14B of each of the transistors for selection $TR_{11}$ and $TR_{12}$. Further, the other end of each of the high-resistance elements $R_{11}$ and $R_{12}$ is connected to a grounding line 14D.

FIG. 39 shows a conceptual circuit diagram of a variant of FIG. 38. In the circuit diagram shown in FIG. 39, a high-resistance element $R_1$ and a transistor for controlling $TR_{C1}$ are provided between one source/drain region of the first-place and the second-place transistors for selection $TR_{11}$ and $TR_{12}$ and the bit line $BL_1$, and a high-resistance element $R_2$ and a transistor for controlling $TR_{C2}$ are provided between one source/drain region of the first-place and the second-place transistors for selection $TR_{21}$ and $TR_{22}$ and the bit line $BL_2$. When the nonvolatile memory is operated, the transistors for controlling $TR_{C1}$ and $TR_{C2}$ come into an ON-state. In the non-operation (standby state) of the nonvolatile memory, the transistors for controlling $TR_{C1}$ and $TR_{C2}$ come into an OFF-state, and the transistors for selection $TR_{11}$, $TR_{12}$, $TR_{21}$ and $TR_{22}$ come into an ON-state. The transistors for controlling $TR_{C1}$ and $TR_{C2}$ are controlled by a word line $WL_C$ for controlling, and the word line $WL_C$ for controlling is connected to the word line decoder/driver WD.

The operation of the nonvolatile memory whose circuit diagrams are shown in FIGS. 38 and 41 can be the same as the operation of the nonvolatile memory shown in FIGS. 32 and 35, and the operation of the nonvolatile memory whose circuit diagrams are shown in FIGS. 40 and 42 can be the same as the operation of the nonvolatile memory shown in FIGS. 34 and 36, so that the detailed explanation thereof is omitted.

EXAMPLE 8

Figure 43:
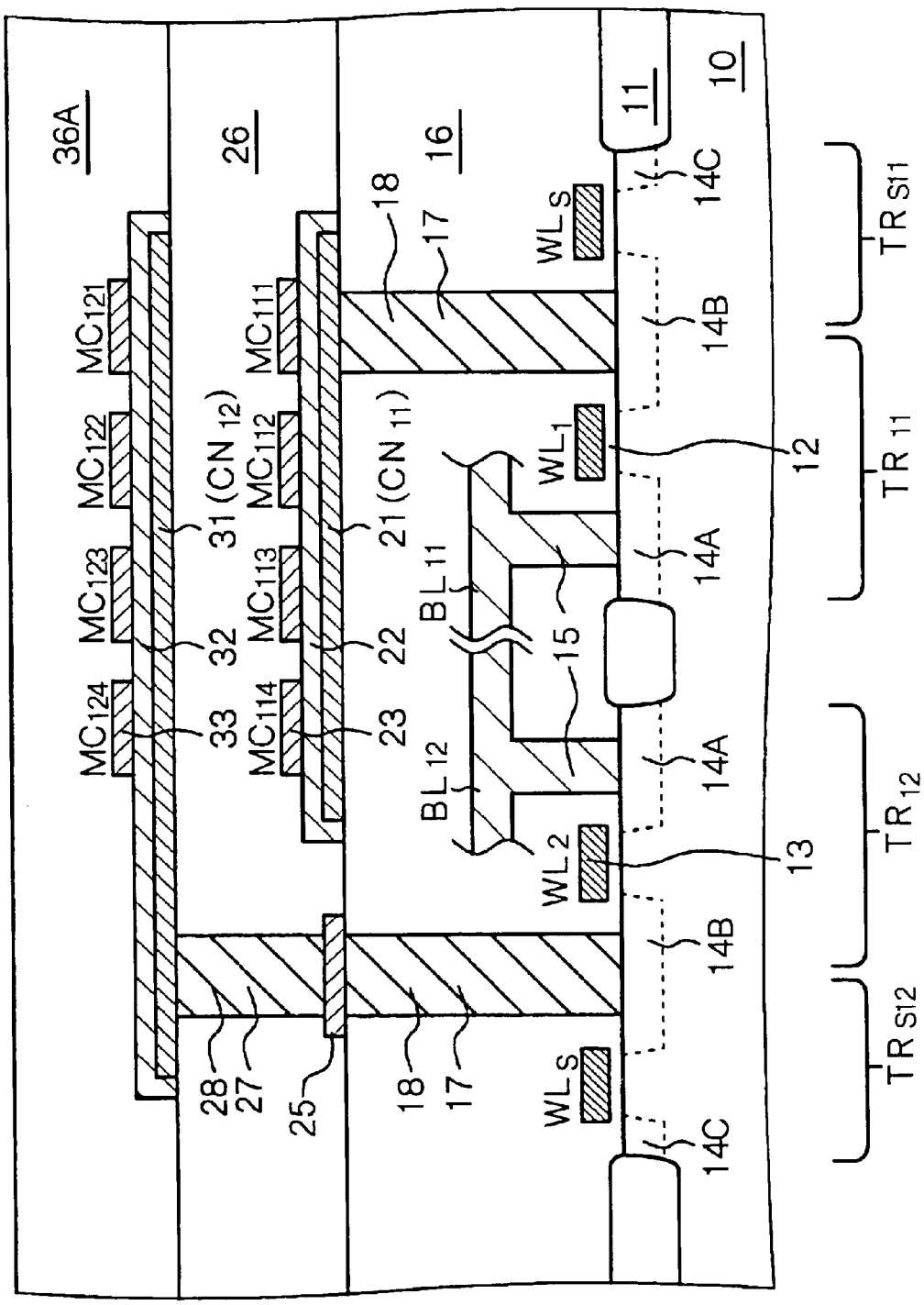
FIG. 43 is a schematic partial cross-sectional view of a ferroelectric-type nonvolatile semiconductor memory of Example 8, taken by cutting the ferroelectric-type nonvolatile semiconductor memory with an imaginary perpendicular plane in parallel with the extending direction of a bit line.
Figure 44:
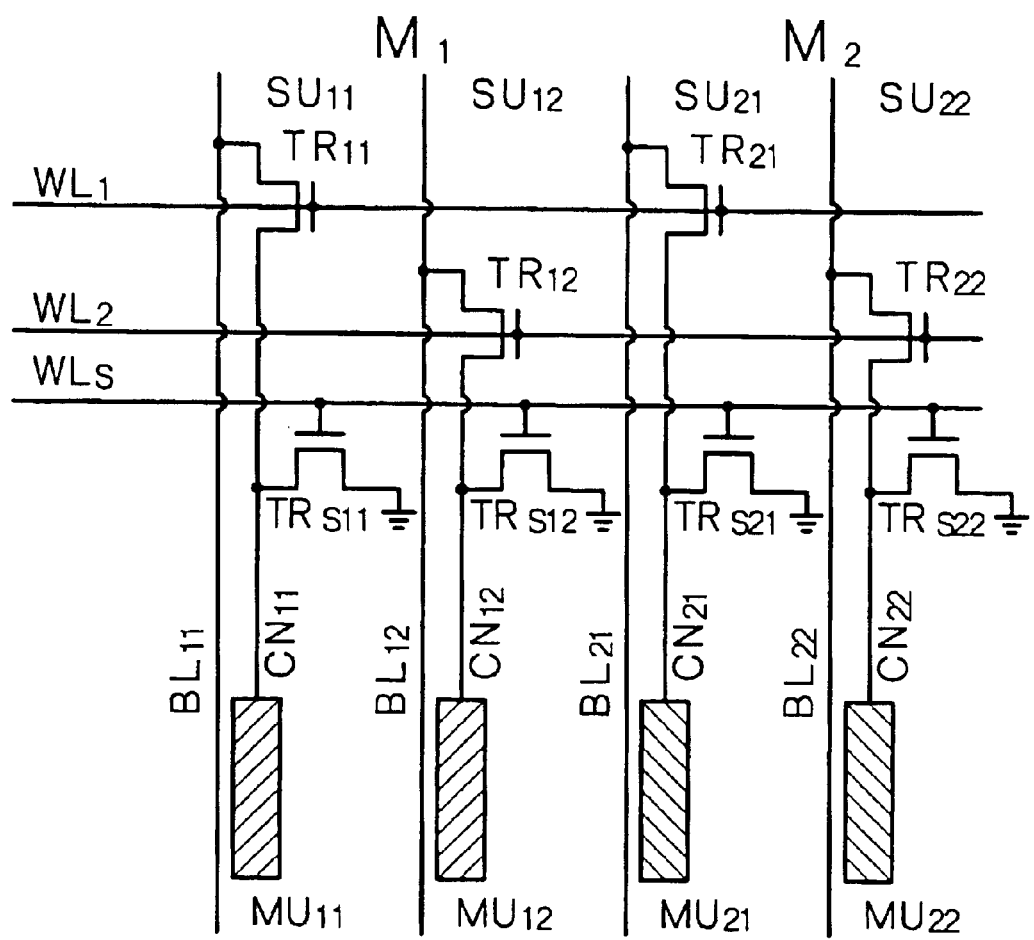
FIG. 44 is a conceptual circuit diagram of the ferroelectric-type nonvolatile semiconductor memory of Example 8.
Figure 45:
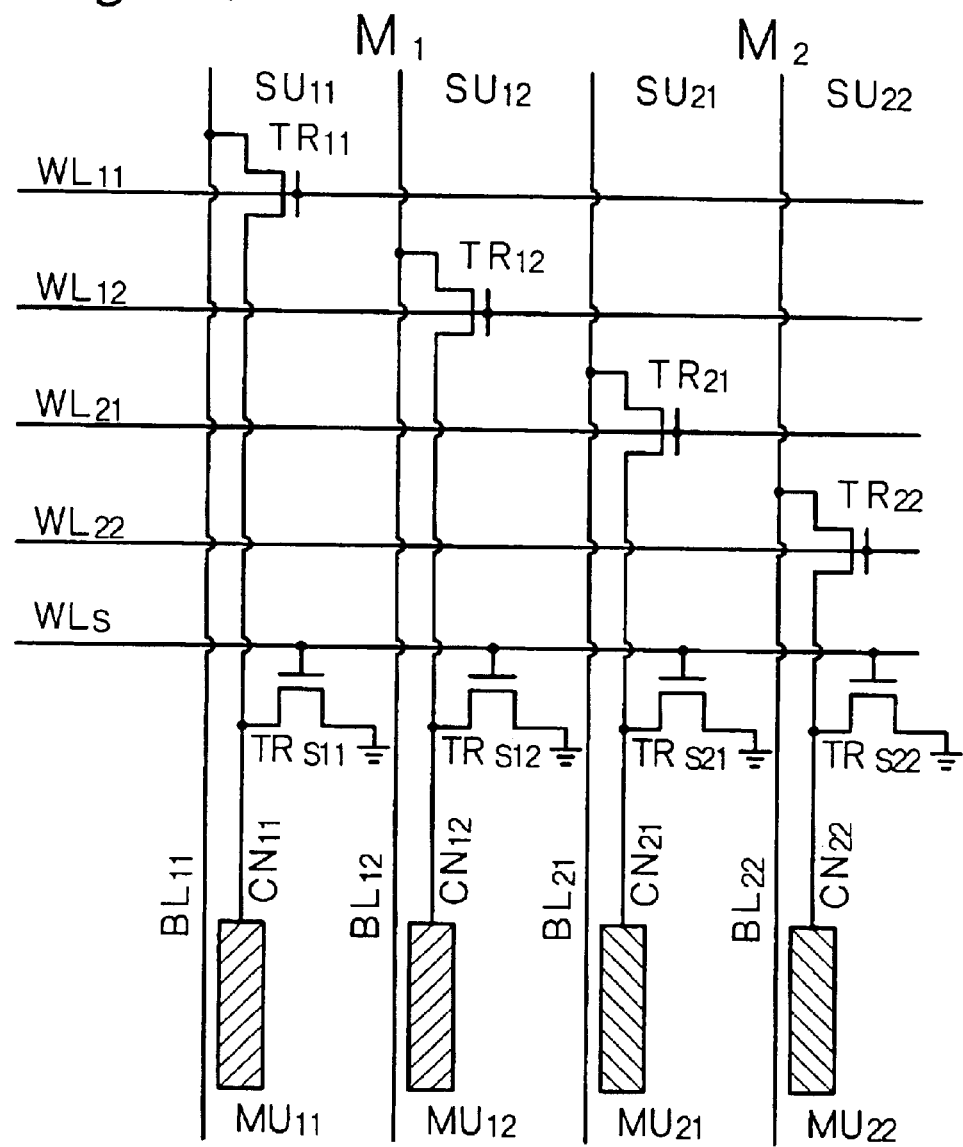
FIG. 45 is a conceptual circuit diagram of a variant of the ferroelectric-type nonvolatile semiconductor memory of Example 8.
Figure 46:
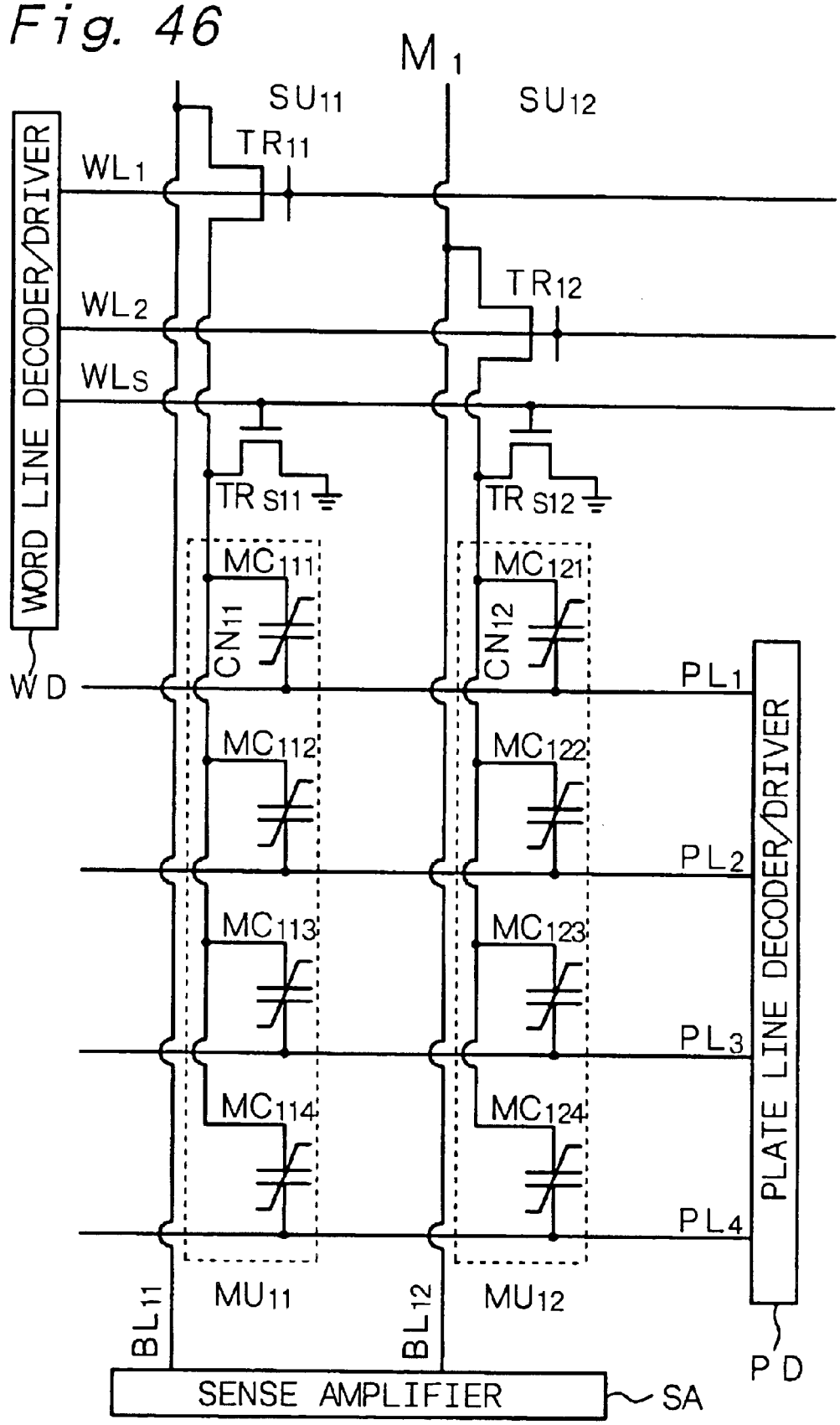
FIG. 46 is a more specific circuit diagram of the conceptual circuit diagram shown in FIG. 44 or 45.

Example 8 is concerned with the nonvolatile memory according to the fourth aspect (more specifically, fourth-A aspect) of the present invention. FIG. 43 shows a schematic partial cross-sectional view of the nonvolatile memory of Example 8, taken by cutting the nonvolatile memory with an imaginary plane in parallel with the extending direction of a bit line. Further, FIGS. 44 and 45 show conceptual circuit diagrams of the nonvolatile memory of Example 8, and FIG. 46 shows a more specific circuit diagram. While FIGS. 44 and 45 show two nonvolatile memories $M_1$ and $M_2$, these nonvolatile memories $M_1$ and $M_2$ are structurally the same, and the nonvolatile memory $M_1$ will be explained below.

The nonvolatile memory $M_1$ of Example 8 comprises;

(A) bit lines $BL_{1N}$ that are N in number (N$\geq$2, and N=2 in Example 8), (B) transistors for selection $TR_{1N}$, that are N in number, (C) memory units $MU_{1N}$ that are N in number, each memory unit being composed of memory cells $MC_{11M}$ and $MC_{12M}$ that are M in number (M$\geq$2, and M=4 in Example 8), and (D) plate lines $PL_M$ that are M in number.

In FIGS. 44, 45, 46, 48, 49 and 50, the memory unit $MU_{11}$ composed of the bit line $BL_{11}$, the transistor for selection $TR_{11}$ and the memory cells $MC_{11M}$ is shown as a subunit $SU_{11}$, and the memory unit $MU_{12}$ composed of the bit line $BL_{12}$, the transistor for selection $TR_{12}$ and the memory cells $MC_{12M}$ is shown as a subunit $SU_{12}$.

The memory units $MU_{1N}$ that are N in number are stacked through an insulating layer (insulating interlayer 26). Each memory cell comprises a first electrode, a ferroelectric layer and a second electrode. Specifically, each of the memory cells $MC_{11M}$ constituting the memory unit $MU_{11}$ of the first-place (to be called "first layer") comprises a first electrode 21, a ferroelectric 22 and a second electrode 23, and each of the memory cells $MC_{12M}$ constituting the memory unit $MU_{12}$ of the second-place (to be called "second layer") comprises a first electrode 31, a ferroelectric 32 and a second electrode 33. In each memory unit $MU_{1n}$, the first electrodes 21 or 31 of the memory cells $MC_{1nm}$ are in common. Specifically, in the memory unit $MU_{11}$ of the first layer, the first electrodes 21 of the memory cells $MC_{11M}$ are in common. The common first electrode 21 will be sometimes referred to as first common node $CN_{11}$. In the memory unit $MU_{12}$ of the second layer, the first electrodes 31 of the memory cells $MC_{12M}$ are in common. The common first electrode 31 will be sometimes referred to as second common node $CN_{12}$. Further, in memory units $MU_{1n}$ in an n-th-place (to be called "n-th layer") (n=1, 2 . . . , N), the second electrode 23 or 33 of the m-th-place (m=1, 2 . . . M) memory cell is connected to the m-th-place plate line $PL_m$ common to the memory units $MU_{1n}$. More specifically, in Example 8, each plate line is extending from the second electrode 23 or 33.

The common first electrode in the memory units $MU_{1n}$ of the n-th layer (n=1, 2 . . . , N) is connected to the n-th-place bit line $BL_{1n}$ through the n-th-place transistor for selection $TR_{1n}$. Specifically, one source/drain region 14A of the n-th-place transistor for selection $TR_{1n}$ is connected to the n-th-place bit line $BL_{1n}$ through a contact hole 15, and the other source/drain region 14B of the first-place transistor for selection $TR_{11}$ is connected to the common first electrode 21 (first common node $CN_{11}$) in the memory unit $MU_{11}$ of the first layer through a contact hole 18 formed through an insulating layer 16. Further, the other source/drain region 14B of the second-place transistor for selection $TR_{12}$ is connected to the common first electrode 31 (second common node $CN_{12}$) in the memory unit $MU_{12}$ of the second layer through a contact hole 18 formed through the insulating layer 16, a pad portion 25 and a contact hole 28 formed through the insulating interlayer 26.

The bit line $BL_{1n}$ is connected to a sense amplifier SA. The plate line $PL_M$ is connected to a plate line decoder/driver PD. Further, the word lines $WL_1$ and $WL_2$ (or word lines $WL_{11}$, $WL_{12}$, $WL_{21}$ and $WL_{22}$) are connected to a word line decoder/driver WD. Further, the word lines $WL_1$ and $WL_2$ are extending in the direction perpendicular to the paper surface of FIG. 43. The second electrode 23 of the memory cell $MC_{11m}$ constituting the nonvolatile memory $M_1$ is common to the second electrode of the memory cell $MC_{21m}$ constituting the nonvolatile memory $M_2$ that is adjacent in the direction perpendicular to the paper surface of FIG. 43, and works as the plate line $PL_m$. Further, the second electrode 33 of the memory cell $MC_{12m}$ constituting the nonvolatile memory $M_1$ is common to the second electrode of the memory cell $MC_{22m}$ constituting the nonvolatile memory $M_2$ that is adjacent in the direction perpendicular to the paper surface of FIG. 43, and works as the plate line $PL_m$. These plate lines $PL_m$ are connected to each other in a region that is not shown. Further, the word line $WL_1$ is common to the transistor for selection $TR_{11}$ constituting the nonvolatile memory $M_1$ and the transistor for selection $TR_{21}$ constituting nonvolatile memory $M_2$ that is adjacent in the direction perpendicular to the paper surface of FIG. 43. Further, the word line $WL_2$ is common to the transistor for selection $TR_{12}$ constituting the nonvolatile memory $M_1$ and the transistor for selection $TR_{22}$ constituting the nonvolatile memory $M_2$ that is adjacent in the direction perpendicular to the paper surface of FIG. 43.

There is provided a circuit for short-circuiting the plate lines that are M in number and the common first electrodes that are N in number (first common node $CN_{11}$ and second common node $CN_{12}$). In other words, there are provided transistor for switching $TR_{S11}$ and $TR_{S12}$ for grounding each of the common first electrodes (first common node $CN_1$ and second common node $CN_{12}$). Specifically, the short-circuiting circuit comprises the transistors for switching $TR_{S11}$ and $TR_{S12}$ and transistors (not shown) that are provided in the plate line decoders/drivers PD and are provided for grounding the plate lines $PL_m$. The word line $WL_S$ for controlling the operation of the transistors for switching $TR_{S11}$ and $TR_{S12}$ is connected to the word line decoder/driver WD. Further, one source/drain region of the transistor for switching $TR_{S11}$ is common to the other source/drain region 14B of the first-place transistor for selection $TR_{11}$, and one source/drain region of the transistor for switching $TR_{S12}$ is common to the other source/drain region 14B of the second-place transistor for selection $TR_{12}$. Further, the other source/drain region 14C of the transistors for switching $TR_{S11}$ and $TR_{S12}$ is connected to a grounding line (not shown).

In the nonvolatile memories $M_1$ and $M_2$ whose circuit diagrams are shown in FIGS. 44 and 46, the transistors for selection $TR_{11}$ and $TR_{21}$ constituting the nonvolatile memories $M_1$ and $M_2$ are connected to the same word line $WL_1$, and the transistors for selection $TR_{12}$ and $TR_{22}$ are connected to the same word line $WL_2$. And, the complementary data is stored in a pair of the memory cells $MC_{1nm}$ and $MC_{2nm}$ (n=1, 2 and m=1, 2 . . . , M). For example, when data stored in the memory cells $MC_{11m}$ and $MC_{21m}$ (m is one of 1, 2, 3 and 4) is read out, the word line $WL_1$ is selected, a voltage, for example, of (½) $V_{cc}$ is applied to the plate lines $PL_j$ (m≠j), and in this state, the plate line $PL_m$ is driven. In the above manner, the complementary data appears, as voltages (bit line potentials), on a pair of the bit lines $BL_{11}$ and $BL_{21}$ from a pair of the memory cell $MC_{11m}$ and $MC_{21m}$ through the transistors for selection $TR_{11}$ and $TR_{21}$. And, the voltages (bit line potentials) on the pair of the bit lines $BL_{11}$ and $BL_{21}$ are detected with the sense amplifier SA.

The transistors for selection $TR_{11}$, $TR_{12}$, $TR_{21}$ and $TR_{22}$ constituting the nonvolatile memories $M_1$ and $M_2$ are connected to different word lines $WL_{11}$, $WL_{12}$, $WL_{21}$ and $WL_{22}$, the memory cells $MC_{1nm}$ and $MC_{2nm}$ are independently controlled, and a reference voltage is applied to one of a pair of the bit lines $BL_{11}$ and $BL_{21}$ or one of a pair of the bit lines $BL_{12}$ and $BL_{22}$, whereby data can be read out from each of the memory cell $MC_{1nm}$ and $MC_{2nm}$. For circuit diagrams when the above constitution is employed, see FIGS. 45 and 46. When the transistors for selection $TR_{11}$ and $TR_{21}$ are simultaneously driven, and when the transistors for selection $TR_{12}$ and $TR_{22}$ are simultaneously driven, a circuit for such is equivalent to the circuit shown in FIG. 44.

In the above manner, 1 bit as data is stored in each of the memory cells $MC_{1nm}$ and $MC_{2nm}$ (n=1, 2 and m=1, 2, 3, 4) (see FIG. 45), or the complementary data as 1 bit is stored in a pair of the memory cells $MC_{1nm}$ and $MC_{2nm}$ (see FIG. 44). In an actual nonvolatile memory, sets of the above memory units for storing 8 bits or 4 bits each are arranged as access units in the form of an array. And, data is written into, or data is read out from and re-written into, a plurality of access units (memory block) sharing the word lines $WL_1$ and $WL_2$ (or word lines $WL_{11}$, $WL_{12}$, $WL_{21}$ and $WL_{22}$) of the transistors for selection and the plate lines $PL_M$, in the block (or altogether). That is, in the memory block, all of the nonvolatile memories are brought into an operating state altogether and consecutively, or brought into a non-operating (standby) state altogether.

The value of M is not limited to 4. The value of M may be any number so long as it satisfies M≧2, and examples of the value of M practically include exponent numbers of 2 (2, 4, 8, 16 . . . ). Further, the value of N may be any number so long as it satisfies N≧2, and examples of the value of N practically include exponent numbers of 2 (2, 4, 8, . . . ).

EXAMPLE 9

Figure 47:
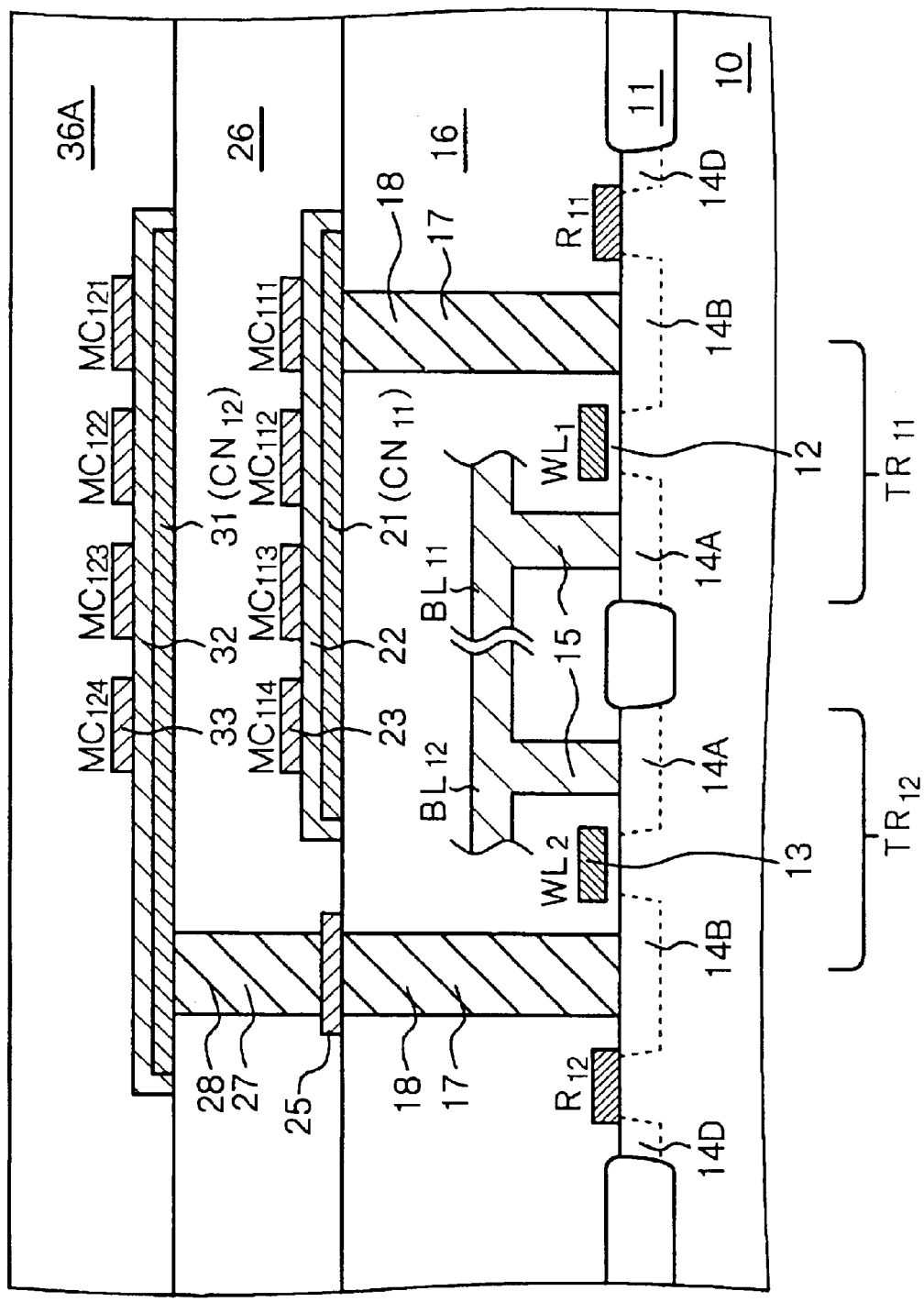
FIG. 47 is a schematic partial cross-sectional view of a ferroelectric-type nonvolatile semiconductor memory of Example 9, taken by cutting the ferroelectric-type nonvolatile semiconductor memory with an imaginary perpendicular plane in parallel with the extending direction of a bit line.
Figure 48:
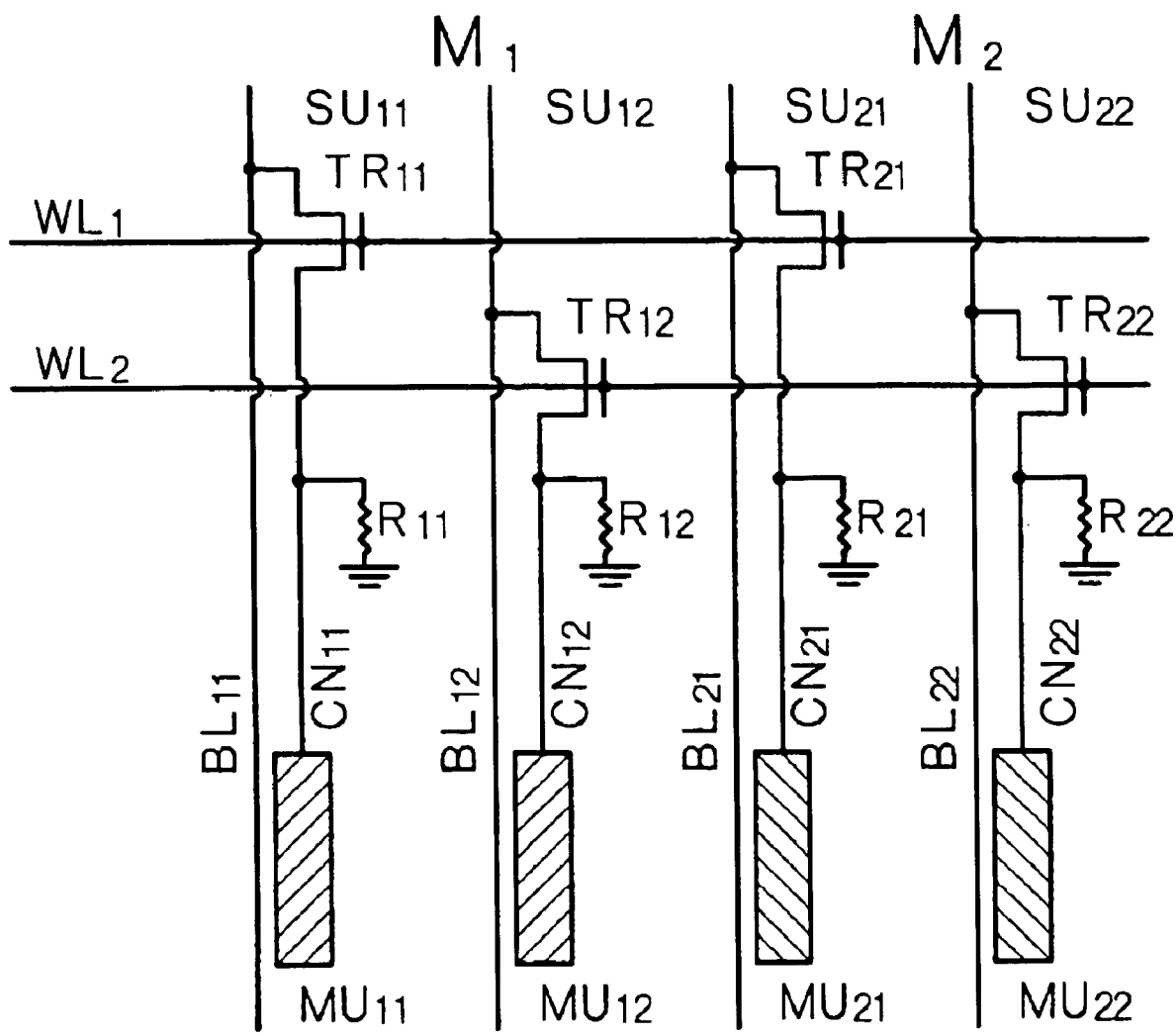
FIG. 48 is a conceptual circuit diagram of the ferroelectric-type nonvolatile semiconductor memory of Example 9.
Figure 49:
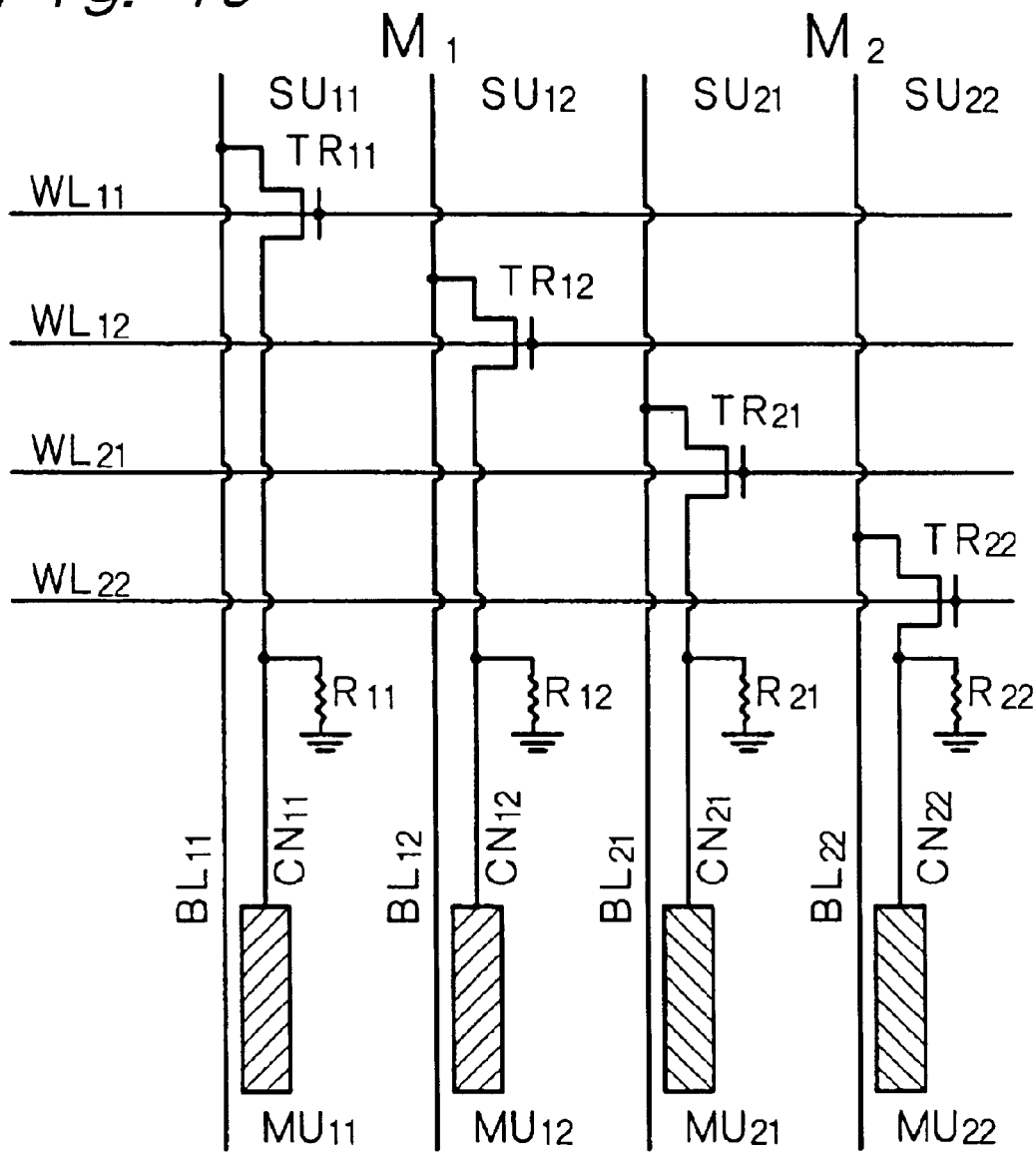
FIG. 49 is a conceptual circuit diagram of a variant of the ferroelectric-type nonvolatile semiconductor memory of Example 9.
Figure 50:
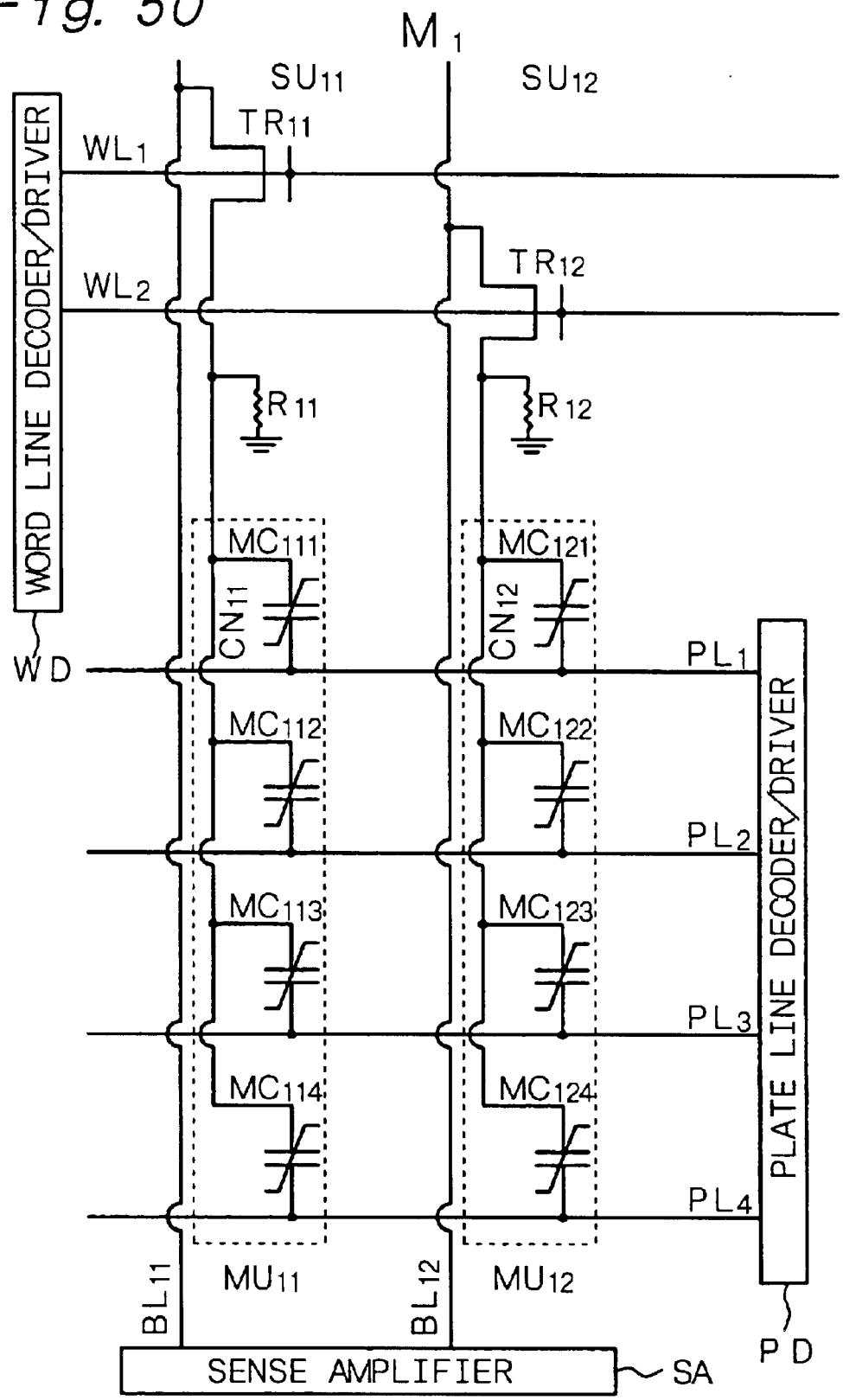
FIG. 50 is a more specific circuit diagram of the conceptual circuit diagram shown in FIG. 48 or 49.

Example 9 is concerned with the nonvolatile memory according to the fourth aspect (more specifically, fourth-B aspect) of the present invention. FIG. 47 shows a schematic partial cross-sectional view of the nonvolatile memory of Example 9, taken by cutting the nonvolatile memory with an imaginary plane in parallel with the extending direction of a bit line. Further, FIGS. 48 and 49 show conceptual circuit diagrams of the nonvolatile memory of Example 9, and FIG. 50 shows a more specific circuit diagram. While FIGS. 48 and 49 show two nonvolatile memories $M_1$ and $M_2$, these nonvolatile memories $M_1$ and $M_2$ are structurally the same, and the nonvolatile memory $M_1$ will be explained below.

The nonvolatile memory $M_1$ of Example 9 has the same structure as that of the nonvolatile memory of Example 8 except that high-resistance elements $R_{11}$ and $R_{12}$ for grounding the common first electrodes (common nodes $CN_{11}$ and $CN_{12}$) are provided in place of the transistors for switching $TR_{S11}$ and $TR_{S12}$ for grounding the common first electrodes (common nodes $CN_{11}$ and $CN_{12}$), so that the detailed explanation thereof will be omitted. Each of the high-resistance elements $R_{11}$ and $R_{12}$ is formed of a polysilicon layer having a resistance value of $1 \times 10^6 \Omega$ (1 MΩ) to $1 \times 10^{12} \Omega$ (1 TΩ). The high-resistance elements $R_{11}$ and $R_{12}$ and transistors (not shown) that are provided in the plate line decoders/drivers PD and are provided for grounding the plate lines $PL_m$ constitute a circuit for short-circuiting the plate lines that are M in number and the common first electrodes that are N in number.

The high-resistance elements $R_{11}$ and $R_{12}$ can be formed on the semiconductor substrate 10 when the MOS type transistor is formed in [Step-100]. One end of each of the high-resistance elements $R_{11}$ and $R_{12}$ is connected to the other source/drain region 14B of each of the transistors for selection $TR_{11}$ and $TR_{12}$. Further, the other end of each of the high-resistance elements $R_{11}$ and $R_{12}$ is connected to a grounding line 14D.

The operation of the nonvolatile memory whose circuit diagrams are shown in FIGS. 48 and 49 can be the same as the operation of the nonvolatile memory shown in FIGS. 44 and 45, so that the detailed explanation thereof is omitted.

The present invention is explained with reference to Examples hereinabove, while the present invention shall not be limited thereto. The structures of the nonvolatile memories, materials, various forming conditions, circuit constitutions, operation methods, etc., explained in Examples are given for an illustrative purpose and may be modified as required. The transistor for switching and the high-resistance element are not required to be arranged side by side with the transistor for selection. For example, there may be employed a constitution in which a wiring is formed which extends from a common node to a plate line decoder/driver PD and a transistor for switching or a high-resistance element connected to an end portion of the wiring is formed in the plate line decoder/driver PD, or a constitution in which a wiring is formed which extends from a common node to a word line decoder/driver WD and a transistor for switching or a high-resistance element connected to an end portion of the wiring is formed in the word line decoder/driver WD. Further, while the ferroelectric layer is of an insulating material, part of the ferroelectric layer is ion-implanted to change the crystallinity of the part so that the part is converted to a high-resistance material, and the part may be used to constitute the circuit for short-circuiting a plate line and a common first electrode. The above high-resistance material preferably has a resistance value of $1 \times 10^6 \Omega$ to $1 \times 10^{12} \Omega$.

When the total number of signal lines for driving units is A, when the number of word lines of them is B, and when the number of plate lines of them is C, generally, A=B+C. When the total number A is constant, it is sufficient to satisfy B=C for maximizing the total address number (B×C) of the units. For attaining a most effective layout of peripheral circuits, it is sufficient to bring the word line number B and the plate line number C into agreement in the unit. Further, the number of word lines in row-address access units is equal, for example, to the number (N) of stacks of memory cells, and the number of plate lines is also equal to the number (M) of memory cells constituting memory units. With an increase in the number of word lines and the number of plate lines, the substantial integration degree of the nonvolatile memory is more improved. And, a product of the number of word lines and the number of plate lines represents the number of addresses that are accessible. When making an access in the block (altogether) and continuously is a premise, a value obtained by deducting 1 from the above product is the number of disturbance. Therefore, the value of product of the number of word lines and the number of plate lines is determined on the basis of durability against disturbance and process factors. The above disturbance refers to a phenomenon in which an electric field is exerted on a ferroelectric layer constituting a non-elected memory cell in a direction in which the polarization is inverted, that is, a direction in which data stored is deteriorated or destroyed.

Figure 51:
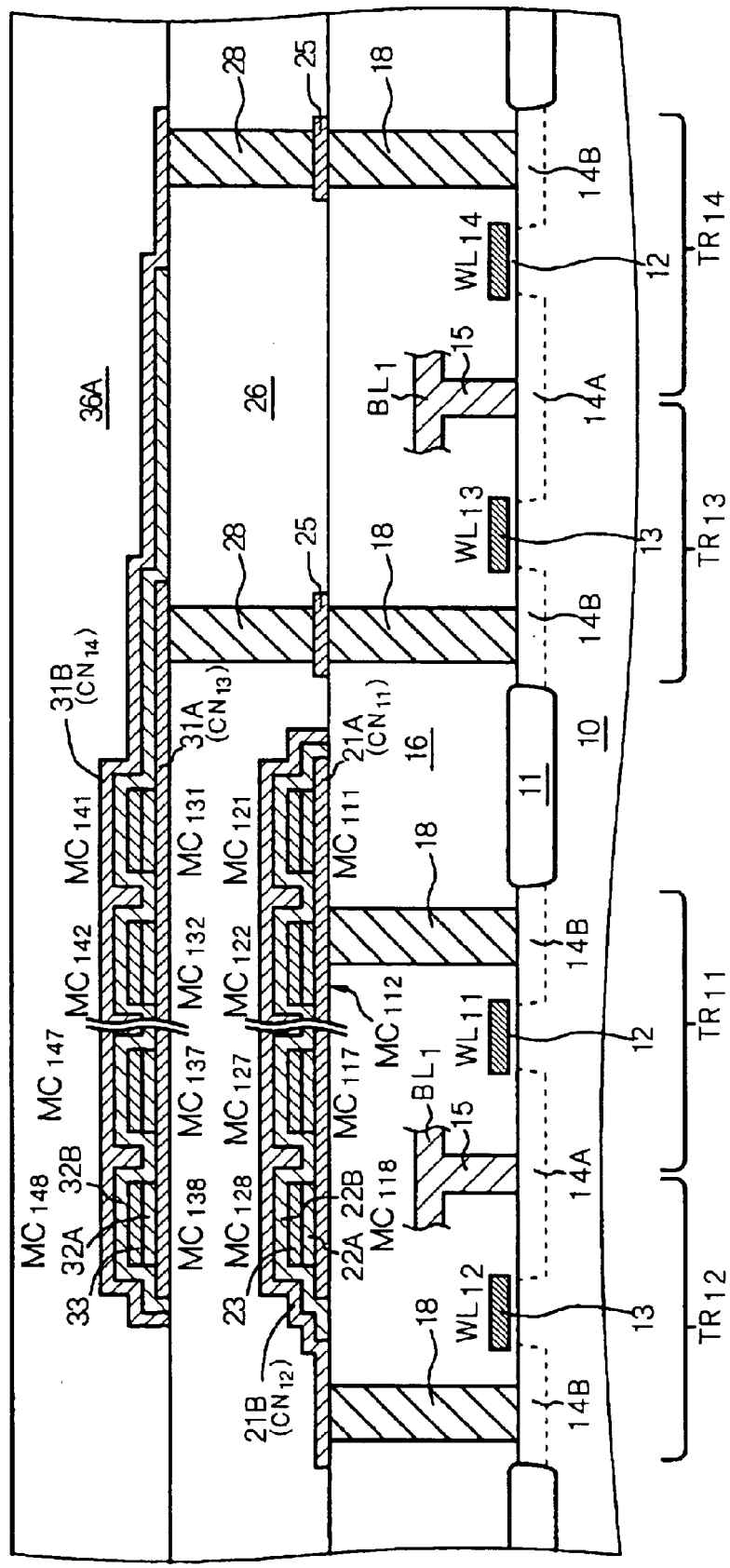
FIG. 51 is a schematic partial cross-sectional view of a variant of the ferroelectric-type nonvolatile semiconductor memory explained in Example 6 or 7.
Figure 52:
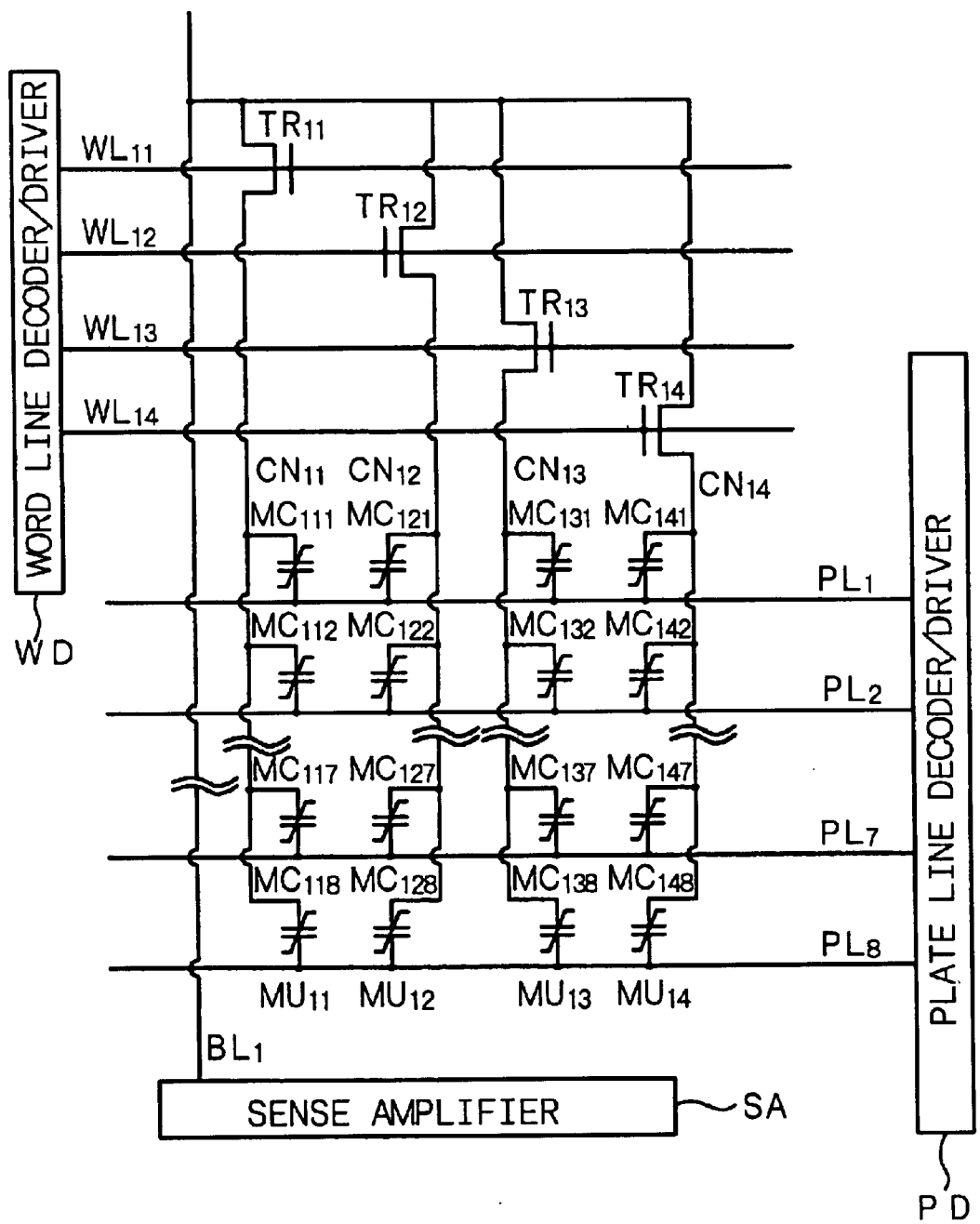
FIG. 52 is a circuit diagram of the ferroelectric-type nonvolatile semiconductor memory shown in FIG. 51.

The nonvolatile memory explained in Example 6 or 7 can be modified to have a structure as shown in FIG. 51. FIG. 52 shows a circuit diagram thereof. In FIGS. 51 and 52, showing of a transistor for switching or a high-resistance element is omitted.

The above nonvolatile memory comprises a bit line $BL_1$ connected to a sense amplifier SA, transistors for selection $TR_{11}$, $TR_{12}$, $TR_{13}$ and $TR_{14}$ that are N in number (N≧22, and N=4 in this embodiment) and is formed of a MOS type FET each, memory units $MU_{11}$, $MU_{12}$, $MU_{13}$ and $MU_{14}$ that are N in number, and plate lines. The memory unit $MU_{11}$ of a first layer is composed of memory cells $MC_{11m}$ (m=1, 2 . . . , 8) that are M in number (M≧2, and M=8 in this embodiment). The memory unit $MU_{12}$ of a second layer is also composed of memory cells $MC_{12m}$ (m=1, 2 . . . , 8) that are M in number (M=8). The memory unit $MU_{13}$ of a third layer is also composed of memory cells $MC_{13m}$ (m=1, 2 . . . . 8) that are M in number (M=8), and the memory unit $MU_{14}$ of a fourth layer is also composed of memory cells $MC_{14m}$ (m=1, 2 . . . , 8) that are M in number (M=8). The number of plate lines is M (M=8 in this embodiment), and shown by $PL_m$ (m=1, 2 . . . , 8). A word line $WL_{1n}$ connected to a gate electrode of a transistor for selection $TR_{1n}$ is connected to a word line decoder/driver WD. Each plate line $PL_m$ is connected to a plate line decoder/driver PD.

Further, each memory cell $MC_{11m}$ constituting the memory unit $MU_{11}$ of the first layer comprises a first electrode 21A, a ferroelectric layer 22A and a second electrode 23, each memory cell $MC_{12m}$ constituting the memory unit $MU_{12}$ of the second layer comprises a first electrode 21B, a ferroelectric layer 22B and a second electrode 23, each memory cell $MC_{13m}$ constituting the memory unit $MU_{13}$ of the third layer comprises a first electrode 31A, a ferroelectric layer 32A and a second electrode 33, and each memory cell $MC_{14m}$ constituting the memory unit $MU_{14}$ of the fourth layer comprises a first electrode 31B, a ferroelectric layer 32B and a second electrode 33. In each of the memory units $MU_{11}$, $MU_{12}$, $MU_{13}$ and $MU_{14}$, the first electrodes 21A, 21B, 31A or 31B of the memory cells are in common. The common first electrodes 21A, 21B, 31A and 31B will be referred to as common nodes $CN_{11}$, $CN_{12}$, $CN_{13}$ and $CN_{14}$ for convenience.

The common first electrode 21A (first common node $CN_{11}$) in the memory unit $MU_{11}$ of the first layer is connected to the bit line $BL_1$ through the fist-place transistor for selection $TR_{11}$. The common first electrode 21B (second common node $CN_{12}$) in the memory unit $MU_{12}$ of the second layer is connected to the bit line $BL_1$ through the second-place transistor for selection $TR_{12}$. The common first electrode 31A (third common node $CN_{13}$) in the memory unit $MU_{13}$ of the third layer is connected to the bit line $BL_1$ through the third-place transistor for selection $TR_{13}$. The common first electrode 31B (fourth common node $CN_{14}$) in the memory unit $MU_{14}$ of the fourth layer is connected to the bit line $BL_1$ through the fourth-place transistor for selection $TR_{14}$.

The memory cell $MC_{11m}$ constituting the memory unit $MU_{11}$ of the first layer and the memory cells $MC_{12m}$ constituting the memory unit $MU_{12}$ of the second layer share the second electrode 23, and the shared m-th-place second electrode 23 is connected to the plate line $PL_m$. Further, the memory cell $MC_{13m}$ constituting the memory unit $MU_{13}$ of the third layer and the memory cells $MC_{14m}$ constituting the memory unit $MU_{14}$ of the fourth layer share the second electrode 33, and the shared m-th-place second electrode 33 is connected to the plate line $PL_m$. Specifically, the plate line $PL_m$ is constituted of an extending portion of the shared m-th-place second electrode 23, and the plate line $PL_m$ is constituted of an extending portion of the shared m-th-place second electrode 33, and the plate lines $PL_m$ are connected to each other in a region that is not shown.

In the above nonvolatile memory, the memory units $MU_{11}$ and $MU_{12}$, and the memory units $MU_{13}$ and $MU_{14}$, are stacked through an insulating layer (insulating interlayer 26). The memory unit $MU_{14}$ is covered with an insulation layer 36A. Further, the memory unit $MU_{11}$ is formed over a semiconductor substrate 10 through an insulating layer 16. A device-isolation region 11 is formed in the semiconductor substrate 10. Each of the transistors for selection $TR_{11}$, $TR_{12}$, $TR_{13}$ and $TR_{14}$ comprises a gate insulating film 12, a gate electrode 13 and source/drain regions 14A and 14B. One source/drain region 14A of each of the first-place transistor for selection $TR_{11}$, second-place transistor for selection $TR_{12}$, third-place transistor for selection $TR_{13}$ and fourth-place transistor for selection $TR_{14}$ is connected to the bit line $BL_1$ through a contact hole 15. The other source/drain region 14B of the first-place transistor for selection $TR_{11}$ is connected to the first common node $CN_{11}$ through a contact hole 18 formed in an opening portion formed through the insulating layer 16. Further, the other source/drain region 14B of the second-place transistor for selection $TR_{12}$ is connected to the second common node $CN_{12}$ through a contact hole 18. The other source/drain region 14B of the third-place transistor for selection $TR_{13}$ is connected to the third common node $CN_{13}$ through a contact hole 18, a pad portion 25 and a contact hole 28 formed in an opening portion formed through the insulating interlayer 26. Further, the other source/drain region 14B of the fourth-place transistor for selection $TR_{14}$ is connected to the fourth common node $CN_{14}$ through a contact hole 18, a pad portion 25 and a contact hole 28.

Further, the other source/drain region 14B of the first-place transistor for selection $TR_{11}$ is also common to one source/drain region of a transistor for switching (not shown), the other source/drain region 14B of the second-place transistor for selection $TR_{12}$ is also common to one source/drain region of another transistor for switching (not shown), the other source/drain region 14B of the third-place transistor for selection $TR_{13}$ is also common to one source/drain region of a still another transistor for switching (not shown), and the other source/drain region 14B of the fourth-place transistor for selection $TR_{11}$ is also common to one source/drain region of yet another transistor for switching (not shown). Alternatively, the other source/drain region 14B of the first-place transistor for selection $TR_{11}$ is connected to one end of a high-resistance element (not shown), the other source/drain region 14B of the second-place transistor for selection $TR_{12}$ is connected to one end of another high-resistance element (not shown), the other source/drain region 14B of the third-place transistor for selection $TR_{13}$ is connected to one end of still another high-resistance element (not shown), and the other source/drain region 14B of the fourth-place transistor for selection $TR_{14}$ is connected to one end of yet another high-resistance element (not shown). The structure of the above-explained nonvolatile memory can be applied to those nonvolatile memories explained in the other Examples.

Figure 53:
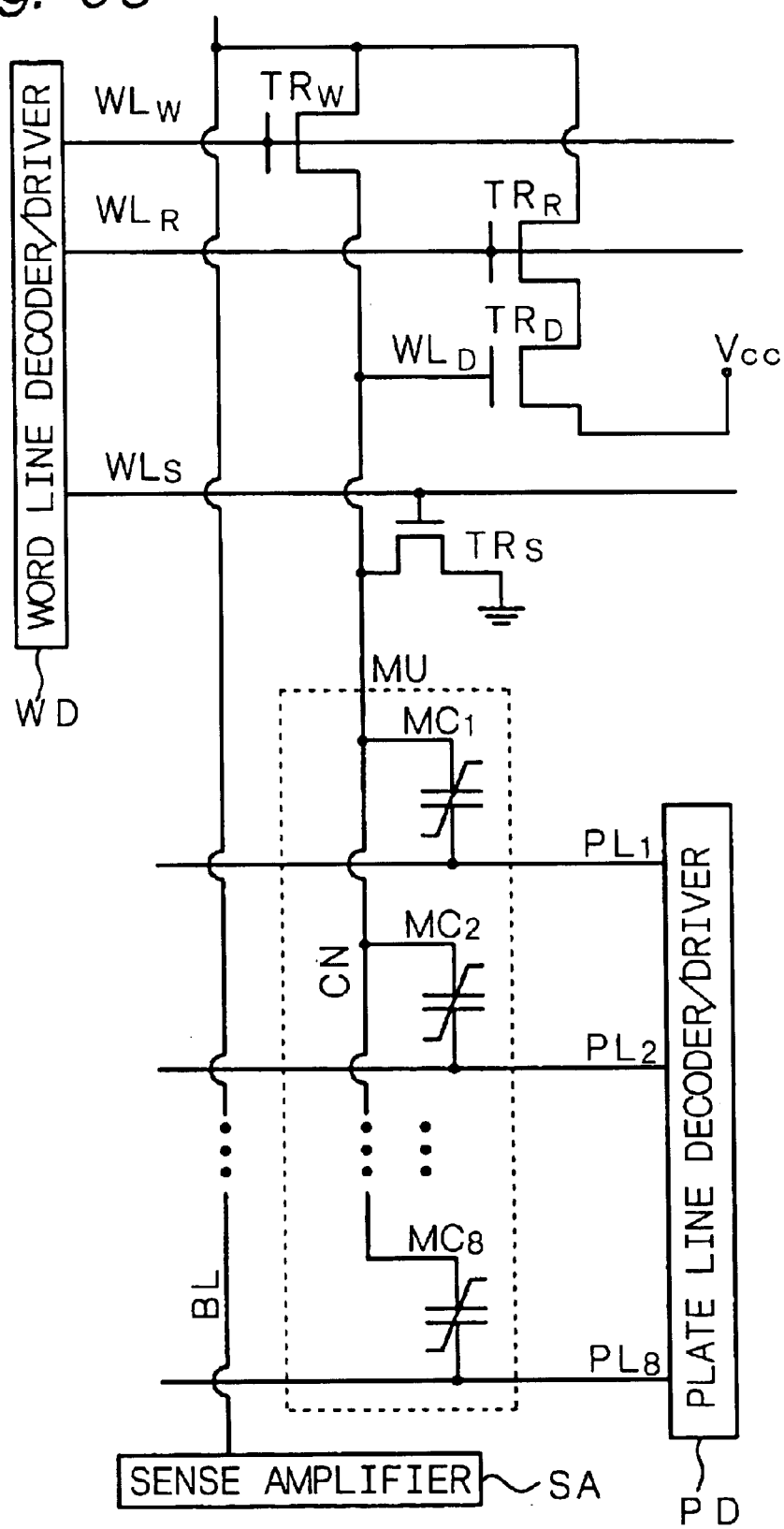
FIG. 53 is a circuit diagram of a gain-cell type ferroelectric-type nonvolatile semiconductor memory.
Figure 54:
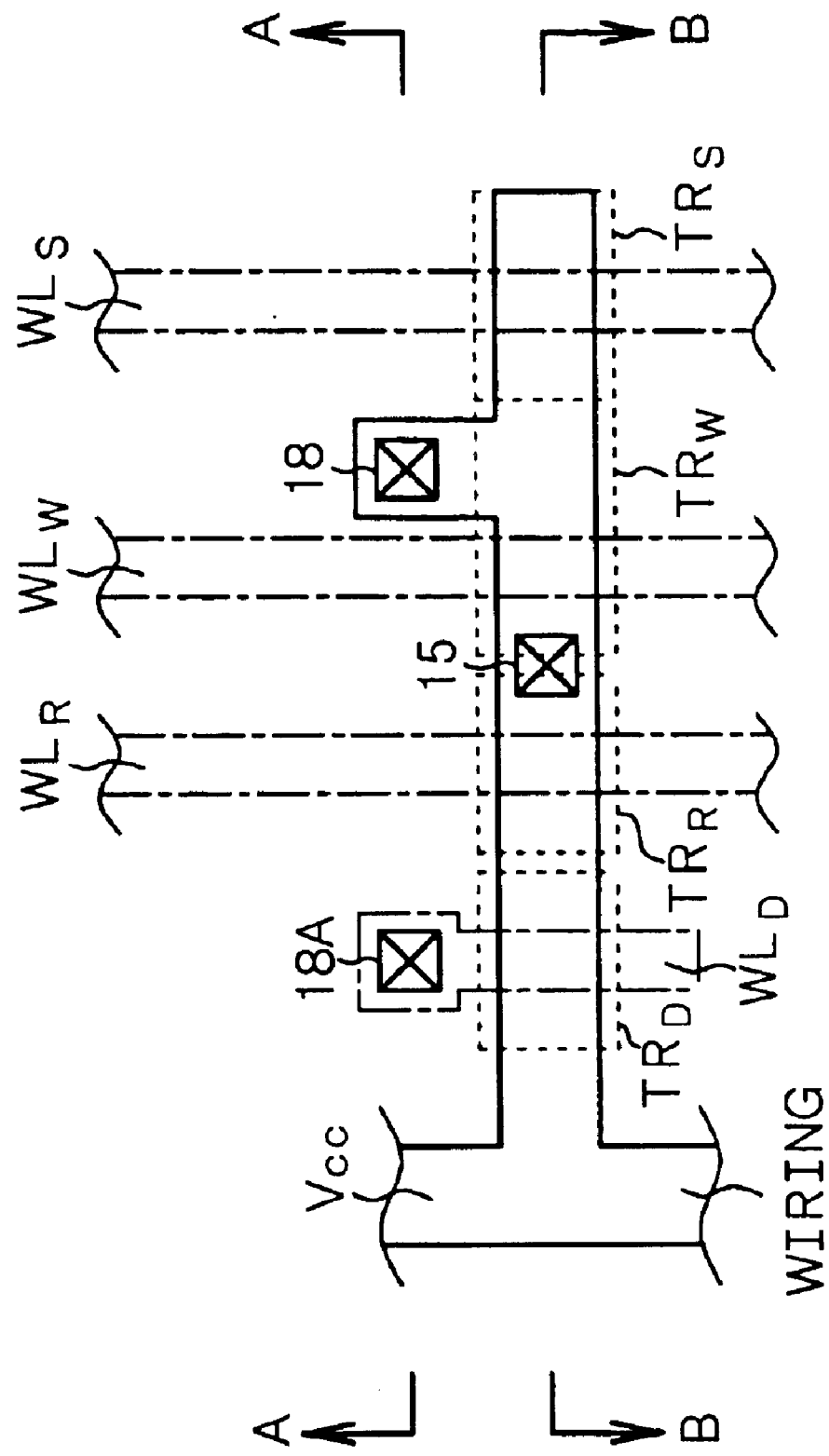
FIG. 54 is a layout of the ferroelectric-type nonvolatile semiconductor memory shown in FIG. 53.
Figure 55:
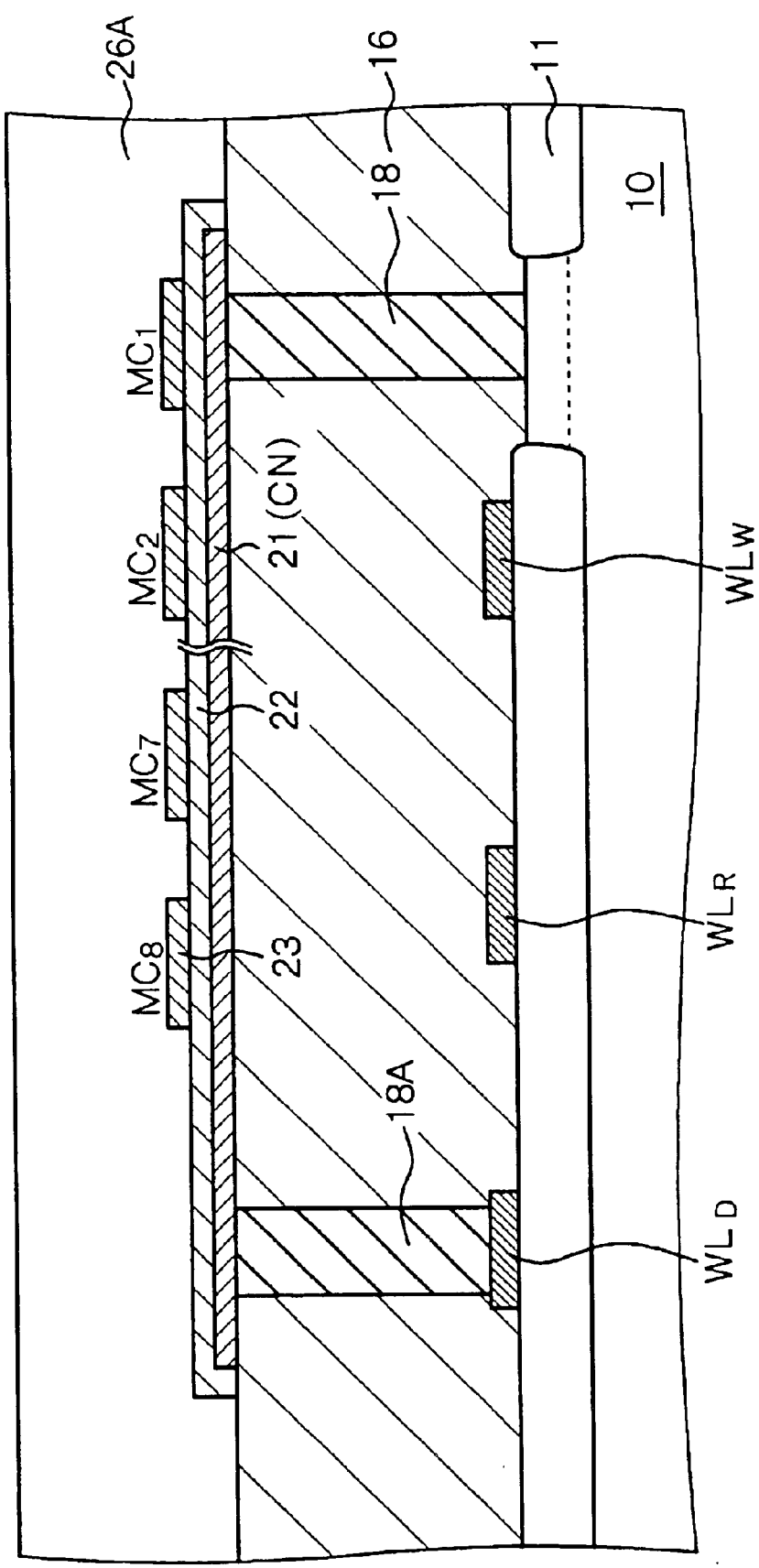
FIG. 55 is a schematic partial cross-sectional view of the ferroelectric-type nonvolatile semiconductor memory shown in FIG. 53.
Figure 56:
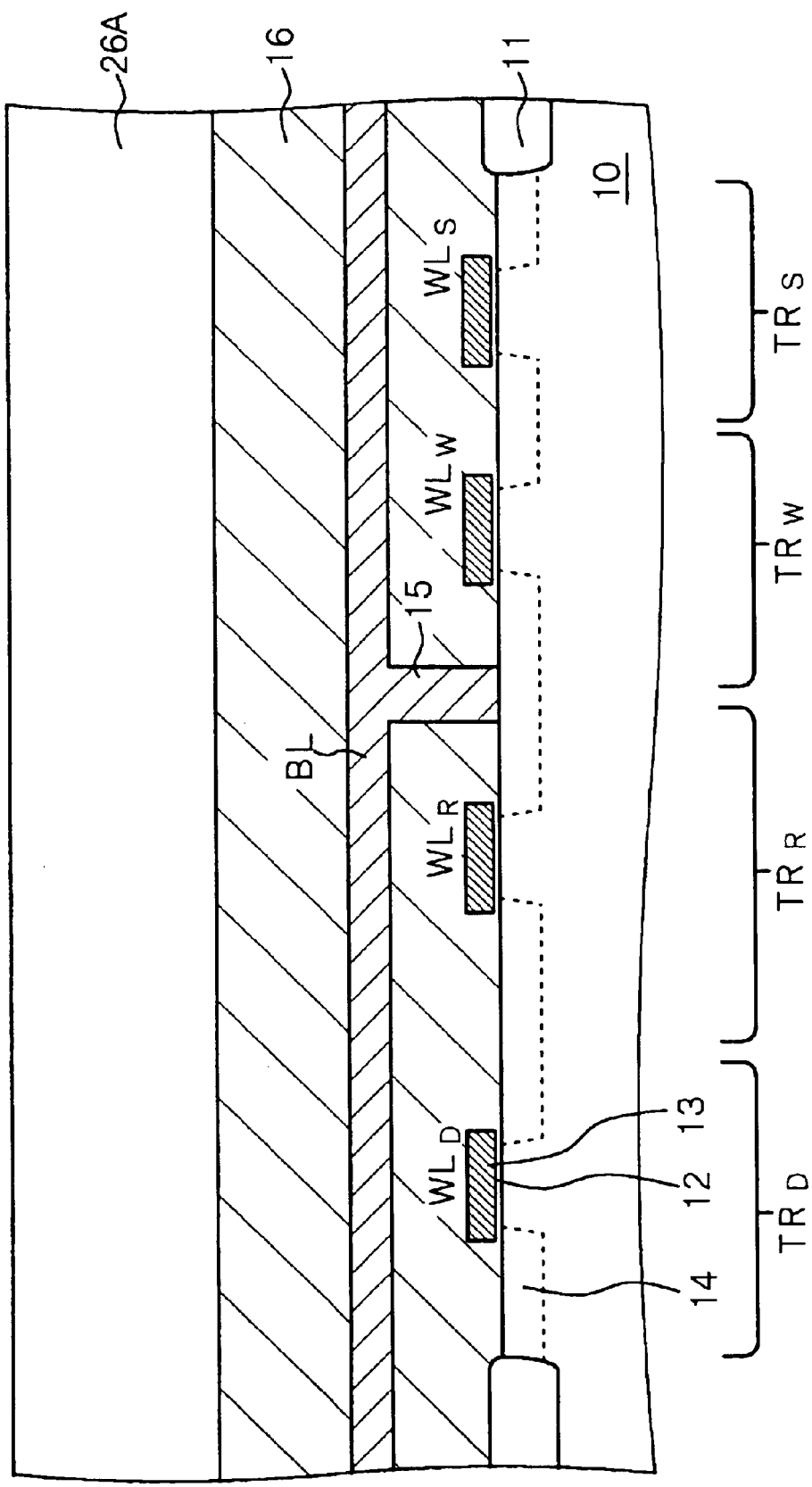
FIG. 56 is a schematic partial cross-sectional view of the ferroelectric-type nonvolatile semiconductor memory shown in FIG. 53, viewed through a cross section different from the cross section shown in FIG. 55.

The nonvolatile memory of the present invention can be a gain-cell type nonvolatile memory. FIG. 53 shows a circuit diagram of one example of such a nonvolatile memory, FIG. 54 shows a schematic layout of various transistors constituting the nonvolatile memory, and FIGS. 55 and 56 shows schematic partial cross-sectional views of the nonvolatile memory. In FIG. 54, various transistor regions are surrounded by dotted lines, active regions and a wiring are indicated by solid lines, and gate electrodes or word lines are indicated by chain lines. The schematic partial cross-sectional view of the nonvolatile memory shown in FIG. 55 is taken along line A—A in FIG. 54, and the schematic partial cross-sectional view of the nonvolatile memory shown in FIG. 56 is taken along line B—B in FIG. 54.

Application of a gain-cell type to the nonvolatile memory of Example 1 will be explained below. The nonvolatile memory comprises, for example, a bit line BL, a transistor for writing-in $TR_W$ (corresponding to a transistor for selection of nonvolatile memory of each Example), a memory unit MU composed of memory cells $MC_M$ that are M in number (M≧2, and for example, M=8) and plate lines $PL_M$ that are M in number. Each memory cell $MC_m$ comprises a first electrode 21, a ferroelectric layer 22 and a second electrode 23. The first electrodes 21 of the memory cells $MC_M$ constituting the memory unit MU are in common in the memory unit MU, the common first electrode (common node CN) is connected to the bit line BL through the transistor for writing-in $TR_W$, and the second electrode 23 constituting each memory cell $MC_m$ is connected to the plate line $PL_m$. The memory cells $MC_M$ are covered with an insulation layer 26A. The number (M) of the memory cells constituting the memory unit of the nonvolatile memory is not limited to 8, and generally, it may be any number so long as it satisfies M≧2. The number (M) is preferably an exponent number of 2 (M=2, 4, 8, 16 . . . ).

Further, the nonvolatile memory has a signal detective circuit for detecting a change in the potential of the common first electrode and transmitting a detection result to the bit line as a current or a voltage. In other words, the nonvolatile memory has a transistor for detection $TR_D$ and a transistor for read-out $TR_R$. The signal detective circuit comprises the transistor for detection $TR_D$ and the transistor for read-out $TR_R$. One end of the transistor for detection $TR_D$ is connected to a wiring having a predetermined potential $V_{cc}$ (power source line formed of an impurity layer), and the other end is connected to the bit line BL through the transistor for read-out $TR_R$. When data stored in each memory cell $MC_m$ is read out, the transistor for read-out $TR_R$ is brought into a conducted state, and the operation of the transistor for detection $TR_D$ is controlled by a potential that occurs in the common first electrode (common node CN) on the basis of data stored in each memory cell $MC_m$. The transistor for switching $TR_S$ is connected to the common node CN. When the nonvolatile memory is operated, the transistor for switching $TR_S$ is brought into an OFF-state. When the nonvolatile memory is in a non-operation (standby) state, the transistor for switching $TR_S$ is brought into an ON-state.

Specifically, the various transistors are formed of MOS type FETs, one source/drain region of the transistor for writing-in (transistor for selection) $TR_W$ is connected to the bit line BL through a contact hole 15 formed through an insulating layer 16. The other source/drain region thereof is connected to the common first electrode (common node CN) through a contact hole 18 formed in an opening portion formed through the insulating layer 16, and is also common to one source/drain region of the transistor for switching $TR_S$. The other source/drain region of the transistor for switching $TR_S$ is connected to a grounding line (not shown). Further, one source/drain region of the transistor for detection $TR_D$ is connected to a wiring having a predetermined potential $V_{cc}$, and the other source/drain region thereof is connected to one source/drain region of the transistor for read-out $TR_R$. More specifically, the other source/drain region of the transistor for detection $TR_D$ and one source/ drain region of the transistor for read-out $TR_R$ occupy one source/drain region. Further, the other source/drain region of the transistor for read-out $TR_R$ is connected to the bit line BL through a contact hole 15. Further, the common first electrode (common node CN or the other source/drain region of the transistor for writing-in $TR_W$) is connected to a gate electrode of the transistor for detection $TR_D$ through a contact hole 18A formed in an opening portion and a word line $WL_D$. Further, a word line $WL_W$ connected to a gate electrode of the transistor for writing-in $TR_W$, a word line $WL_R$ connected to a gate electrode of the transistor for read-out $TR_R$, and a word line $WL_S$ connected to a gate electrode of the transistor for switching $TR_S$ are connected to a word line decoder/driver WD. Each plate line $PL_m$ is connected to a plate line decoder/driver PD. Further, the bit line BL is connected to a sense amplifier SA.

When data is read out, for example, from a memory cell $MC_1$ of the above nonvolatile memory, the transistor for switching $TR_S$ is brought into an OFF-state, and $V_{cc}$ is applied to the selected plate line $PL_1$. If data "1" is stored in the above selected memory cell $MC_1$, polarization inversion takes place in the ferroelectric layer, an accumulated charge increases in amount, and the potential of the common node CN increases. If data "0" is stored in the selected memory cell $MC_1$, no polarization inversion takes place in the ferroelectric layer, and the potential of the common node CN hardly increases. That is, the common node CN is coupled with a plurality of non-selected plate lines $PL_j$ through the ferroelectric layers of non-selected memory cells, so that the potential of the common node CN is maintained at a level relatively close to 0 volt. In this manner, a change is caused in the common node CN depending upon data stored in the selected memory cell $MC_1$. Therefore, an electric field sufficient for polarization inversion can be applied to the ferroelectric layer of the selected memory cell. And, the bit line BL is brought to a floating state, and the transistor for read-out $TR_R$ is brought to an ON-state.

Further, the operation of the transistor for detection $TR_D$ is controlled by the potential that occurs in the common first electrode (common node CN) on the basis of data stored in the selected memory cell $MC_1$. Specifically, when a high potential occurs in the common first electrode (common node CN) on the basis of data stored in the selected memory cell $MC_1$, the transistor for detection $TR_D$ comes to a continuity state. Since one source/drain region of the transistor for detection $TR_D$ is connected to the wiring having a predetermined potential $V_{cc}$, a current flows from the wiring to the bit line BL through the transistor for detection $TR_D$ and the transistor for read-out $TR_R$, and the potential of the bit line BL increases. That is, a change in the potential of the common first electrode (common node CN) is detected with the signal detective circuit, and the detection result is transmitted to the bit line BL as a voltage (potential). In this case, the potential of the bit line BL is approximately $(V_g - V_{th})$ in which $V_{th}$ is a threshold value of the transistor for detection $TR_D$ and $V_g$ is a potential of the gate electrode of the transistor for detection $TR_D$ (i.e., potential of the common node CN). When the transistor for detection $TR_D$ is a depression type NMOSFET, the threshold value $V_{th}$ has a negative value. In this manner, a stable sense signal amount can be secured regardless of the size of the load on the bit line BL. Further, the transistor for detection $TR_D$ can be constituted of PMOSFET.

Figure 57:
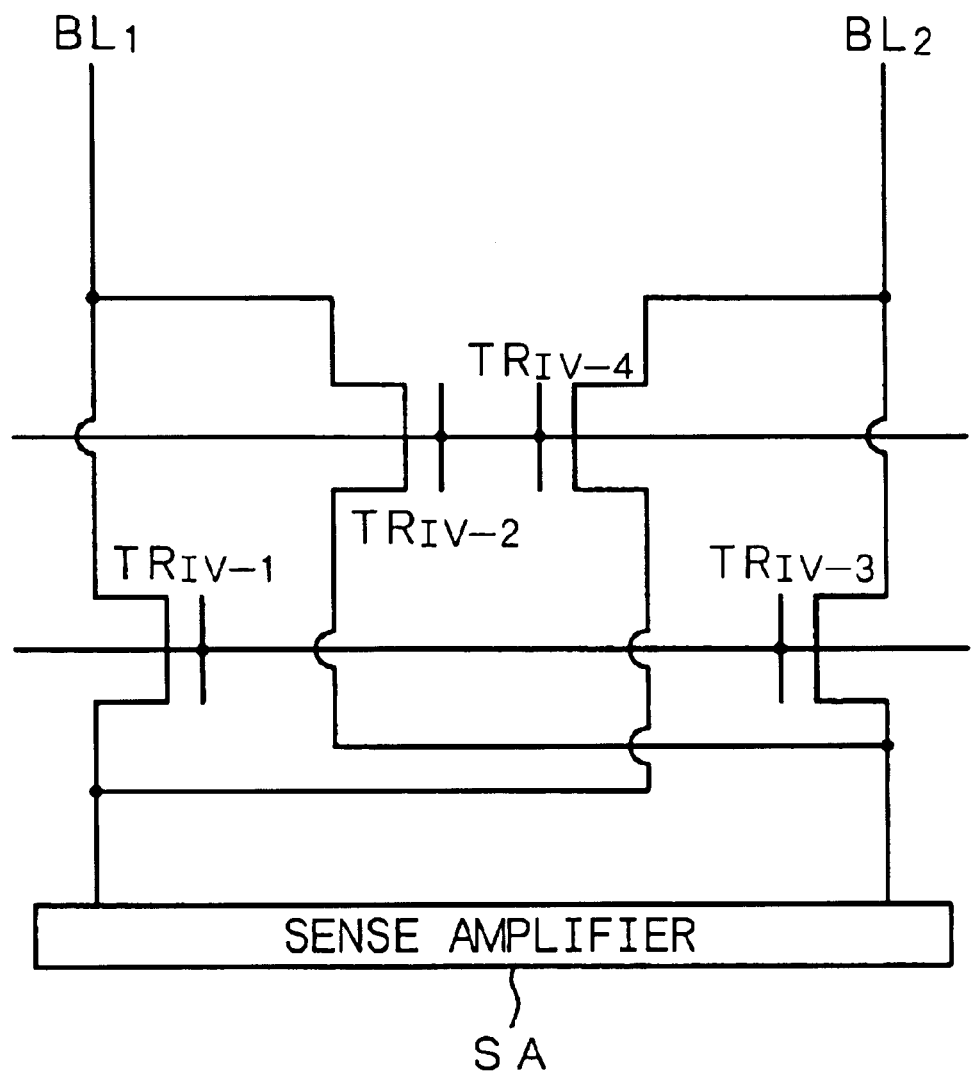
FIG. 57 is a circuit diagram of a kind of a switching circuit arranged between bit lines when the predetermined potential of a wiring to which one end of a transistor for detection is connected is 0 volt.

The predetermined potential of the wiring to which one end of the transistor for detection is connected is not limited to $V_{cc}$, and the wiring may be grounded. That is, the predetermined potential of the wiring to which one end of the transistor for detection is connected may be 0 volt. In this case, if a potential ($V_{cc}$) appears on the bit line when data stored in the selected memory cell is read out, it is required to adjust the potential of the bit line to 0 volt when data is re-written, and if 0 volt appears on the bit line when data stored in the selected memory cell is read out, it is required to adjust the potential of the bit line to $V_{cc}$ when data is re-written. For this purpose, there can be employed a constitution in which a kind of switching circuit (inversion circuit) composed of transistors $TR_{IV-1}$, $TR_{IV-2}$, $TR_{IV-3}$ and $TR_{IV-4}$ shown in FIG. 57 is provided between the bit lines, the transistors $TR_{IV-2}$ and $TR_{IV-4}$ are brought to an ON-state when data is read out, and the transistors $TR_{IV-1}$ and $TR_{IV-3}$ are brought to an ON-state when data is re-written.

Figure 58:
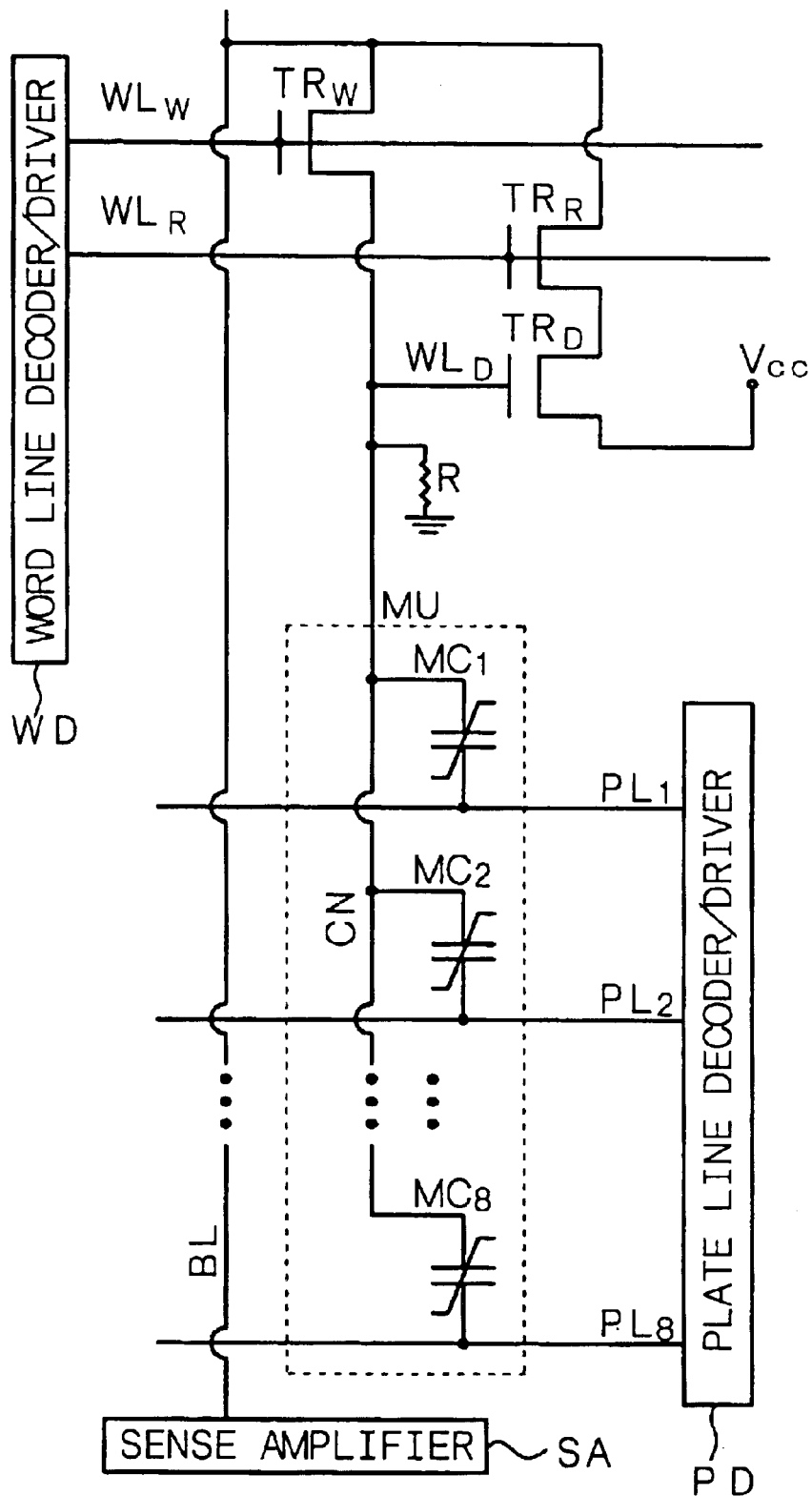
FIG. 58 is a circuit diagram of a variant of the gain-cell type ferroelectric-type nonvolatile semiconductor memory.

While the above-explained embodiment uses the transistor $TR_S$, a high-resistance element R whose circuit diagram is as shown in FIG. 58 may be provided instead. Further, the structure of the above-explained gain-cell type nonvolatile memory can be applied to the nonvolatile memory in any other Example.

Figure 59:
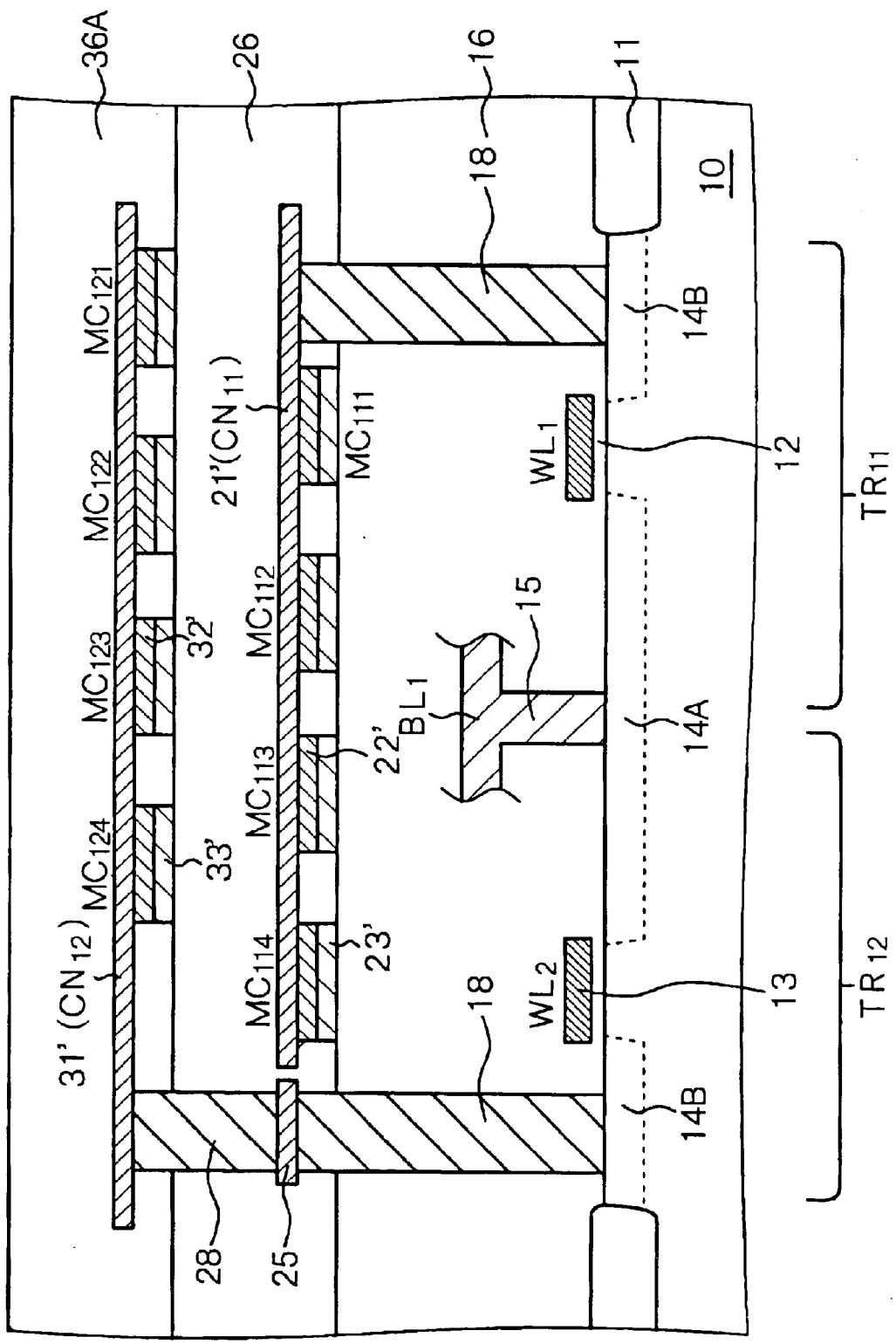
FIG. 59 is a schematic partial cross-sectional view of a variant of the ferroelectric-type nonvolatile semiconductor memory of Example 4.
Figure 60:
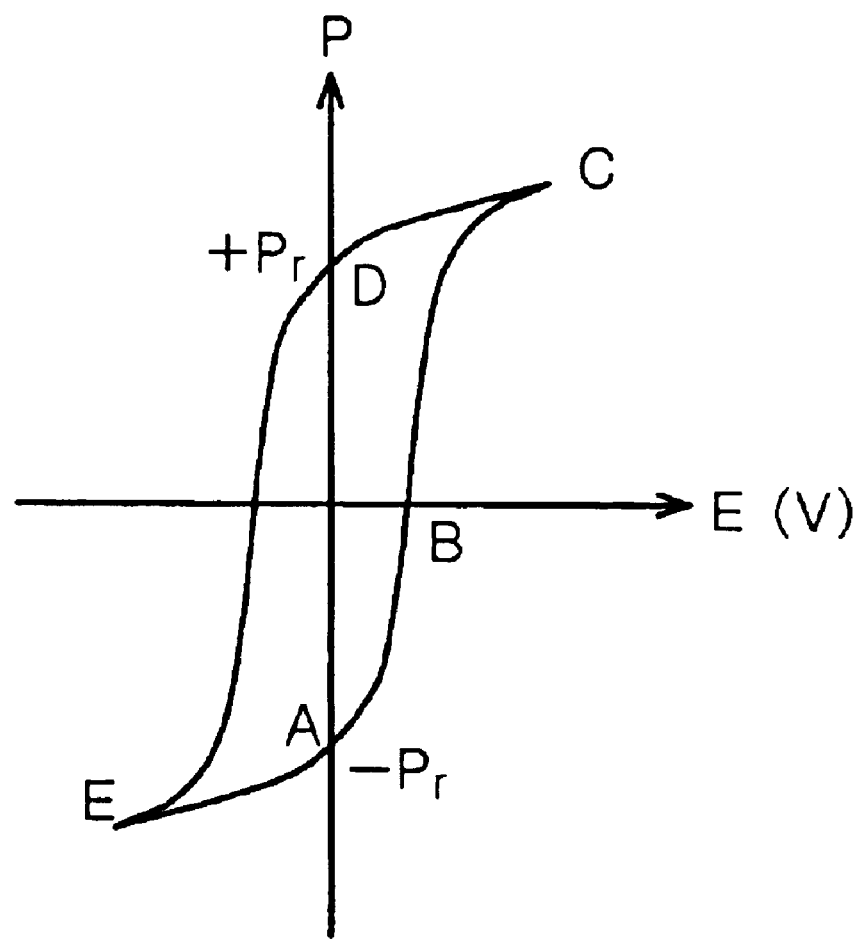
FIG. 60 is a P-E(V) hysteresis loop diagram of a ferroelectric material.
Figure 61:
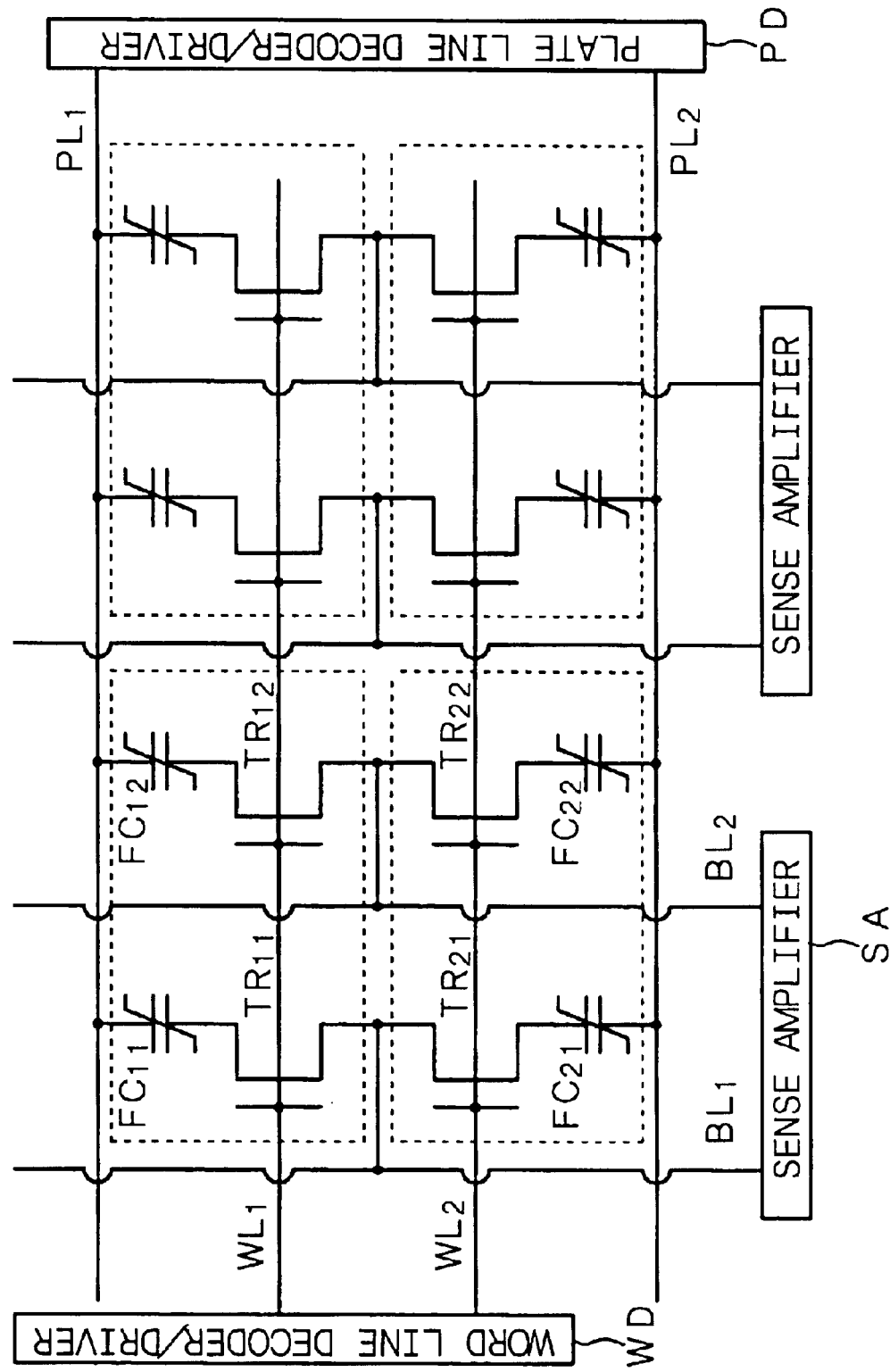
FIG. 61 is a circuit diagram of a ferroelectric-type nonvolatile semiconductor memory shown in U.S. Pat. No. 4,873,664.
Figure 62:
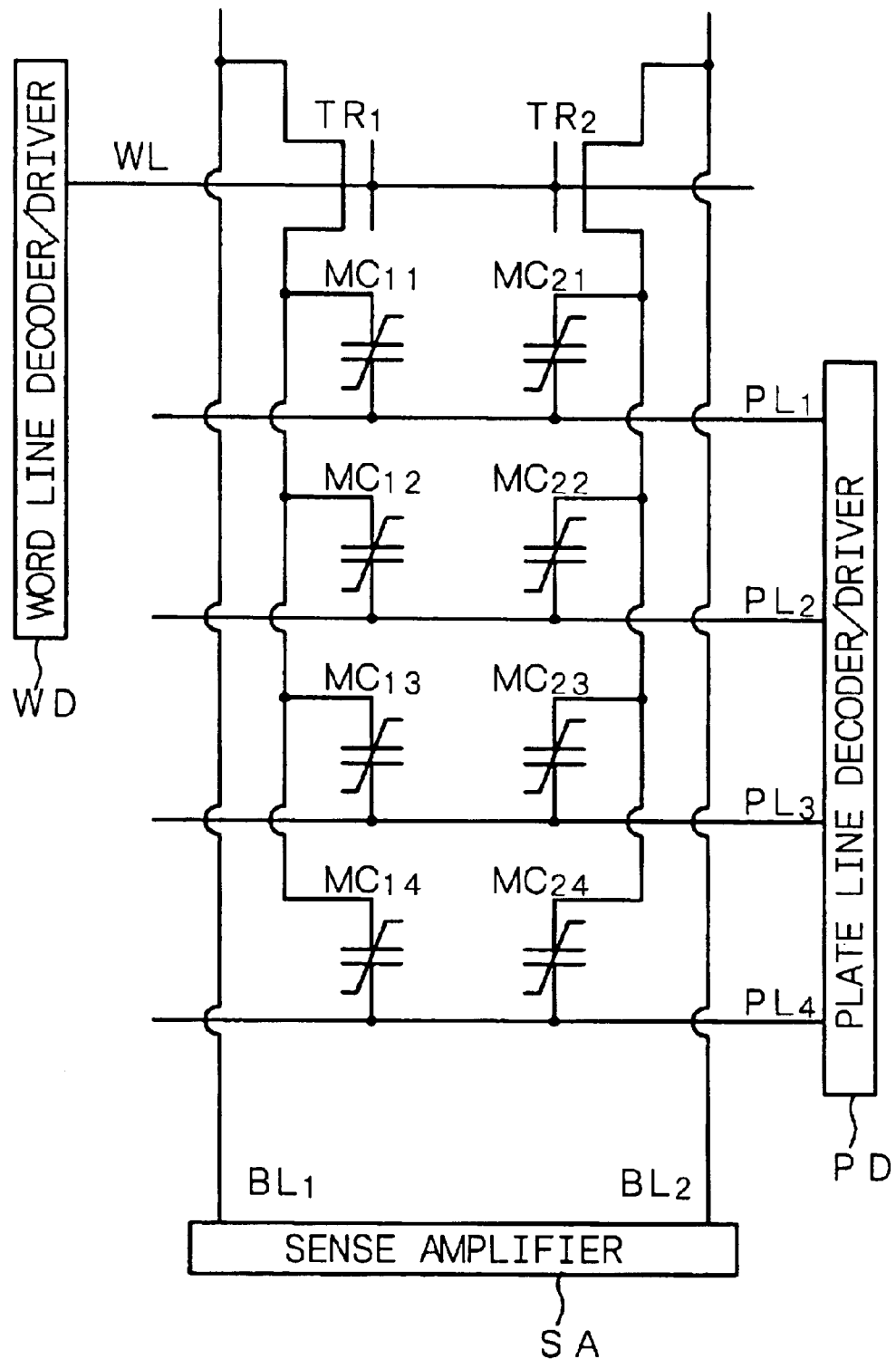
FIG. 62 is a circuit diagram of a ferroelectric-type nonvolatile semiconductor memory shown in JP-A-121032/1997.

Further, as a variant of the nonvolatile memory of Example 6 or 7, for example, there may be employed a constitution in which first electrodes 21' and 31' may be upper electrodes, and second electrodes 23' and 33' may be lower electrodes as shown in FIG. 59. This structure can be also applied to the nonvolatile memory in any other Example. In FIG. 59, showing of the transistor for switching or the high-resistance element is omitted.

The ferroelectric-type nonvolatile semiconductor memory of the present invention has a circuit for short-circuiting the plate lines and the common first electrode or a circuit for grounding the common first electrode, so that the common first electrode is free from coming into a floating state when the ferroelectric-type nonvolatile semiconductor memory is in a non-operation (standby) state. As a result, a change in the potential of the common first electrode can be suppressed. Even if the polarization attenuation phenomenon called "relaxation" takes place in the ferroelectric layer, therefore, the destruction of data stored in the memory cell can be reliably prevented. Even if the transistor for switching or the high-resistance element is provided, there is caused almost no overhead with regard to an area. Further, the transistor for switching can be formed simultaneously with the formation of the transistor for selection and the like, so that there is no additional process in the process for the production of the ferroelectric-type nonvolatile semiconductor memory. Even for the formation of the high-resistance element, there is only a slight increase in the process for the production of the ferroelectric-type nonvolatile semiconductor memory.

What is claimed is:

1. A ferroelectric-type nonvolatile semiconductor memory comprising;

(A) a bit line, (B) a transistor for selection, (C) a memory unit composed of memory cells that are M in number (M≧2), and (D) plate lines that are M in number, wherein each memory cell comprises a first electrode, a ferroelectric layer and a second electrode, in the memory unit, the first electrodes of the memory cells are in common, and said common first electrode is connected to the bit line through the transistor for selection, in the memory unit, the second electrode of the m-th-place (m=1, 2 . . . , M) memory cell is connected to the m-th-place plate line, and said ferroelectric-type nonvolatile semiconductor memory further comprises a circuit, connected at one end to the common first electrode, for grounding the common first electrode or for short-circuiting the plate lines that are M in number and the common first electrode.

2. The ferroelectric-type nonvolatile semiconductor memory according to claim 1, wherein said circuit is comprised of a transistor for switching.

3. The ferroelectric-type nonvolatile semiconductor memory according to claim 1, wherein said circuit is comprised of a high-resistance element.

4. The ferroelectric-type nonvolatile semiconductor memory according to claim 3, wherein said high-resistance element has a resistance value of $1 \times 10^6 \Omega$ to $1 \times 10^{12} \Omega$.

5. A ferroelectric-type nonvolatile semiconductor memory comprising;
(A) a bit line,
(B) a transistor for selection,
(C) memory units that are N in number ($N \geq 2$), each memory unit being composed of memory cells that are M in number ($M \geq 2$), and
(D) plate lines that are M×N in number,
wherein the memory units that are N in number are stacked one over another with an insulating layer therebetween,
each memory cell comprises a first electrode, a ferroelectric layer and a second electrode,
in each memory unit, the first electrodes of the memory cells are in common, and said common first electrode is connected to the transistor for selection through the bit line,
in the memory unit positioned as an n-th (n=1, 2 ..., N) layer, the second electrode of the m-th-place (m=1, 2 ..., M) memory cell is connected to the [(n−1)M+m]-th-place plate line, and
said ferroelectric-type nonvolatile semiconductor memory further comprises a circuit, connected at one end to the common first electrode, for grounding the common first electrode or for short-circuiting the plate lines that are M×N in number and the common first electrode.

6. The ferroelectric-type nonvolatile semiconductor memory according to claim 5, wherein said circuit is comprised of a transistor for switching.

7. The ferroelectric-type nonvolatile semiconductor memory according to claim 5, wherein said circuit is comprised of a high-resistance element.

8. The ferroelectric-type nonvolatile semiconductor memory according to claim 7, wherein said high-resistance element has a resistance value of $1 \times 10^6 \Omega$ to $1 \times 10^{12} \Omega$.

9. A ferroelectric-type nonvolatile semiconductor memory comprising;
(A) a bit line,
(B) transistors for selection that are N in number ($N \geq 2$),
(C) memory units that are N in number, each memory unit being composed of memory cells that are M in number ($M \geq 2$), and
(D) plate lines that are M in number,
wherein each memory cell comprises a first electrode, a ferroelectric layer and a second electrode,
in each memory unit, the first electrodes of the memory cells are in common,
in the n-th-place (n=1, 2 ..., N) memory unit, said common first electrode is connected to the bit line through the n-th-place transistor for selection,
in the n-th-place memory unit, the second electrode of the m-th-place (m=1, 2 ..., M) memory cell is connected to the m-th-place plate line common to the memory units, and
said ferroelectric-type nonvolatile semiconductor memory further comprises a circuit, connected at one end to the common first electrode, for grounding the common first electrode or for short-circuiting the plate lines that are M in number and the common first electrode.

10. The ferroelectric-type nonvolatile semiconductor memory according to claim 9, wherein said circuit is comprised of a transistor for switching.

11. The ferroelectric-type nonvolatile semiconductor memory according to claim 9, wherein said circuit is comprised of a high-resistance element.

12. The ferroelectric-type nonvolatile semiconductor memory according to claim 11, in which said high-resistance element has a resistance value of $1 \times 10^6 \Omega$ to $1 \times 10^{12} \Omega$.

13. A ferroelectric-type nonvolatile semiconductor memory comprising;
(A) bit lines that are N in number ($N \geq 2$),
(B) transistors for selection that are N in number,
(C) memory units that are N in number, each memory unit being composed of memory cells that are M in number ($M \geq 2$), and
(D) plate lines that are M in number,
wherein each memory cell comprises a first electrode, a ferroelectric layer and a second electrode,
in each memory unit, the first electrodes of the memory cells are in common,
said common first electrode in the n-th-place (n=1, 2 ..., N) memory unit is connected to the n-th-place bit line through the n-th-place transistor for selection,
in the n-th-place memory unit, the second electrode of the m-th-place (m=1, 2 ..., M) memory cell is connected to the m-th-place plate line common to the memory units, and
said ferroelectric-type nonvolatile semiconductor memory further comprises a circuit, connected at one end to the common first electrode, for grounding the common first electrode or for short-circuiting the plate lines that are M in number and the common first electrode.

14. The ferroelectric-type nonvolatile semiconductor memory according to claim 13, wherein said circuit is comprised of a transistor for switching.

15. The ferroelectric-type nonvolatile semiconductor memory according to claim 13, wherein said circuit is comprised of a high-resistance element.

16. The ferroelectric-type nonvolatile semiconductor memory according to claim 15, wherein said high-resistance element has a resistance value of $1 \times 10^6 \Omega$ to $1 \times 10^{12} \Omega$.

17. A ferroelectric-type nonvolatile semiconductor memory comprising;
(A) a bit line,
(B) a transistor for selection,
(C) a memory unit composed of memory cells that are M in number ($M \geq 2$), and
(D) plate lines that are M in number,
wherein each memory cell comprises a first electrode, a ferroelectric layer and a second electrode,
in the memory unit, the first electrodes of the memory cells are in common, and said common first electrode is connected to the bit line through the transistor for selection, in the memory unit, the second electrode of the m-th-place (m=1, 2 . . . , M) memory cell is connected to the m-th-place plate line, and said ferroelectric-type nonvolatile semiconductor memory further comprises a circuit for grounding the common first electrode, or for short-circuiting the plate lines that are M in number and the common first electrode, while the memory unit is in a state of non-selection.

18. The ferroelectric-type nonvolatile semiconductor memory according to claim 17, wherein said circuit is comprised of a transistor for switching.

19. The ferroelectric-type nonvolatile semiconductor memory according to claim 17, wherein said circuit is comprised of a high-resistance element.

20. The ferroelectric-type nonvolatile semiconductor memory according to claim 19, in which said high-resistance element has a resistance value of $1 \times 10^6 \Omega$ to $1 \times 10^{12} \Omega$.

21. A ferroelectric-type nonvolatile semiconductor memory comprising;

(A) a bit line, (B) a transistor for selection, (C) memory units that are N in number (N≧2), each memory unit being composed of memory cells that are M in number (M≧2), and (D) plate lines that are M×N in number, wherein the memory units that are N in number are stacked one over another with an insulating layer therebetween, each memory cell comprises a first electrode, a ferroelectric layer and a second electrode, in each memory unit, the first electrodes of the memory cells are in common, and said common first electrode is connected to the transistor for selection through the bit line, in the memory unit positioned as an n-th (n=1, 2 . . . , N) layer, the second electrode of the m-th-place (m=1, 2 . . . , M) memory cell is connected to the [(n−1)M+m]-th-place plate line, and said ferroelectric-type nonvolatile semiconductor memory further comprises a circuit for grounding the common first electrode, or for short-circuiting the plate lines that are M×N in number and the common first electrode, while the memory unit is in a state of non-selection.

22. The ferroelectric-type nonvolatile semiconductor memory according to claim 21, wherein said circuit is comprised of a transistor for switching.

23. The ferroelectric-type nonvolatile semiconductor memory according to claim 21, wherein said circuit is comprised of a high-resistance element.

24. The ferroelectric-type nonvolatile semiconductor memory according to claim 23, wherein said high-resistance element has a resistance value of $1 \times 10^6 \Omega$ to $1 \times 10^{12} \Omega$.

25. A ferroelectric-type nonvolatile semiconductor memory comprising;

(A) a bit line, (B) transistors for selection that are N in number (N≧2), (C) memory units that are N in number, each memory unit being composed of memory cells that are M in number (M≧2), and (D) plate lines that are M in number, wherein each memory cell comprises a first electrode, a ferroelectric layer and a second electrode, in each memory unit, the first electrodes of the memory cells are in common, in the n-th-place (n=1, 2 . . . , N) memory unit, said common first electrode is connected to the bit line through the n-th-place transistor for selection, in the n-th-place memory unit, the second electrode of the m-th-place (m=1, 2 . . . , M) memory cell is connected to the m-th-place plate line common to the memory units, and said ferroelectric-type nonvolatile semiconductor memory further comprises a circuit for grounding the common first electrode, or for short-circuiting the plate lines that are M in number and the common first electrode, while the memory unit is in a state of non-selection.

26. The ferroelectric-type nonvolatile semiconductor memory according to claim 25, wherein said circuit is comprised of a transistor for switching.

27. The ferroelectric-type nonvolatile semiconductor memory according to claim 25, wherein said circuit is comprised of a high-resistance element.

28. The ferroelectric-type nonvolatile semiconductor memory according to claim 27, wherein said high-resistance element has a resistance value of $1 \times 10^6 \Omega$ to $1 \times 10^{12} \Omega$.

29. A ferroelectric-type nonvolatile semiconductor memory comprising;

(A) bit lines that are N in number (N≧2), (B) transistors for selection that are N in number, (C) memory units that are N in number, each memory unit being composed of memory cells that are M in number (M≧2), and (D) plate lines that are M in number, wherein each memory cell comprises a first electrode, a ferroelectric layer and a second electrode, in each memory unit, the first electrodes of the memory cells are in common, said common first electrode in the n-th-place (n=1, 2 . . . , N) memory unit is connected to the n-th-place bit line through the n-th-place transistor for selection, in the n-th-place memory unit, the second electrode of the m-th-place (m=1, 2 . . . , M) memory cell is connected to the m-th-place plate line common to the memory units, and said ferroelectric-type nonvolatile semiconductor memory further comprises a circuit for grounding the common first electrode, or for short-circuiting the plate lines that are M in number and the common first electrode, while the memory unit is in a state of non-selection.

30. The ferroelectric-type nonvolatile semiconductor memory according to claim 29, wherein said circuit is comprised of a transistor for switching.

31. The ferroelectric-type nonvolatile semiconductor memory according to claim 29, wherein said circuit is comprised of a high-resistance element.

32. The ferroelectric-type nonvolatile semiconductor memory according to claim 31, wherein said high-resistance element has a resistance value of $1 \times 10^6 \Omega$ to $1 \times 10^{12} \Omega$.

* * * * *